US012490645B2

(12) United States Patent
Che et al.

(10) Patent No.: US 12,490,645 B2
(45) Date of Patent: Dec. 2, 2025

(54) TETRADENTATE LIGANDS, GOLD(III) COMPLEXES, PREPARATION METHOD AND USE THEREOF

(71) Applicant: Chi Ming Che, Hong Kong (CN)

(72) Inventors: Chi Ming Che, Hong Kong (CN); Wai Pong To, Hong Kong (CN); Dongling Zhou, Hong Kong (CN)

(73) Assignee: Chi Ming Che, Hong Kong (CN)

( * ) Notice: Subject to any disclaimer, the term of this patent is extended or adjusted under 35 U.S.C. 154(b) by 948 days.

(21) Appl. No.: 17/636,909

(22) PCT Filed: Aug. 24, 2020

(86) PCT No.: PCT/CN2020/110777
§ 371 (c)(1),
(2) Date: Feb. 21, 2022

(87) PCT Pub. No.: WO2021/036978
PCT Pub. Date: Mar. 4, 2021

(65) Prior Publication Data

US 2022/0393118 A1 Dec. 8, 2022

(30) Foreign Application Priority Data

Aug. 23, 2019 (CN) ......................... 201910789219.7

(51) Int. Cl.

| | |
|---|---|
| ***C07F 1/12*** | (2006.01) |
| ***C07F 1/00*** | (2006.01) |
| ***C09K 11/06*** | (2006.01) |
| ***H10K 85/30*** | (2023.01) |
| *H10K 50/11* | (2023.01) |

(52) U.S. Cl.
CPC ............. *H10K 85/371* (2023.02); *C07F 1/00* (2013.01); *C09K 11/06* (2013.01); *C09K 2211/1029* (2013.01); *C09K 2211/188* (2013.01); *H10K 50/11* (2023.02)

(58) Field of Classification Search
CPC ........... C07F 1/12; H10K 50/00; C09K 11/00; H05B 33/14
USPC ................................ 546/2, 10; 313/498, 504
See application file for complete search history.

(56) References Cited

U.S. PATENT DOCUMENTS

| | | | | |
|---|---|---|---|---|
| 8,415,473 | B2 | 4/2013 | Yam et al. | |
| 11,532,795 | B2 * | 12/2022 | Yam | C07F 1/12 |
| 2017/0222164 | A1 | 8/2017 | Yam et al. | |

FOREIGN PATENT DOCUMENTS

| | | | |
|---|---|---|---|
| CN | 107129471 | A | 9/2017 |
| CN | 107778220 | A | 3/2018 |
| CN | 109563065 | A | 4/2019 |
| CN | 110407882 | A | 11/2019 |
| EP | 2803671 | A1 | 11/2014 |
| KR | 10-2019-0013565 | A | 2/2019 |
| WO | 2017129135 | A1 | 8/2017 |
| WO | 2018064974 | A1 | 4/2018 |
| WO | 2019134651 | A1 | 7/2019 |

OTHER PUBLICATIONS

International Search Report for PCT/CN2020/110777 mailed Dec. 2, 2020, ISA/CN.

Wai-Pong To et al., Highly Luminescent Pincer Gold(III) Aryl Emitters: Thermally Activated Delayed Fluorescence and Solution-Processed OLEDs, Angew. Chem. Int. Ed. Oct. 5, 2017 No. 45 vol. 56 pp. 14036-14041, Figure 1.

Dongling Zhou et al., Thermally Stable Donor-Acceptor Type (Alkynyl)Gold(III) TADF Emitters Achieved EQEs and Luminance of up to 23.4% and 70 300 cd m-2 in Vacuum-Deposited OLEDs, Adv. Sci. 2019, 6, 1802297.

(Continued)

*Primary Examiner* — Charanjit Aulakh
(74) *Attorney, Agent, or Firm* — Yue (Robert) Xu; Apex Attorneys at Law, LLP

(57) ABSTRACT

Provides a type of gold(III) complex supported by tetradentate ligand having a structure of formula (I). The light-emitting device prepared by using the complex as a light-emitting layer material or dopant in the light-emitting device has a high external quantum efficiency, and a low efficiency roll-off. In addition, the preparation process of the tetradentate ligand provided in the present disclosure is simple and the yield is satisfactory. More importantly, the preparation reaction of the material is controllable and stable, and has a good reproducibility, and is suitable for industrial application.

(I)

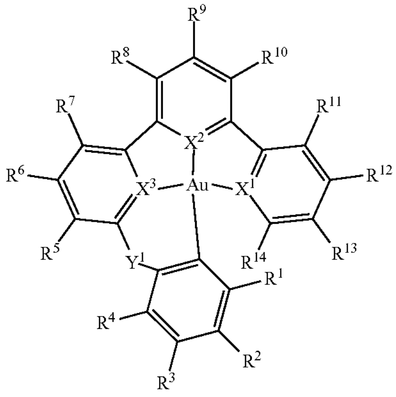

12 Claims, 10 Drawing Sheets

(56) References Cited

OTHER PUBLICATIONS

Vivian Wing-Wah Yam et al., Luminescent Gold(iii) Alkynyl Complexes: Synthesis, Structural Characterization, and Luminescence Properties, Angew. Chem. Int. Ed. 2005, 44, 3107-3110.
Man-Chung Tang et al., Dendritic Luminescent Gold(III) Complexes for Highly Efficient Solution-Processable Organic Light-Emitting Devices, Angew. Chem. Int. Ed. 2013, 52, 446-449.
Roopender Kumar et al., Luminescent (N/\C/\C) Gold(III) Complexes: Stabilized Gold(III) Fluorides, Angew. Chem. Int. Ed. 2015, 54, 14287-14290.
Man-Chung Tang et al., Highly Emissive Fused Heterocyclic Alkynylgold(III) Complexes for Multiple Color Emission Spanning from Green to Red for Solution-Processable Organic Light-Emitting Devices, Angew. Chem. Int. Ed. 2018, 57, 5463-5466.
Keith Man-Chung Wong et al., A novel class of phosphorescent gold(III) alkynyl-based organic light-emitting devices with tunable colour, Chem. Commun. 2005, 2906-2908.
Dragos-Adrian Rosca et al., Cyclometallated gold(III) hydroxides as versatile synthons for Au—N, Au—C complexes and luminescent compounds, Chem. Commun. 2012, 48, 7247-7249.
Marte Sofie Martinsen Holmsen et al., Synthesis of a (N,C,C) Au(III) pincer complex via Csp3-H bond activation: increasing catalyst robustness by rational catalyst design, Chem. Commun., 2018, 54, 11104-11107.
Man-Chung Tang et al., Rational molecular design for realizing high performance sky-blue-emitting gold(III) complexes with monoaryl auxiliary ligands and their applications for both solution-processable and vacuum-deposited organic light-emitting devices, Chem. Sci. 2019, 10, 594-605.
Keith Man-Chung Wong et al., A Class of Luminescent Cyclometalated Alkynylgold(III) Complexes: Synthesis, Characterization, and Electrochemical, Photophysical, and Computational Studies of [Au(C/\N/\C)(CtCsR)] (C/\N/\C ) K3C,N,C Bis-cyclometalated 2,6-Diphenylpyridyl), J. Am. Chem. Soc. 2007, 129, 4350-4365.
Vonika Ka-Man Au et al., High-Efficiency Green Organic Light-Emitting Devices Utilizing Phosphorescent Bis-cyclometalated Alkynylgold(III) Complexes, J. Am. Chem. Soc. 2010, 132, 14273-14278.
Man-Chung Tang et al., Bipolar Gold(III) Complexes for Solution-Processable Organic Light-Emitting Devices with a Small Efficiency Roll-Off, J. Am. Chem. Soc. 2014, 136, 17861-17868.
Chin-Ho Lee et al., Sky-Blue-Emitting Dendritic Alkynylgold(III) Complexes for Solution-Processable Organic Light-Emitting Devices, J. Am. Chem. Soc. 2017, 139, 10539-10550.
Man-Chung Tang et al., Realization of Thermally Stimulated Delayed Phosphorescence in Arylgold(III) Complexes and Efficient Gold(III) Based Blue-Emitting Organic Light-Emitting Devices, J. Am. Chem. Soc. 2018, 140, 13115-13124.
Vivian Wing-Wah Yam et al., Syntheses, Crystal Structures and Photophysics of Organogold(iii) Diimine Complexes, J. Chem. Soc., Dalton Trans. 1993, 1001-1002.
Tobias von Arx et al., Stable N-heterocyclic carbene (NHC) cyclometalated (C/\C) gold(III) complexes as blue-blue green phosphorescence emitters, J. Mater. Chem. C, 2017, 5, 3765-3769.
Lok-Kwan Li et al., Strategies towards rational design of gold(iii) complexes for high-performance organic light-emitting devices, Nature Photonics, 2019, 13, 185-191.
Kar-Ho Wong et al., Application of 2,6-Diphenylpyridine as a Tridentate [C/\N/\C] Dianionic Ligand in Organogold(III) Chemistry. Structural and Spectroscopic Properties of Mono- and Binuclear Transmetalated Gold(III) Complexes, Organometallics 1998, 17, 3505-3505.
Eirin Langseth et al., Versatile Methods for Preparation of New Cyclometalated Gold(III) Complexes, Organometallics 2012, 31, 6567-6571.
First Office Action dated Nov. 6, 2023 for Chinese patent application No. 201910789219.7, English translation provided by Global Dossier.
CAS RN No. 1174536-53-8, reg database, STN data platform, Aug. 18, 2009.
Jie Shen,"Study on preparation and properties of novel reactive phenolic hydroxyl-containing polyimides", J Polym Res (2012) 19:9857.
Tao Ma et al.,"Synthesis and characterization of soluble polyimides based on a new fluorinated diamine: 4-Phenyl-2,6-bis[3-(40-amino-20-trifluoromethyl-phenoxy) phenyl] pyridine",Journal of Fluorine Chemistry 131 (2010) 724-730.
Shanyin Yan et al.,"Optical Transparency and Light Colour of Highly Soluble Fluorinated Polyimides Derived from a Novel Pyridine-Containing Diamine m, p-3FPAPP and Various Aromatic Dianhydrides", Designed Monomers and Polymers 14 (2011) 579-592.
Shanyin Yan et al., "Soluble polyimides based on a novel pyridine-containing diamine m,p-PAPP and various aromatic dianhydrides",Polym. Bull. (2011) 66:1191-1206.
Search Report dated Jul. 12, 2023 for European patent application No. 20859208.9.
Jie Shen et al.,"Synthesis and Properties of Hyperbranched Polyimides Derived from Novel Triamine with Prolonged Chain Segments",Journal of Polymer Science, Part A: Polymer Chemistry , vol. 51, No. 11, Jun. 1, 2013, pp. 2425-2437.

* cited by examiner

TETRADENTATE LIGANDS, GOLD(III) COMPLEXES, PREPARATION METHOD AND USE THEREOF

CROSS REFERENCE OF RELATED APPLICATION

This application is the national phase of International Application No. PCT/CN2020/110777, titled "TETRADENTATE LIGANDS, GOLD (III) COMPLEXES, PREPARATION METHOD AND USE THEREOF", filed on Aug. 24, 2020, which claims the priority of Chinese Patent Application No. 201910789219.7, filed on Aug. 23, 2019 and titled with "TETRADENTATE LIGANDS, GOLD (III) COMPLEXES, PREPARATION METHOD AND USE THEREOF", and the disclosures of which are hereby incorporated by reference.

FIELD

The present invention relates to a technical field of light-emitting materials, in particular to a type of tetradentate ligand, a type of gold(III) complex, and a preparation method and use thereof.

BACKGROUND

Since the advent of organic and polymer electroluminescent materials and the corresponding devices organic light-emitting diodes (OLED), due to their advantages such as light weight, fast response speed, low driving voltage, wide viewing angle, and being suitable for the manufacture of flexible substrates, a research boom has been set off in academics and industry. These materials are also considered to be the most promising material for the next generation of flat panel display technology in the field of commercial flat panel displays and solid-state light emitting systems.

Among them, light-emitting materials are the key to OLED display technology, and the performance of good light-emitting materials is mainly reflected in high photoluminescence quantum yield (PLQY), high electroluminescence (EL) efficiency, high external quantum efficiency (EQE), and short radiative lifetime, low efficiency roll-off, adjustable color, high luminous color purity, long device operational life, suitable for CRT manufacturing process, etc., all of which mainly depend on the chemical structure of the metal complex as the light-emitting material.

Metal complexes are one of the most widely studied light-emitting materials. This is because the presence of heavy metal centers can increase the spin-orbit coupling efficiency of the mixed singlet and triplet states, shorten the emission lifetime, thereby effectively reducing the excited state quenching due to long emission lifetime and triplet excited state saturation and greatly improving the electro-optical conversion efficiency. Organometallic complexes with Ir(III), Ru(II), and Pt(II) as the metal centres have rich and excellent luminescent properties. Up until now, they have been studied in detail, and a series of light-emitting materials with excellent properties have been developed, such as porphyrin-based Pt(II) triplet luminophore PtOEP, cyclometalated Ir(III) luminophore [$Ir(ppy)_3$], [$Ir(4,6\text{-}dFppy)_2(pic)$], etc., which can be used as a dopant for the manufacture of high-efficiency OLEDs, and some have been commercialized. However, there are still major limitations in the development light-emitting materials for OLEDs. This is because different metal centers and the use of different ligand structures such as spatial configuration, conjugation effects, electrical properties, and substituent effects all will have a very substantial impact on the light-emitting property of the metal complexes, and it is often difficult to accurately predict the outcome of a certain change in the chemical structure of the material. The types of heavy metal centres that can be used for preparing metal complexes to be used in OLEDs are limited and the cost is high. The complex structure that can be designed is diverse but the rationale of obtaining complexes having good luminescence performance is difficult to follow, leading to difficulties and low efficiency in discovering new light-emitting materials, narrow adjustable range of the color of the light-emitting materials, and limited selection of commercially available light-emitting materials. Therefore, the design, reconstruction or modification of the chemical structure of new organometallic complexes based on different heavy metal centers is of great significance for the discovery of new light-emitting materials with excellent luminescence properties, and may further reduce the manufacturing cost of the display screen.

Compared with metals such as Pt and Ir, Au is more abundant and cheaper, but the development of Au complexes as light-emitting materials is still in the exploratory stage. Yam's group has made a lot of pioneering work [Nature Photonics, 2019, 13, 185-191; Angew. Chem. Int. Ed. 2018, 57, 5463-5466; J. Am. Chem. Soc. 2017, 139, 10539-10550; J. Am. Chem. Soc. 2014, 136, 17861-17868; Angew. Chem. Int. Ed. 2013, 52, 446-449; J. Am. Chem. Soc. 2010, 132, 14273-14278; U.S. Pat. No. 8,415,473; J. Am. Chem. Soc. 2007, 129, 4350-4365; Angew. Chem. Int. Ed. 2005, 44, 3107-3110; Chem. Commun. 2005, 2906-2908; J. Chem. Soc., Dalton Trans. 1993, 1001-1002], which mainly relate to phosphorescence of different gold(III) complexes supported by bidentate or tridentate ligands. They explain the problem of low luminescence efficiency of Au(III) complexes using the theory that the low-energy d-d ligand field (LF) causes serious quenching of emissive excited state, and propose to enhance luminescence through the use of a strong σ-donor ligand in the Au(III) complexes, such as dendritic alkynyl ligands or bipolar ligands containing triphenylamine and benzimidazole.

Nature Photonics, 2019, 13, 185-191 newly reports a tridentate gold(III) complex. After optimization, the device fabricated with this gold(III) complex showed a maximum external quantum efficiency EQE of 21.6% and an efficiency roll-off of less than 15% at luminance of 1000 cd $m^{-2}$. In addition, the EQE of the device prepared through solution process is lower than 13.5%, and the current efficiency is lower than 37.4 cd $A^{-1}$, and the EQE drops sharply with the increase of luminance.

However, the gold complexes based on tetradentate ligand may bring about different light-emitting properties or device performance. There is only one report on related research [US20170222164]. The literature describes the palladium-catalysed intramolecular bridging of a gold(III)-bound monodentate ligand such as alkynyl group which can provide a strong σ-donor and have a larger conjugated system or a bipolar fused heterocyclic aryl group to the tridentate ligand of the same gold(III) complex to furnish a gold(III) complex supported by tetradentate ligand. The single-step synthesis yield is 42-72%. The maximum external quantum efficiency of the device fabricated with this kind of gold(III) complex is lower than or equal to 11.1% through solution process at a doping concentration of 20%, and the EQE drops sharply with the increase of current density. Although it is mentioned to have high brightness, the absence of valid proof data renders it difficult to be used for evaluation.

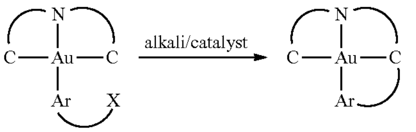

The current microwave synthetic methods for the synthesis of Au(III) complexes have been employed for the preparation of bidentate or tridentate gold(III) complexes. However, the use of microwave technology in the synthesis of gold(III) complex supported by tetradentate ligand with gold-carbon bonds has not been reported. In 2012, Tilset and co-workers obtained bidentate gold(III) complexes by dissolving ligand 2-(4-methylphenyl)pyridine and gold acetate in a mixed solvent TFA/$H_2O$, and reacting in a microwave reactor [Organometallics 2012, 31, 6567-6571]. In 2018, the same research team obtained gold(III) complex by using 2-(3,5-di-tert-butylphenyl)pyridine as a tridentate ligand and under the same conditions [Chem. Commun., 2018, 54, 11104-11107]. In 2015, Nevado et al. obtained gold(III) complexes supported by tridentate C^C^N ligand by using microwave technology [Angew Chem. Int. Ed. 2015, 54, 14287-14290]. In 2017, Venkatesan et al. synthesized gold (III) compound supported by a bidentate ligand with two C-donor atoms by oxidizing Au(I) complexes to Au(III) complexes, and then coupling the metal and the ligand through activation of the carbon-hydrogen C—H bond on the ligand using microwave technology [J. Mater. Chem. C, 2017, 5, 3765-3769]. The synthesis of tetradentate ligands has long been a challenging task. The synthetic method provided in the existing literature involves many steps and long operation cycle. Through our experiments, we found that the reaction reproducibility is poor, and the yield is unstable. Moreover, the structures of the complexes that can be developed with this method are difficult to be modified, and many target complexes cannot be synthesized by this method, which is neither conducive to research and development, nor to commercial preparation. Because of this limitation, although the Au(III) complex supported by tetradentate ligand are expected to have better stability as compared with the one supported by tridentate ligand, there are fewer research toward this direction, and its commercial application prospects are not promising.

In summary, although the development and research of Au complexes as light-emitting materials in OLEDs has made preliminary progress, there are very few cases where Au complexes meet the requirements in the prior art, and they are far from meeting the needs of light-emitting materials. In most products, the light-emitting performance parameters are still far from ideal. For example, the external quantum efficiency is low, the efficiency roll-off is significant, and the external quantum efficiency cannot meet the requirements under the practical brightness of 1000 cd $m^{-2}$. Evidently, there is a long way to go before commercialization. Therefore, it is of great significance to develop a new structure of ligand for preparing Au complexes with better light-emitting properties, especially to obtain tetradentate Au(III) complexes and with excellent properties and preparation methods.

SUMMARY

In view of this, the purpose of the present invention is to provide a type of tetradentate ligand, a type of gold(III) complex, and a preparation method and use thereof. The optical device prepared by the gold(III) complex obtained with the tetradentate ligand provided in the present disclosure has high external quantum efficiency and low efficiency roll-off. Moreover, the preparation method of the gold(III) complex is simple, making it easy for realizing industrial production.

The present invention provides a type of gold(III) complex supported by tetradentate ligand having a structure of formula (I), comprising a metal center and a cyclometalating tetradentate ligand, wherein the metal center is +3 gold, which has four coordination sites in a square planar geometry, and occupied by cyclometalating tetradentate ligand clockwise or counterclockwise in the order of coordination atoms C, C, N, and C, to form a 5-5-6-membered fused ring structure comprising gold-carbon bond (Au—C) and N donor bond (Au←N). That is, when the two adjacent coordinating atoms in the tetradentate ligand are separated by 3 linked covalent bonds (single bond or double bond), it coordinates with gold to form a five-membered ring; when the two adjacent coordination atoms in the tetradentate ligand are separated by 4 linked covalent bonds (single bond or double bond), it coordinates with gold to form a six-membered ring; and each coordinating atom is independently located on a different aromatic ring of the tetradentate ligand. It is found through experiments that the light-emitting device prepared by using the gold(III) complex of the present invention as a material or dopant for the light-emitting layer in the light-emitting device has high external quantum efficiency and low efficiency roll-off, and the complex of the present invention also exhibits thermally activated delayed fluorescence (TADF). Moreover, the preparation process of the tetradentate ligand provided in the present disclosure is simple and the yield is satisfactory. More importantly, the reaction for the preparation of the material is controllable and stable, and has a good reproducibility, and is suitable for industrial application.

DETAILED DESCRIPTION

Figure 1:
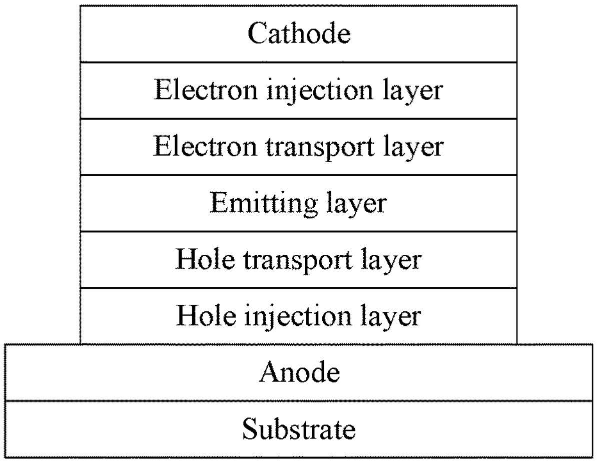
FIG. 1 shows a structural diagram of a light-emitting device according to an embodiment of the present invention.

The present invention provides a type of gold(III) complex, wherein the gold(III) complex has a chemical structure as shown in formula (I):

formula (I)

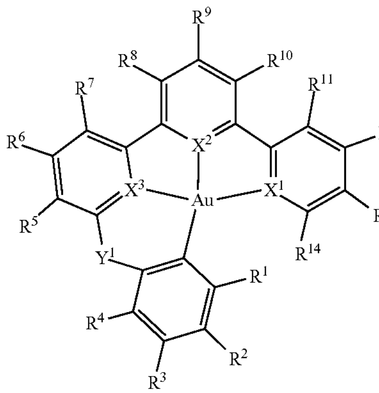

wherein $X^1$, $X^2$, $X^3$ are independently selected from carbon and nitrogen, and only one of $X^1$, $X^2$, $X^3$ is nitrogen;

$Y^1$ is O, $CR^{15}R^{16}$ or S;

$R^1$-$R^{16}$ are independently selected from hydrogen, deuterium, halogen, nitro, cyano, isocyano, trifluoromethyl, or independently selected from the following substituted or unsubstituted groups: alkyl, cycloalkyl, alkenyl, cycloalkenyl, alkynyl, aryl, aralkyl, heteroalkyl, heterocycloalkyl, heterocycloalkenyl, heteroaryl, heteroaralkyl, alkoxy, aryloxy, heteroaryloxy, $NR^{17}R^{18}$, acyl, acylamino, acyloxy, ester group, acylamido, sulfonylamino, sulfonyloxy, sulfonato, sulfonylamido or trialkylsilyl; wherein $R^{17}$ and $R^{18}$ are independently selected from the following substituted or unsubstituted groups: alkyl, cycloalkyl, alkenyl, cycloalkenyl, alkynyl, aryl, aralkyl, heteroalkyl, heterocycloalkyl, heterocycloalkenyl, heteroaryl, heteroaralkyl, alkoxy, aryloxy and heteroaryloxy;

or any two adjacent or proximal groups in $R^1$-$R^{18}$ together with the carbon atoms they attached form a 5-15 membered ring.

In some embodiments, $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$ are independently selected from hydrogen, deuterium, halogen, nitro, cyano, isocyano, trifluoromethyl, or independently selected from the following substituted or unsubstituted groups: $C_{1-15}$ alkyl, $C_{3-18}$ cycloalkyl, $C_{2-15}$ alkenyl, $C_{3-18}$ cycloalkenyl, $C_{2-15}$ alkynyl, $C_{6-30}$ aryl, $C_{7-35}$ aralkyl, $C_{2-20}$ heteroalkyl, $C_{3-20}$ heterocycloalkyl, $C_{5-30}$ heterocycloalkenyl, $C_{5-30}$ heteroaryl, $C_{6-30}$ heteroaralkyl, $C_{1-20}$ alkoxy, $C_{6-30}$ aryloxy, $C_{5-30}$ heteroaryloxy, $NR^{17}R^{18}$, acyl, acylamino, acyloxy, ester group, acylamido, sulfonylamino, sulfonyloxy, sulfonato, sulfonylamido and trialkylsilyl; wherein $R^{17}$ and $R^{18}$ are independently selected from the following substituted or unsubstituted groups: $C_{1-15}$ alkyl, $C_{3-18}$ cycloalkyl, $C_{2-15}$ alkenyl, $C_{3-18}$ cycloalkenyl, $C_{2-15}$ alkynyl, $C_{6-40}$ aryl, $C_{7-45}$ aralkyl, $C_{2-20}$ heteroalkyl, $C_{3-20}$ heterocycloalkyl, $C_{5-30}$ heterocycloalkenyl, $C_{5-30}$ heteroaryl, $C_{6-30}$ heteroaralkyl, $C_{1-20}$ alkoxy, $C_{6-30}$ aryloxy and $C_{5-30}$ heteroaryloxy.

In some embodiments, $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$ are independently selected from hydrogen, deuterium, halogen, nitro, cyano, isocyano, trifluoromethyl, or independently selected from the following substituted or unsubstituted groups: $C_{3-10}$ alkyl, $C_{5-12}$ cycloalkyl, $C_{4-10}$ alkenyl, $C_{5-12}$ cycloalkenyl, $C_{4-10}$ alkynyl, $C_{8-15}$ aryl, $C_{10-20}$ aralkyl, $C_{3-10}$ heteroalkyl, $C_{5-8}$ heterocycloalkyl, $C_{6-15}$ heterocycloalkenyl, $C_{8-15}$ heteroaryl, $C_{8-15}$ heteroaralkyl, $C_{3-10}$ alkoxy, $C_{10-20}$ aryloxy, $C_{8-15}$ heteroaryloxy, $NR^{17}R^{18}$, acyl, acylamino, acyloxy, ester group, acylamido, sulfonylamino, sulfonyloxy, sulfonato, sulfonylamido and trialkylsilyl; wherein $R^{17}$ and $R^{18}$ are independently selected from the following substituted or unsubstituted groups: $C_{1-15}$ alkyl, $C_{3-18}$ cycloalkyl, $C_{2-15}$ alkenyl, $C_{3-18}$ cycloalkenyl, $C_{2-15}$ alkynyl, $C_{6-40}$ aryl, $C_{7-45}$ aralkyl, $C_{2-20}$ heteroalkyl, $C_{3-20}$ heterocycloalkyl, $C_{5-30}$ heterocycloalkenyl, $C_{5-30}$ heteroaryl, $C_{6-30}$ heteroaralkyl, $C_{1-20}$ alkoxy, $C_{6-30}$ aryloxy and $C_{5-30}$ heteroaryloxy.

In some embodiments, the $NR^{17}R^{18}$ is a group represented by the following structure or a derivative group of the group represented by the following structure in which a hydrogen is substituted by one or more, same or different substituents:

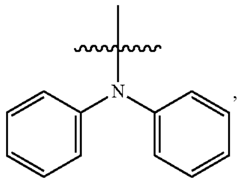
,
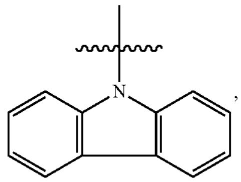
,

-continued

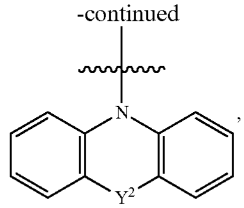

,

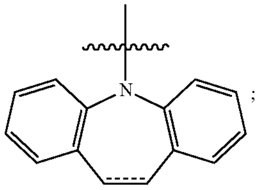

;

wherein, $Y^2$ is O, S, $CR^{20}R^{21}$, $SiR^{22}R^{23}$ or $NR^{24}$, $R^{20}$-$R^{24}$ are independently selected from hydrogen, deuterium, halogen, substituted or unsubstituted $C_{1-15}$ alkyl, substituted or unsubstituted $C_{6-30}$ aryl; the substituents in the substituted derivative groups are halogen, $C_{1-20}$ alkyl, $C_{1-20}$ alkoxy, $C_{1-20}$ alkylthio, 5-6 membered cycloalkyl, 5-6 membered heterocycloalkyl, $C_{6-30}$ aryl, $C_{6-30}$ aryloxy, $C_{5-30}$ heteroaryl, $C_{2-15}$ alkenyl, or $C_{2-15}$ alkynyl.

In some embodiments, when $R^1$-$R^{24}$ are groups containing substituents, the substituents on the groups are halogen, nitro, cyano, trifluoromethyl, $C_{1-20}$ alkyl, $C_{1-20}$ alkoxy, $C_{1-20}$ alkylthio, 5-6 membered cycloalkyl, 5-6 membered heterocycloalkyl, $C_{6-30}$ aryl, $C_{6-30}$ aryloxy, $C_{5-30}$ heteroaryl, $C_{2-15}$ alkenyl or $C_{2-15}$ alkynyl.

In some embodiments, when $R^1$-$R^{24}$ are groups containing substituents, the substituents on the groups are fluorine, chlorine, bromine, iodine, nitro, cyano, trifluoromethyl, methyl, ethyl, n-propyl, isopropyl, n-butyl, isobutyl, tert-butyl, n-pentyl, isopentyl, neopentyl, n-hexyl, n-heptyl, n-octyl, n-nonyl, n-decyl, methoxy, ethoxy, n-propoxy, isopropoxy, n-butoxy, isobutoxy, tert-butoxy, n-pentoxy, isopentoxy, neopentyloxy, n-hexoxy, n-heptyloxy, n-octyloxy, n-nonyloxy, n-decyloxy, cyclopropyl, cyclobutyl, cyclopentyl, cyclohexyl, cycloheptyl, cyclooctyl, vinyl, propenyl, butenyl, pentenyl, hexenyl, ethynyl, propynyl, butynyl, pentynyl, cyclopentenyl, cyclohexenyl, cycloheptenyl, phenyl, naphthyl, anthryl, phenanthryl, fluorenyl, phenylmethyl, phenylethyl, phenylpropyl, phenoloxy, methylphenyl, ethylphenyl, n-propylphenyl, isopropylphenyl, n-butylphenyl, isobutylphenyl, tert-butylphenyl, n-pentylphenyl, isopentylphenyl, neopentylphenyl, n-hexylphenyl, n-heptylphenyl, n-octylphenyl, n-nonylphenyl, n-decylphenyl, dimethylphenyl, diethylphenyl, di-n-propylphenyl, diisopropylphenyl, di-n-butylphenyl, diisobutylphenyl, di-tert-butylphenyl, di-n-pentylphenyl, di-isopentylphenyl, di-neo-pentylphenyl, di-n-hexylphenyl, di-n-heptylphenyl, di-n-octylphenyl, di-n-nonylphenyl, di-n-decylphenyl, diphenylaminophenyl, furyl, pyranyl, pyridyl, pyrimidinyl, thiazolyl, oxazolyl, imidazolyl, isoxazolyl, pyrrolyl, pyrazolyl, triazolyl, tetrazolyl, thienyl, furyl, pyridyl, pyrimidinyl, pyrazinyl, pyridazinyl, indolyl, quinolinyl, isoquinolinyl, quinoxalinyl, bipyridyl, acridinyl, phenanthridinyl, phenanthrolinyl, quinazolonyl, benzimidazolyl, benzofuranyl, benzothienyl, benzothiazolyl, benzoxazolyl, benzisoxazolyl, pyrrolidinyl, piperidinyl, piperazinyl, morpholinyl, or thiazinyl.

In some embodiments, $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$ are independently selected from hydrogen, deuterium, fluorine, chlorine, bromine, iodine, nitro, cyano, isocyano, trifluoromethyl, ester group, acyloxy, acylamido, sulfonylamino, sulfonyloxy, sulfonato, sulfonylamido, trialkylsilyl, methyl, ethyl, n-propyl, isopropyl, n-butyl, isobutyl, tert-butyl, n-pentyl, isopentyl, neopentyl, n-hexyl, n-heptyl, n-octyl, n-nonyl, n-decyl, methoxy, ethoxy, n-propoxy, isopropoxy, n-butoxy, isobutoxy, tert-butoxy, n-pentoxy, isopentoxy, neopentyloxy, n-hexoxy, n-heptyloxy, n-octyloxy, n-nonyloxy, n-decyloxy, cyclopropyl, cyclobutyl, cyclopentyl, cyclohexyl, cycloheptyl, cyclooctyl, vinyl, propenyl, butenyl, pentenyl, hexenyl, ethynyl, propynyl, butynyl, pentynyl, cyclopentenyl, cyclohexenyl, cycloheptenyl, phenyl, naphthyl, anthryl, phenanthryl, fluorenyl, phenylmethyl, phenylethyl, phenylpropyl, phenoloxy, methylphenyl, ethylphenyl, n-propylphenyl, isopropylphenyl, n-butylphenyl, isobutylphenyl, tert-butylphenyl, n-pentylphenyl, isopentylphenyl, neopentylphenyl, n-hexylphenyl, n-heptylphenyl, n-octylphenyl, n-nonylphenyl, n-decylphenyl, dimethylphenyl, diethylphenyl, di-n-propylphenyl, diisopropylphenyl, di-n-butylphenyl, diisobutylphenyl, di-tert-butylphenyl, di-n-pentylphenyl, di-isopentylphenyl, di-neo-pentylphenyl, di-n-hexylphenyl, di-n-heptylphenyl, di-n-octylphenyl, di-n-nonylphenyl, di-n-decylphenyl, diphenylaminophenyl, furyl, pyranyl, pyridyl, pyrimidinyl, thiazolyl, oxazolyl, imidazolyl, isoxazolyl, pyrrolyl, pyrazolyl, triazolyl, tetrazolyl, thienyl, furyl, pyridyl, pyrimidinyl, pyrazinyl, pyridazinyl, indolyl, quinolinyl, isoquinolinyl, quinoxalinyl, bipyridyl, acridinyl, phenanthridinyl, phenanthrolinyl, quinazolonyl, benzimidazolyl, benzofuranyl, benzothienyl, benzothiazolyl, benzoxazolyl, benzisoxazolyl, pyrrolidinyl, piperidinyl, piperazinyl, morpholinyl, thiazinyl and the following groups:

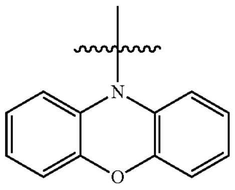

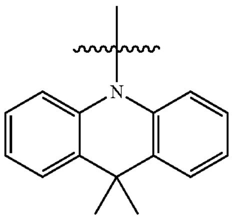

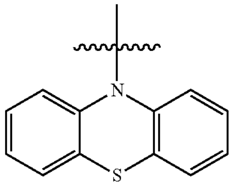

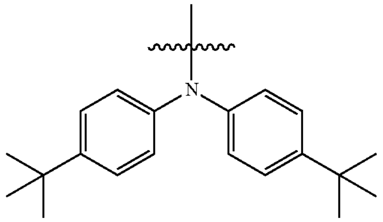

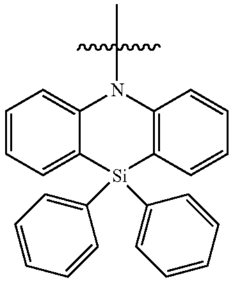

-continued
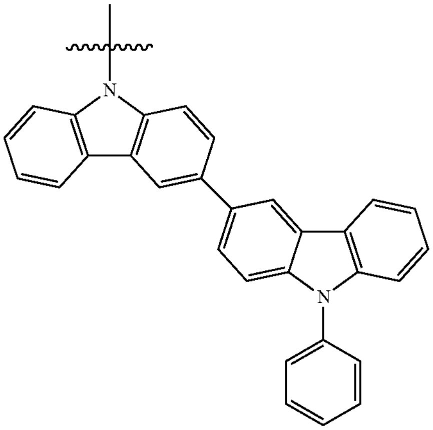
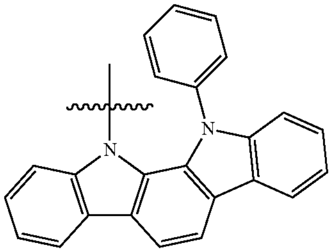
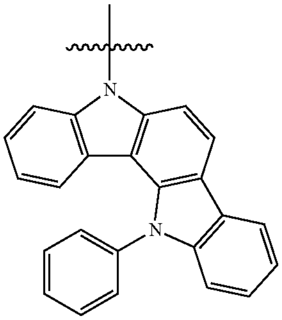
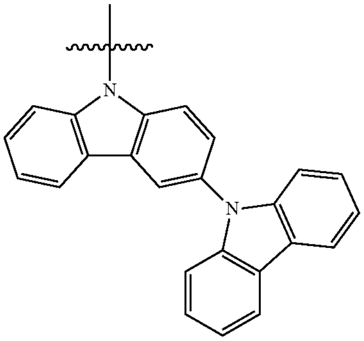
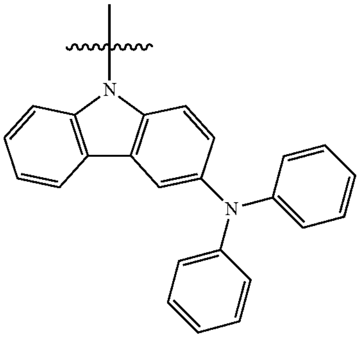
-continued
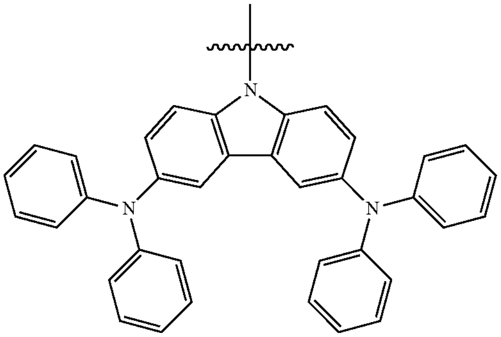
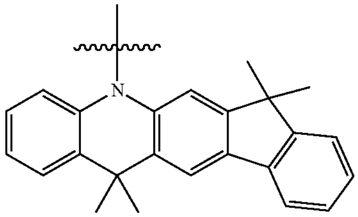
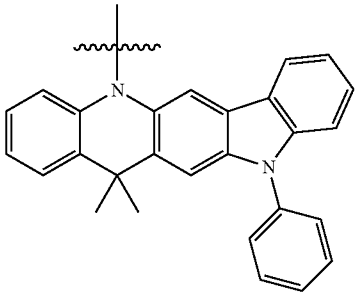
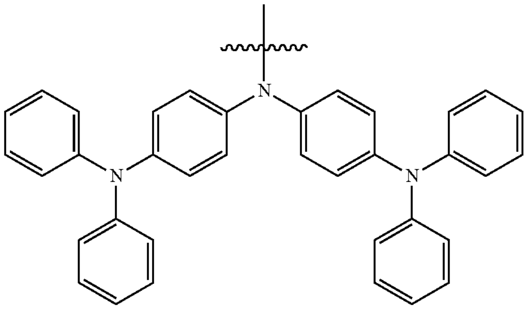
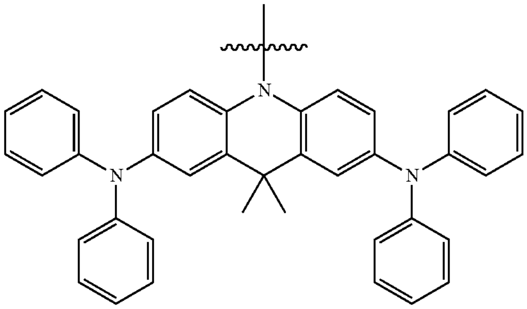

-continued

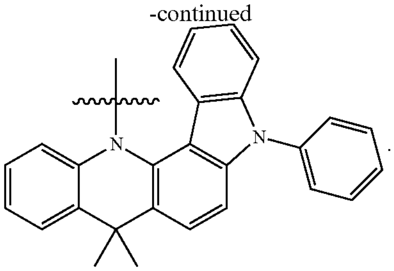

.

In some embodiments, at least one of $R^1$-$R^{14}$ is $NR^{17}R^{18}$.

In some embodiments, $R^1$-$R^{14}$ comprise 1-3 $NR^{17}R^{18}$ groups.

In some embodiments, at least one of $R^2$, $R^3$, $R^6$, $R^9$, $R^{12}$, and $R^{13}$ is $NR^{17}R^{18}$.

In some embodiments, $R^{17}$ and $R^{18}$ are independently substituted or unsubstituted alkyl, substituted or unsubstituted aryl, substituted or unsubstituted heteroaryl.

In some embodiments, $R^1$-$R^{14}$ have 1-10, preferably 2, 3, 4, 5, or 6, groups that are not hydrogen, wherein the 1-10 groups that are not hydrogen are each independently selected from fluorine, chlorine, bromine, iodine, cyano, or are selected from the following substituted or unsubstituted groups: alkyl, alkoxy, aryl, aryloxy, trialkylsilyl or $NR^{17}R^{18}$.

In some embodiments, the 5-15 membered ring formed from any two adjacent or proximal groups in $R^1$-$R^{18}$ together with the carbon atoms they attached is a 5-15 membered heteroaryl group, a 5-15 membered aryl group, a 5-15 membered heterocyclic group, a 5-15 membered cycloalkyl group or a 5-15 membered unsaturated cycloalkyl group; wherein the heteroatoms in the heteroaryl group and heterocyclic group are independently selected from nitrogen, sulfur and oxygen.

In some preferred embodiments, $X^2$ is N, $Y^1$ is O, $CR^{15}R^{16}$ or S. In $R^1$-$R^{16}$, the definition of R meets at least one of the following: at least one of $R^6$ and $R^7$ is halogen, $C_{1-4}$ alkyl, $C_{6-40}$ substituted or unsubstituted aryl, $C_{6-40}$ substituted or unsubstituted aryloxy; $R^9$ is hydrogen, deuterium, halogen, $C_{1-4}$ alkyl or $C_{6-40}$ substituted or unsubstituted aryl; $R^2$, $R^3$, $R^{12}$, $R^{13}$ are independently hydrogen, deuterium, halogen, $C_{1-4}$ alkyl, $NR^{17}R^{18}$, $C_{6-40}$ substituted or unsubstituted aryl, $C_{6-40}$ substituted or unsubstituted aryloxy; $R^{15}$ and $R^{16}$ are substituted or unsubstituted aryl, and $R^{15}$ and $R^{16}$ are connected directly or through a heteroatom O, S, $NR^{19}$, wherein $R^{19}$ is substituted or unsubstituted alkyl, or substituted or unsubstituted aryl.

In some other preferred embodiments, $X^3$ is N, $Y^1$ is O, $CR^{15}R^{16}$ or S. In $R^1$-$R^{16}$, the definition of R meets at least one of the following: at least one of $R^8$ and $R^9$ is halogen, $C_{1-4}$ alkyl, $C_{6-40}$ substituted or unsubstituted aryl, $C_{6-40}$ substituted or unsubstituted aryloxy; $R^{15}$ and $R^{16}$ are substituted or unsubstituted aryl, and $R^{15}$ and $R^{16}$ are connected directly or through a heteroatom O, S, $NR^{19}$, wherein $R^{19}$ is substituted or unsubstituted alkyl, or substituted or unsubstituted aryl.

In some embodiments, the total number of carbon atoms in $R^1$-$R^{14}$ or $R^1$-$R^{16}$ is 1-80, preferably 12-60, more preferably 12-50.

In some embodiments, $R^{17}$ and $R^{18}$ are directly connected or connected through a bridge atom to form a 5-7 membered heterocyclic ring or an aryl-fused heterocyclic ring.

In some other embodiments, $NR^{17}R^{18}$ is a group selected from

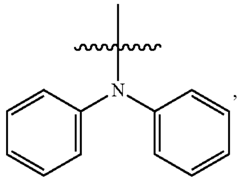

,

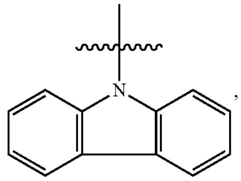

,

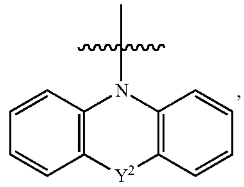

,

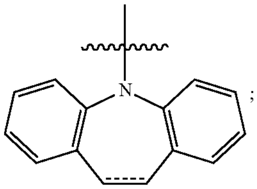

;

or a derivative group of these groups in which a hydrogen is substituted by one or more, same or different substituents; wherein $Y^2$ is O, S, $CR^{20}R^{21}$, $SiR^{22}R^{23}$ or $NR^{24}$, $R^{20}$-$R^{24}$ are hydrogen, deuterium, halogen, substituted or unsubstituted alkyl, substituted or unsubstituted aryl; wherein the substituents in the substituted derivative groups are not limited, preferably the derivative groups are selected from halogen, nitro, cyanotrifluoromethyl, $C_{1-4}$ alkyl, $C_{1-4}$ alkoxy, $C_{1-4}$ alkylthio, 5-6 membered cycloalkyl, 5-6 membered heterocycloalkyl, aryl, aryloxy, heteroaryl, alkenyl, alkynyl, and the substituents in the derivative group are independent groups or there are one or more 5-8 membered ring formed by connecting any two adjacent groups.

Specifically, some non-limiting examples of $NR^{17}R^{18}$ are shown in the following structures:

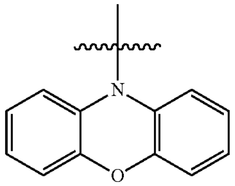

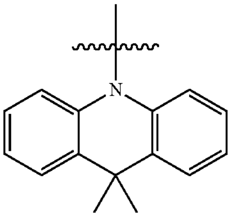

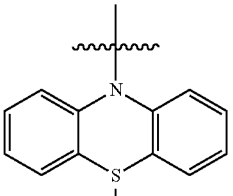

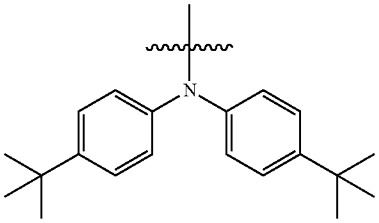

-continued
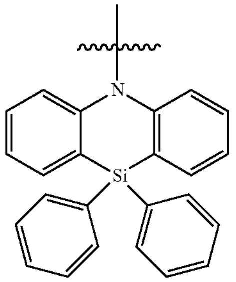
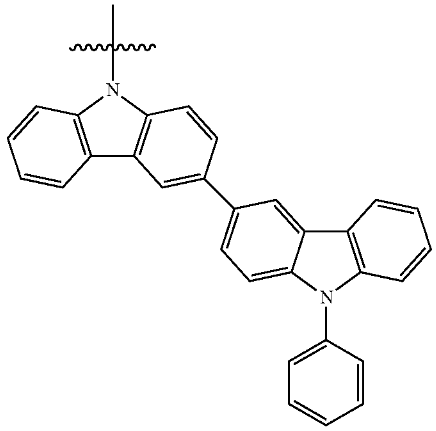
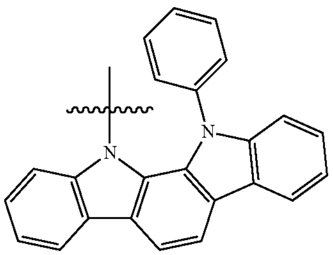
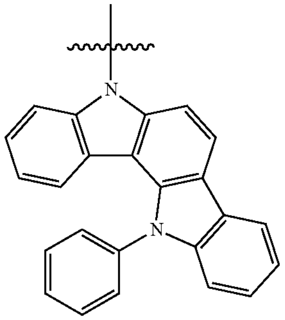
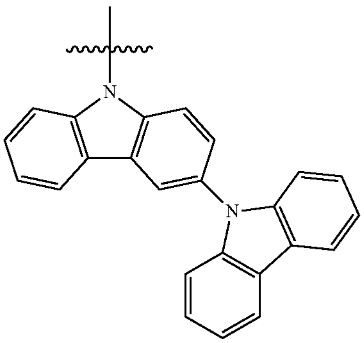
-continued
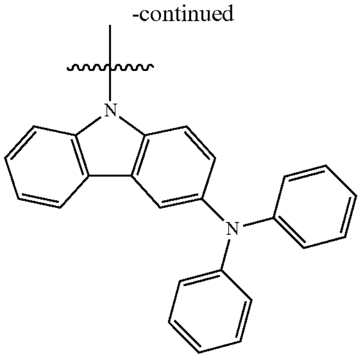
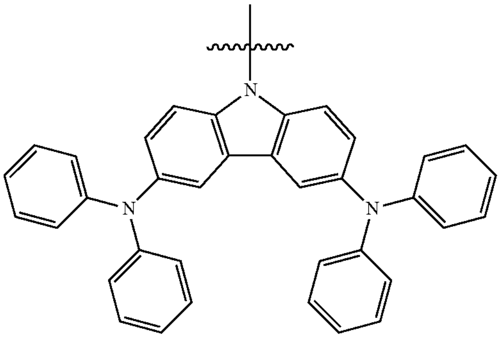
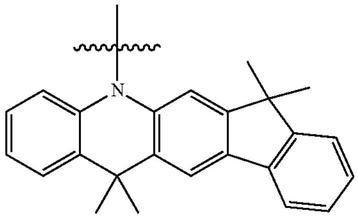
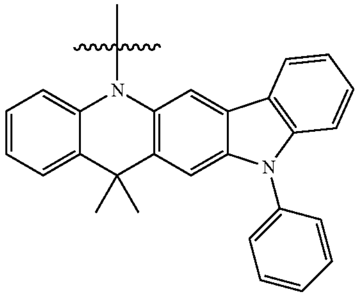
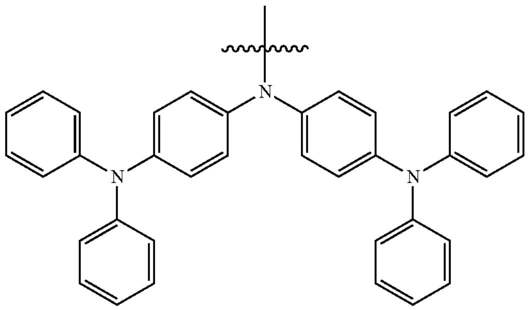

-continued
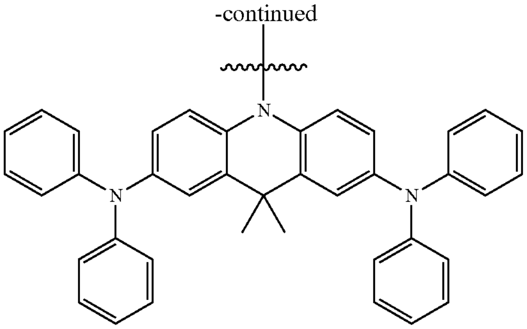
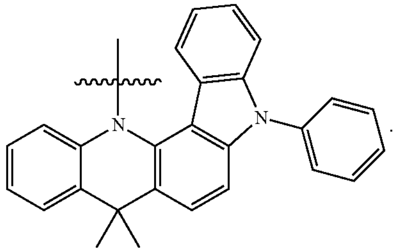
In some embodiments, any one of $R^1$-$R^{16}$ containing carbon atoms has no more than 40 carbon atoms.
In some embodiments, any one of $R^1$-$R^{16}$ containing no aryl has no more than 6 carbon atoms.
In some embodiments, the gold(III) complex supported by tetradentate ligand is any of the following compounds:
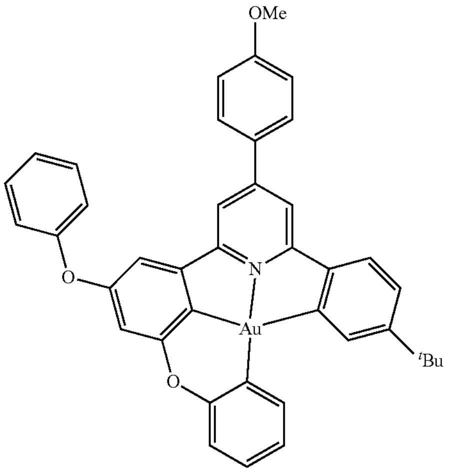
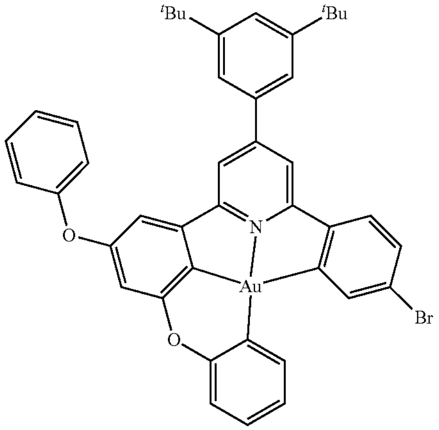
-continued
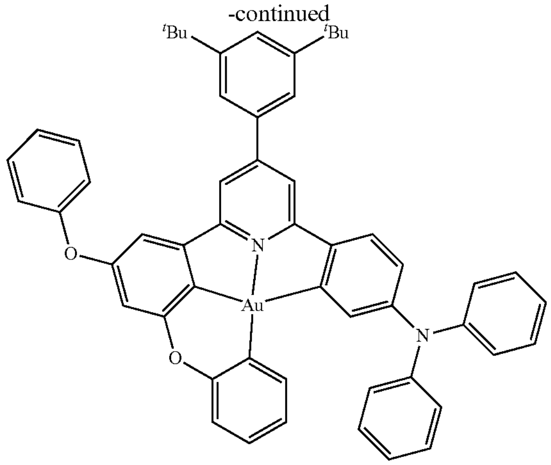
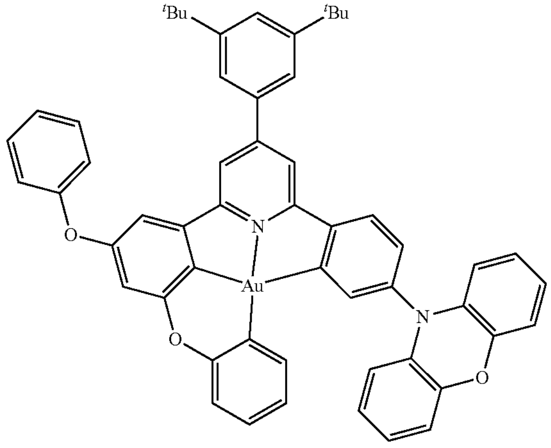
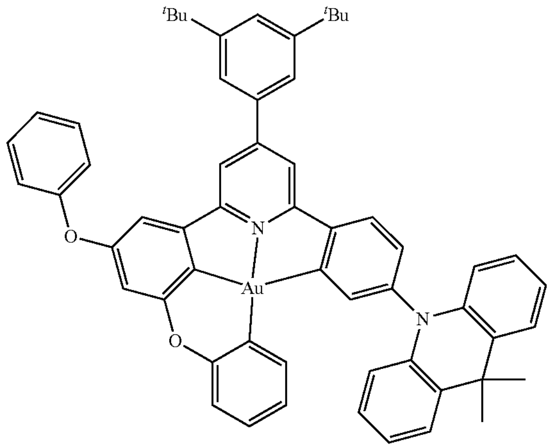

-continued
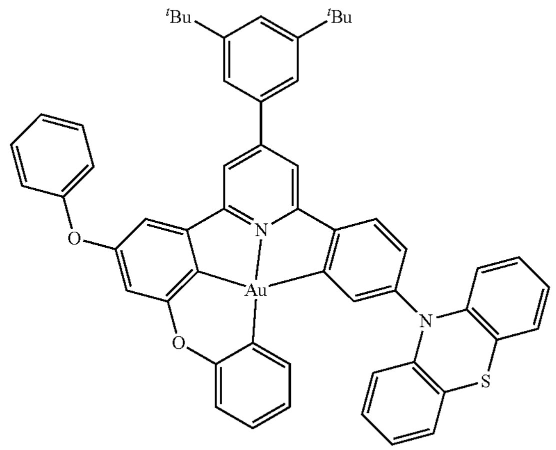
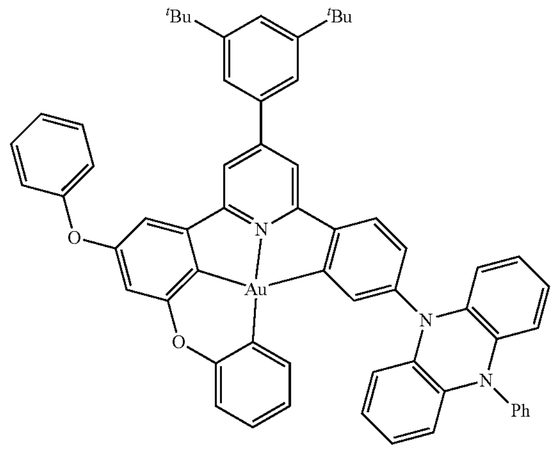
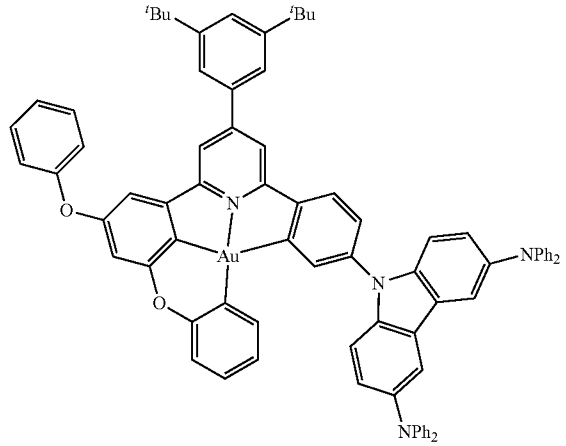
-continued
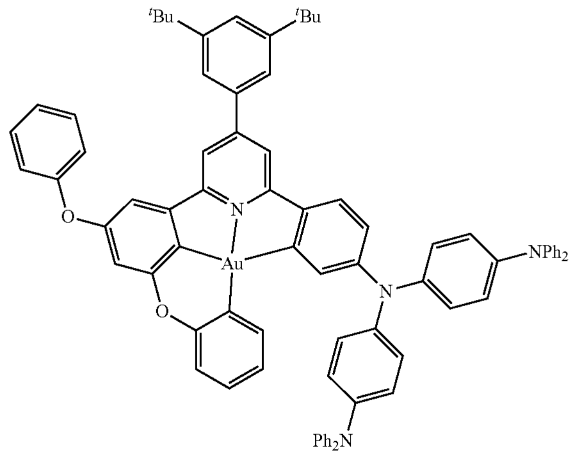
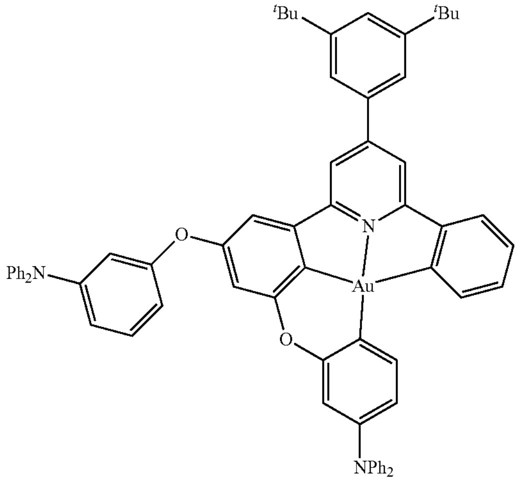
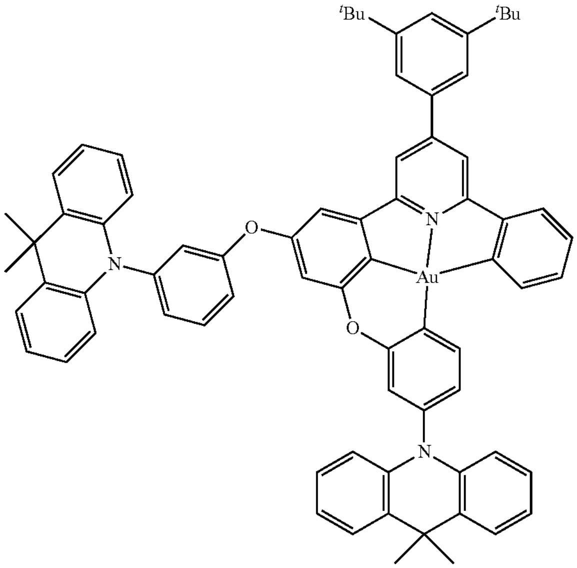

-continued
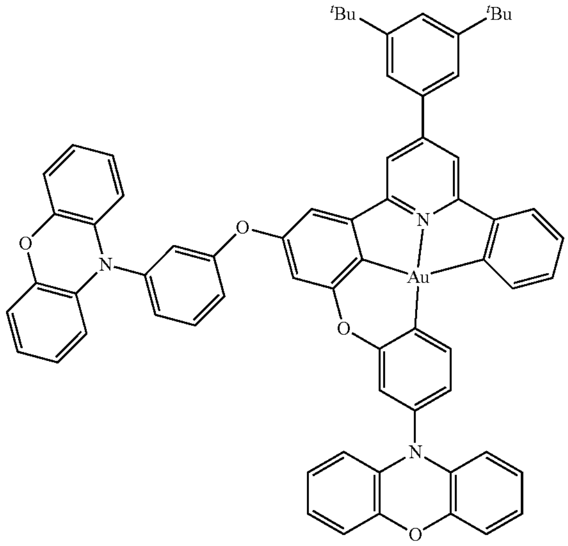
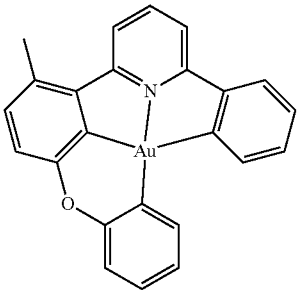
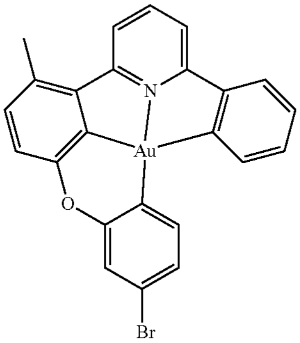
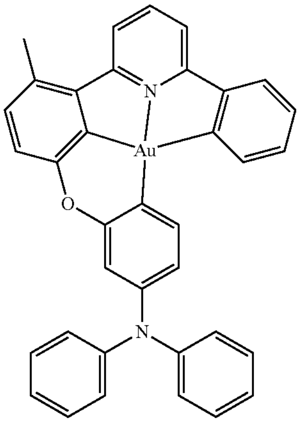
-continued
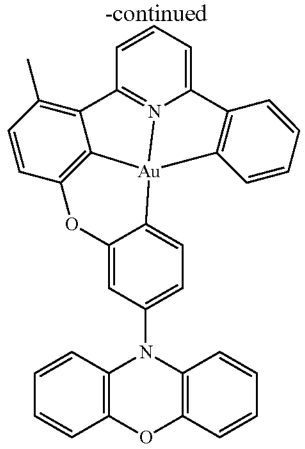
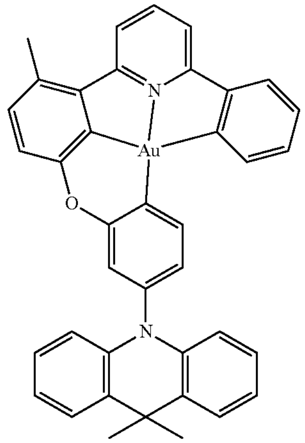
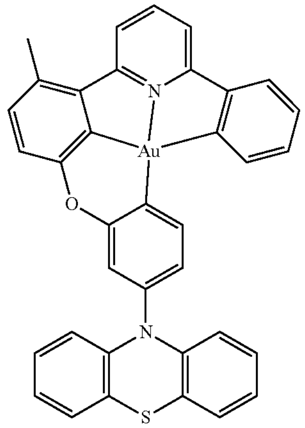
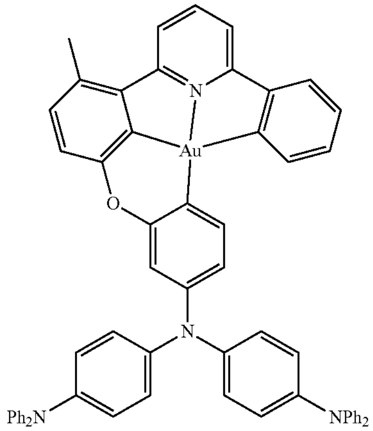

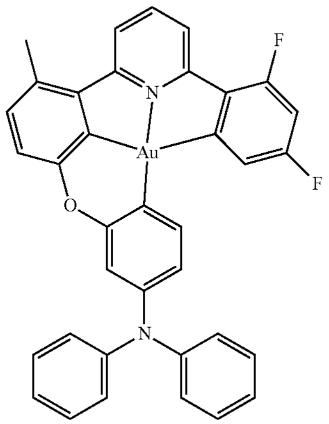
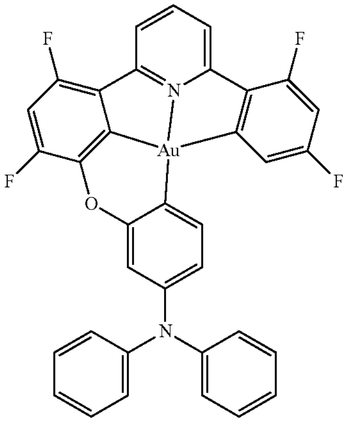
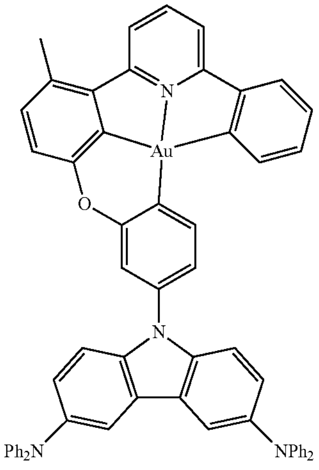
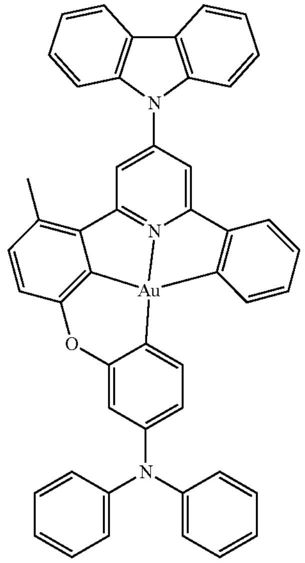
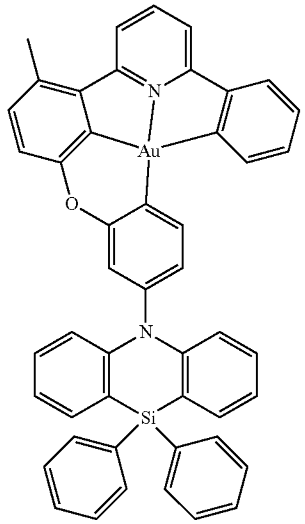
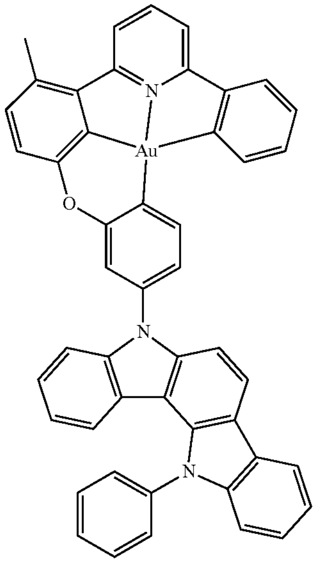

-continued
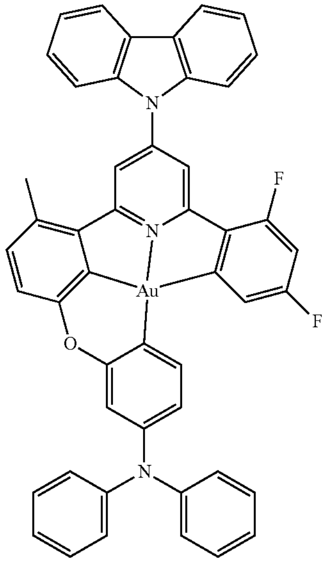
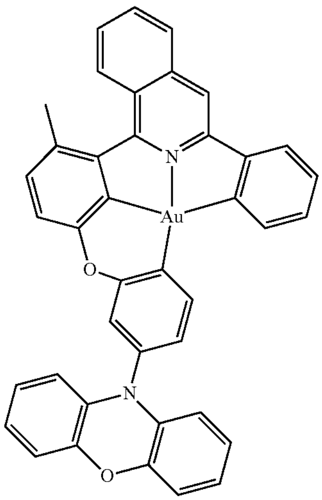
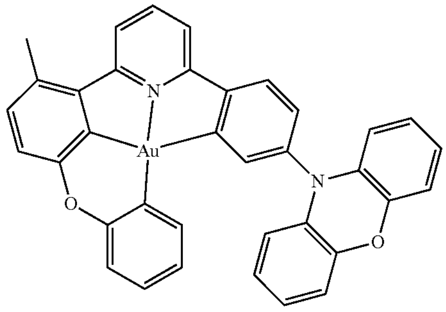
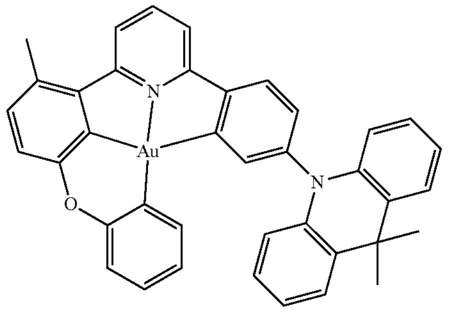
-continued
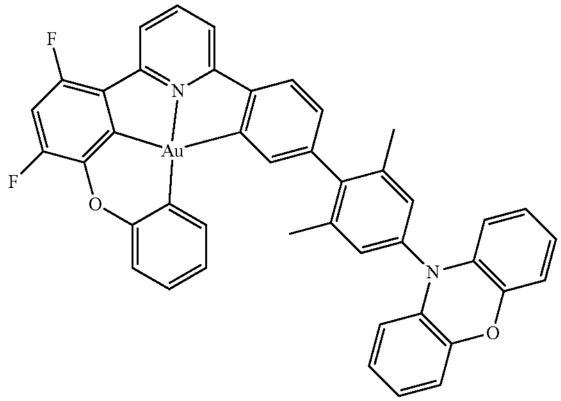
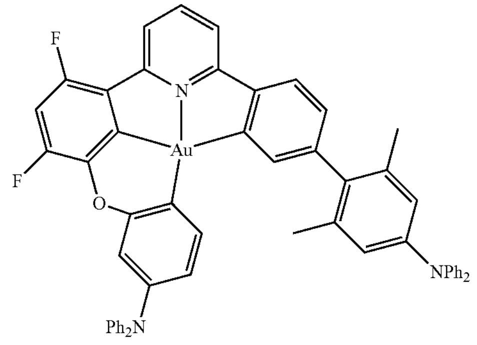
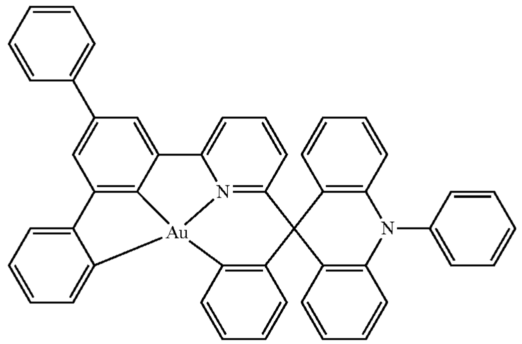
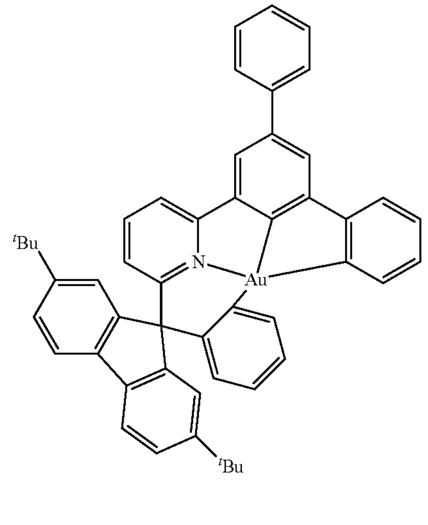

-continued

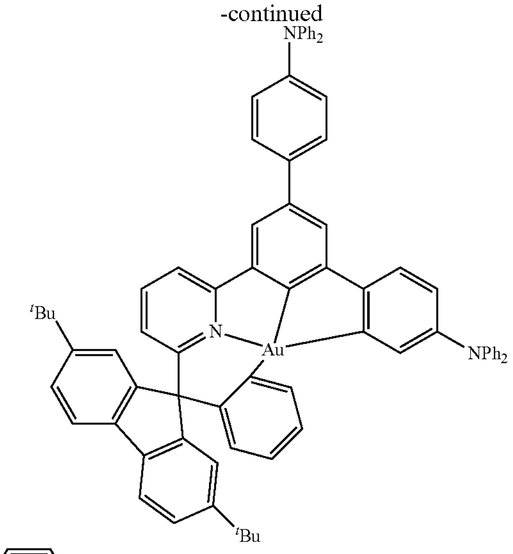

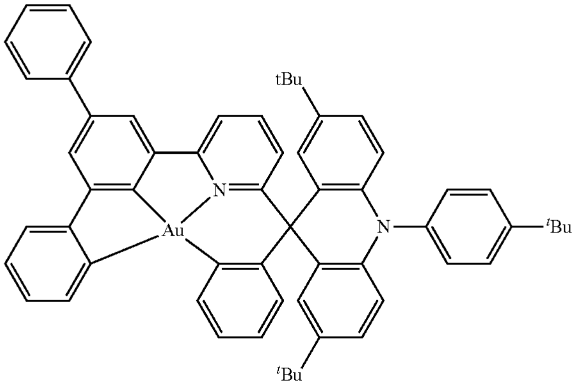

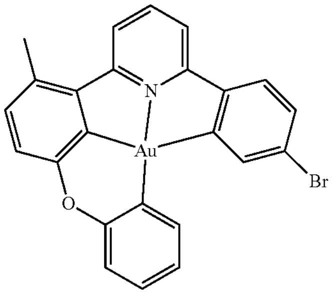

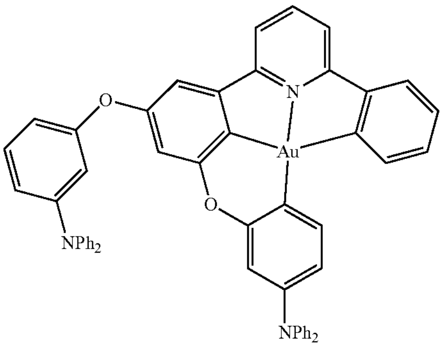

-continued

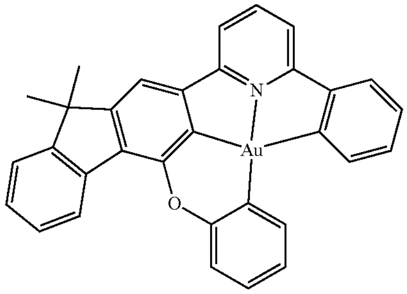

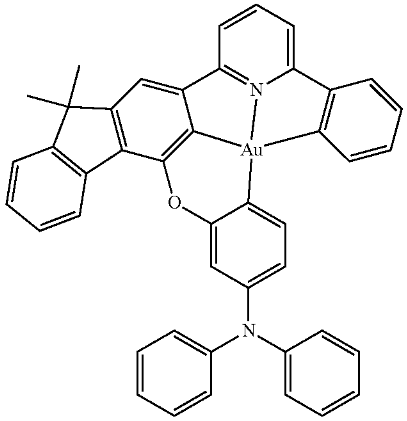

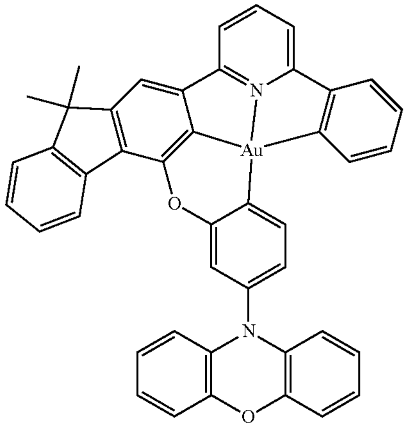

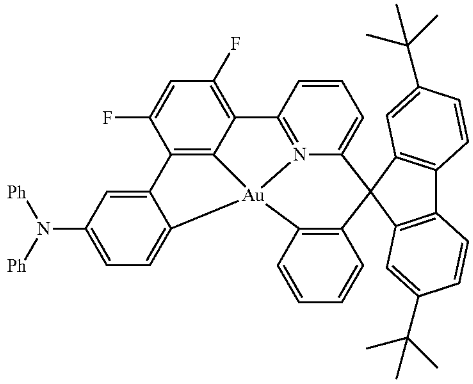

In some embodiments, the gold(III) complex supported by tetrdentate ligand exhibits a photoluminescence quantum yield of more than 15% in at least one medium, wherein the medium is conventional organic solvents or transparent polymer dispersion substrates which can dissolve gold(III) complex; the conventional organic solvents are such as:

toluene, dichloromethane; transparent polymer dispersion substrates such as: MCP film, PMMA film, etc.

In some embodiments, the gold(III) complex supported by tetradentate ligand has an intra-ligand charge transfer (ILCT) luminescence characteristic that is perturbed by a metal or has a TADF (thermally activated delayed fluorescence) luminescence characteristic.

In some embodiments, the gold(III) complex supported by tetradentate ligand, which is used as a light-emitting material or dopant in a light-emitting device, shows a maximum external quantum efficiency EQE of 15% or more in the fabricated device.

In some embodiments, the gold(III) complex supported by tetradentate ligand, which is used as a light-emitting material or dopant in an OLED light-emitting device, has a low device efficiency roll-off.

In an embodiment, when the light-emitting brightness reaches 1000 cd $m^{-2}$, the efficiency roll-off of the device fabricated with the provided gold(III) complex supported by tetradentate ligand is lower than 15%. In one embodiment, when the light-emitting brightness reaches 1000 cd $m^{-2}$, the efficiency roll-off of the device fabricated with the provided gold(III) complex supported by tetradentate ligand is lower than 11%. In other embodiments, when the device's brightness reaches 1000 cd $m^{-2}$, the maximum external quantum efficiency of the device fabricated with the provided gold (III) complex as the dopant is greater than or equal to 10%.

In other embodiments, the gold(III) complex supported by tetradentate ligand exhibits above 40% photoluminescence quantum efficiency in at least one medium, and at the same time has above $5\times10^3$ $s^{-1}$ radiative decay rate constant.

In other embodiments, the gold(III) complex supported by tetradentate ligand independently exhibits above 25% photoluminescence quantum efficiency and above $5\times10^3$ $s^{-1}$ radiative decay rate constant in at least one organic solvents and at least one transparent polymer dispersed substrate films respectively.

In other embodiments, the gold(III) complex supported by tetradentate ligand independently exhibits above 25% photoluminescence quantum efficiency and at the same time exhibits above $5\times10^4$ $s^{-1}$ radiative decay rate constant in at least one organic solvent medium and at least one transparent polymer dispersed substrate films respectively.

In other embodiments, the gold(III) complex supported by tetradentate ligand exhibits above 15% maximum external quantum efficiency as a light-emitting material or dopant in a light-emitting device.

The invention also provides a method for preparing a type of gold(III) complex supported by tetradentate ligand, comprising:

reacting the tridentate gold(III) complex of formula (0-II) in a first solvent under microwave conditions to obtain a complex of formula (0-I);

or performing the following steps successively:

a) reacting an organic compound of formula (0-III) with gold(III) reagent in a second solvent containing acid under microwave conditions to obtain an intermediate, b) transferring the reaction product of step a) (i.e., intermediate) into a first solvent to react under microwave conditions to obtain the gold(III) complex of formula (0-I)

0-I

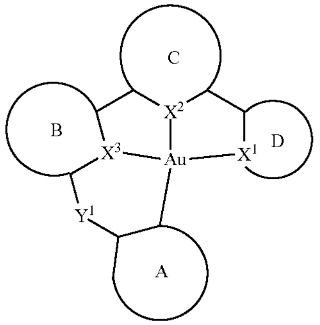

0-II

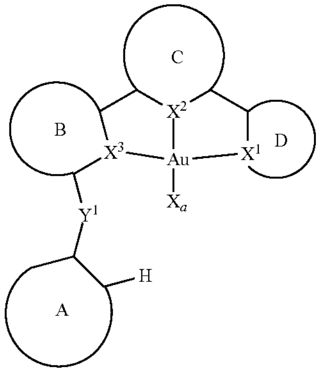

0-III

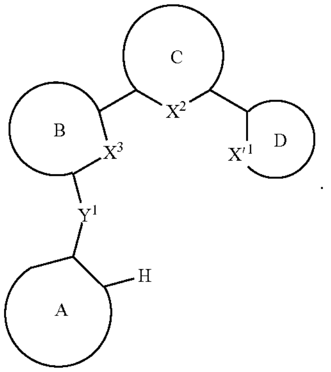

wherein $X^1$, $X^2$, $X^3$ are independently selected from carbon and nitrogen, and only one of $X^1$, $X^2$, $X^3$ is nitrogen;

$X'^1$, $X'^2$, $X'^3$ are independently selected from CH and nitrogen, and only one of $X'^1$, $X'^2$, $X'^3$ is nitrogen;

$Y^1$ is O, $CR^{15}R^{16}$ or S;

$X_a$ is F, Cl, Br, I, OTf, $OCOCF_3$, OAc, OH, or $NTf_2$;

$R^{15}$ and $R^{16}$ are independently selected from hydrogen, deuterium, halogen, nitro, cyano, isocyano, trifluoromethyl, or independently selected from the following substituted or unsubstituted groups: alkyl, cycloalkyl, alkenyl, cycloalkenyl, alkynyl, aryl, aralkyl, heteroalkyl, heterocycloalkyl, heterocycloalkenyl, heteroaryl, heteroaralkyl, alkoxy, aryloxy, heteroaryloxy, $NR^{17}R^{18}$, acyl, acylamino, acyloxy, ester group, acylamido, sulfonylamino, sulfonyloxy, sulfonato, sulfonylamido and trialkylsilyl; wherein $R^{17}$ and $R^{18}$ are independently selected from the following substituted or unsubstituted groups: alkyl, cycloalkyl, alkenyl, cycloalkenyl, alkynyl, aryl, aralkyl, heteroalkyl, heterocycloalkyl, heterocycloalkenyl, heteroaryl, heteroaralkyl, alkoxy, aryloxy and heteroaryloxy;

or any two adjacent or proximal groups in $R^1$-$R^{18}$ together with the carbon atoms they attached form a 5-15 membered ring; wherein the 5-15 membered ring is a 5-15 membered heteroaryl group, a 5-15 membered aryl group, a 5-15 membered heterocyclic group, a 5-15 membered cycloalkyl group or a 5-15 membered unsaturated cycloalkyl group; wherein the heteroatoms in the heteroaryl group and heterocyclic group are independently selected from nitrogen, sulfur and oxygen.

A, B, C, and D are independently substituted or unsubstituted aromatic rings, substituted or unsubstituted heteroaromatic rings, and when the rings of A, B, C, and D contain multiple substituents, any two adjacent or proximal substituents can be linked to form a 5-15 ring; preferably A, B, C, and D are independently substituted or unsubstituted $C_{6-40}$ aromatic ring, substituted or unsubstituted $C_{5-40}$ heteroaromatic ring.

In some embodiments, when the rings of A, B, C, and D contain substituents, these substituents are selected from: deuterium, halogen, nitro, nitroso, cyano, isocyano, trifluoromethyl, or selected from the following substituted or unsubstituted groups: alkyl, heteroalkyl, cycloalkyl, alkenyl, cycloalkenyl, alkynyl, aryl, heterocyclyl, alkanoyl, aroyl, alkoxy, aryloxy, $NR^{17}R^{18}$, ester group, acylamino, sulfonamide, alkoxycarbonyl, aryloxycarbonyl, alkylsulfonyl or arylsulfonyl; alkylsilyl, arylsilyl, haloalkyl, arylalkyl.

In some embodiments, the production method specifically comprises: preforming an intramolecular Au—C(gold-carbon bond) coupling reaction based on C—H (carbon-hydrogen bond) activation of a gold(III) complex of formula (0-II) in a first solvent under microwave conditions, wherein the intramolecular Au—C coupling reaction based on C—H activation refers to an intramolecular Au—C coupling reaction comprising activation and cleavage of C—H bond before the reaction or during the reaction, In some embodiments, the structure of formula (II) is prepared according to the following methods described in the literature:

reacting the organic compound of formula (0-III) with a Hg (II) reagent and a gold(III) reagent successively to obtain a gold(III) complex of formula (0-II); wherein this reaction does not require microwave.

In some other embodiments, the production method specifically comprises: a) performing an intermolecular coordination reaction based on C—H activation of an organic compound of formula (0-II) with gold(III) reagent in a second solvent containing acid under microwave conditions to obtain an intermolecular coordination reaction product; b) performing one or more intramolecular Au—C coupling reaction based on C—H activation of the intermolecular coordination reaction product of step a) in a first solvent under microwave conditions, wherein the intermolecular coordination reaction based on C—H activation comprises intermolecular Au—N coordination reaction and intermolecular Au—C coupling reaction comprising activation and cleavage of C—H bond.

The invention also provides a method for preparing a gold(III) complex, comprising:

reacting the tridentate gold(III) complex of formula (II) with a mixture of a first solvent under microwave conditions to obtain a complex of formula (I);

or performing the following steps successively;

a) reacting an organic compound of formula (III) with a gold(III) reagent in a second solvent containing acid under microwave conditions to obtain an intermediate;

b) transferring the intermediate of step a) into a first solvent to react under microwave conditions to obtain the gold(III) complex supported by tetradentate ligand of formula (I);

Formula (II)

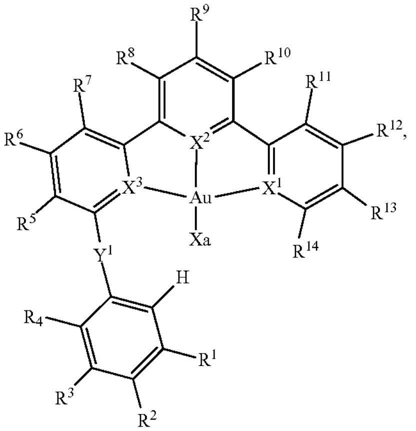

Formula (I)

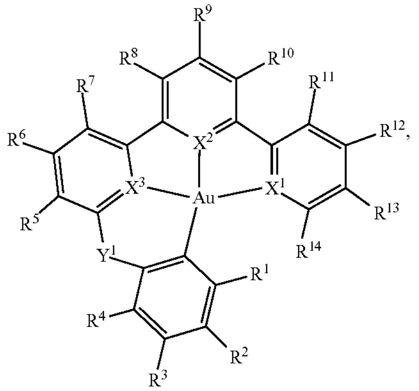

Formula (III)

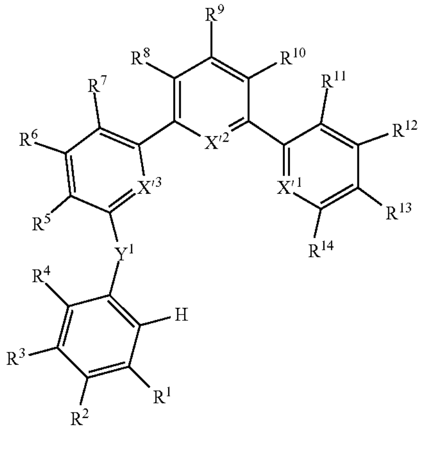

wherein $X^1$, $X^2$, $X^3$ are independently selected from carbon and nitrogen, and only one of $X^1$, $X^2$, $X^3$ is nitrogen;

$X'^1$, $X'^2$, $X'^3$ are independently selected from CH and nitrogen, and only one of $X'^1$, $X'^2$, $X'^3$ is nitrogen;

$Y^1$ is O, $CR^{15}R^{16}$ or S;

$X_a$ is F, Cl, Br, I, OTf, $OCOCF_3$, OAc, OH, or $NTf_2$;

$R^1$-$R^{16}$ are independently selected from hydrogen, deuterium, halogen, nitro, cyano, isocyano, trifluoromethyl, or independently selected from the following substituted or unsubstituted groups: alkyl, cycloalkyl, alkenyl, cycloalkenyl, alkynyl, aryl, aralkyl, heteroalkyl, heterocycloalkyl, heterocycloalkenyl, heteroaryl, heteroaralkyl, alkoxy, aryloxy, heteroaryloxy, $NR^{17}R^{18}$, acyl, acylamino, acyloxy, ester group, acylamido, sulfonylamino, sulfonyloxy, sulfonato, sulfonylamido and trialkylsilyl; wherein $R^{17}$ and $R^{18}$ are independently selected from the following substituted or unsubstituted groups: alkyl, cycloalkyl, alkenyl, cycloalkenyl, alkynyl, aryl, aralkyl, heteroalkyl, heterocycloalkyl, heterocycloalkenyl, heteroaryl, heteroaralkyl, alkoxy, aryloxy and heteroaryloxy;

or any two adjacent or proximal groups in $R^1$-$R^{18}$ together with the carbon atoms they attached form a 5-15 membered ring.

In the above preparation method provided by the present invention, the selection of each substituent is the same as the selection of the substituent in the aforementioned definition of ligand. In some embodiments, $X_a$ is Br, Cl, OH, $OCOCF_3$ or OAc.

In some embodiments, the first solvent is water or a mixed solvent of water and one or more organic solvents selected from ACN, DMF, DMA, THF and 1,4-dioxane in any ratio, preferably a mixed solvent of water and ACN in a volume ratio of water:ACN=3:1-1:3, and more preferably in a volume ratio of $H_2O$:ACN=1.5:1-1:1.5.

In some embodiments, the reaction temperature of the reaction performed in the first solvent (referred to as intramolecular Au—C coupling reaction in this application) is 100-170° C.

In some embodiments, the reaction time of the intramolecular Au—C coupling reaction is 10-100 min.

In some embodiments, the reaction temperature of the intramolecular Au—C coupling reaction using formula (II) as the starting material is 110-130° C., and the reaction time is 10-40 min, and preferably 20-30 min.

In some embodiments, the reaction temperature of the intramolecular Au—C coupling reaction (i.e., the reaction of step b)) using the reaction product of step a) (i.e., intermediate) as the starting material is 120-170° C., preferably 130-150° C., the reaction time is 50-100 min, preferably 70-90 min.

In some embodiments, the molar ratio of the tridentate gold(III) complex (formula II) or intermediate to a first solvent is 10%-0.1%, preferably 2%-0.5%.

In some embodiments, a step of post-treatment and purification is further included after the reaction; further, the step of post-treatment and purification comprises extraction and column purification using organic phase/aqueous phase.

In some embodiments, the gold(III) reagent is selected from $Au(OAc)_3$, $AuCl_3$, $Au(OTf)_3$, $HAuCl_4$, $KAuCl_4$, $NaAuCl_4$, $KAuBr_4$ and $NaAuBr_4$, preferably $Au(OAc)_3$.

In some embodiments, the acid in the second solvent containing acid is AcOH, TFA, TfOH, TsOH, HF, HCl, HBr.

In some embodiments, the second solvent is a mixed solvent of one or more of water, conventional alcohol solvents, acetonitrile, DMF, DMSO, DMA, THF and 1,4-dioxane in any ratio, wherein the conventional alcohol solvents include but are not limited to methanol, ethanol, and isopropanol.

In some embodiments, the second solvent is a mixed solvent of TFA/water, TFA/ethanol, TFA/methanol, AcOH/water, HCl/water, TFA/ethanol/water, TFA/methanol/water, TFA/ACN/water.

In some embodiments, the volume ratio of the acid in the second solvent to the rest solvents is 10:1-1:10; preferably 2:1-1:2.

In some embodiments, the reaction temperature of step a) is 110-170° C., preferably 120-140° C.

In some embodiments, the reaction time of step a) is 20-50 min.

In some embodiments, after the reaction in step a) is completed, extraction and concentration with an organic solvent are performed to obtain an intermediate; it can be directly used in the preparation reaction in step b) without further purification.

In some embodiments, the reaction of step a) further includes adding an alkali metal salt of trifluoroacetic acid, such as $CF_3COONa$, $CF_3COOK$, to the reaction system. Preferably, the addition amount of the alkali metal salt of trifluoroacetic acid is 3-5 times of the gold(III) reagent in the system; preferably, when the alkali metal salt of trifluoroacetic acid is added, preferably the reaction system uses $AcOH/H_2O$ with a volume ratio of 2:1-1:2 as the second solvent.

In some embodiments, when at least one of $R^1$-$R^{14}$ is halogen, the preparation method of the gold(III) complex supported by tetradentate ligand further includes a step of converting R group that is halogen to a non-halogen group, for example, the non-halogen group can be $NR^{17}R^{18}$.

The gold(III) complex of formula (II) of the present invention can be obtained from the organic compound of formula (III) through conventional or documented multi-step reactions. For example, in one embodiment, the multi-step reaction successively include: the organic compound of formula (III) undergoes CH activation reaction with the participation of Hg(II) reagent to obtain ligand-Hg(II) compound, and then Au(III) and Hg(II) undergo metal displacement reaction with the participation of gold(III) reagent to obtain a gold(III) complex with tridentate ligand, wherein the Hg(II) reagent includes but not limited to $HgCl_2$, $Hg(OAc)_2$, and the gold(III) reagent includes but not limited to $KAuCl_4$, $NaAuCl_4$, $HAuCl_4$, $Au(OAc)_3$, $AuCl_3$, $KAuBr_4$, $NaAuBr_4$, $Au(OTf)_3$. In one embodiment, the multi-step reaction further includes: after the metal replacement reaction, $HX_a$ or a salt form of $X_a$ (for example, when $X_a$ is $CF_3COO$, the silver salt of $X_a$ is $CF_3COOAg$) participates in a displacement reaction of $X_a$.

In order to achieve the purpose of the present invention, the present invention also provides a gold(III) complex with tridentate ligand represented by formula (II) which can be used to prepare the structure represented by formula (I).

Formula (II)

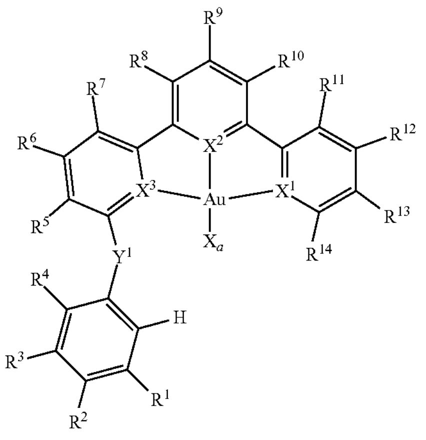

wherein Xa is F, Cl, Br, I, OTf, $OCOCF_3$, OAc, OH, $NTf_2$;

$X^1$-$X^3$, $Y^1$, $R^1$-$R^{14}$ are defined as described above.

In order to achieve the purpose of the present invention, the present invention also provides an organic compound represented by formula (III) that can be used to prepare the structure of formula (I), Formula (III)

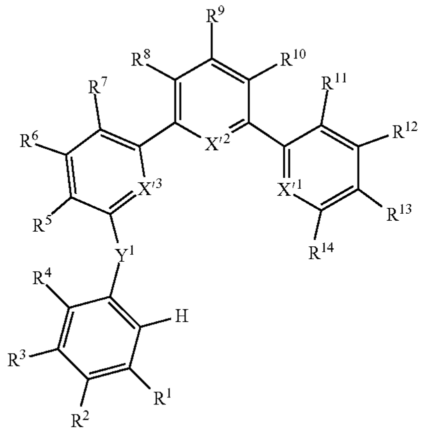

wherein optionally in $X'^1$-$X'^3$: one X' is N atom, two X's are CH; $Y^1$, $R^1$-$R^{14}$ are defined as described above.

In order to achieve the objective of the present invention, the present invention also provides use of the gold(III) complex of the present invention in the preparation of light-emitting devices.

In order to achieve the objective of the present invention, the present invention also provides a light-emitting device comprising a light-emitting layer, wherein the light-emitting layer is the gold(III) complex according to the present invention.

In order to achieve the purpose of the present invention, the present invention provides a light-emitting device, comprising a type of gold(III) complex supported by tetradentate ligand represented by formula I as defined above.

In some embodiments, the light-emitting device includes: a substrate, an anode layer, a hole injection layer, a hole transport layer (HTL), an emitting layer (EML), and an electron transport layer (ETL), an electron injection layer and a cathode layer, the gold(III) complex supported by tetradentate ligand is located in the emitting layer EML; specifically, the structure of the light-emitting device is shown in FIG. 1. FIG. 1 shows a structural diagram of a light-emitting device according to an embodiment of the present invention.

In some embodiments, the light-emitting device exhibits a maximum external quantum efficiency of 13-25%; preferably, in some embodiments, the light-emitting device exhibits a maximum external quantum efficiency of 20-25%; preferably, in some embodiments, the light-emitting device exhibits an external quantum efficiency of greater than 20%, including but not limited to greater than 21%, 22%, 23%, 24%, 25%.

In some embodiments, the light-emitting device OLED has a low efficiency roll-off; in one embodiment, when the light-emitting brightness reaches 1000 cd $m^{-2}$, the efficiency roll-off is lower than 12%. In another embodiment, when the light-emitting brightness reaches 1000 cd $m^{-2}$, the efficiency is lower than 11%. In other embodiments, when the light-emitting brightness reaches 1000 cd $m^{-2}$, the OLED device prepared using the provided gold(III) complex supported by tetradentate ligand as a dopant can maintain an external quantum efficiency of 10% above.

In some embodiments, a hole-blocking layer is further included between the light-emitting layer and the electron transport layer;

In some embodiments, the light-emitting layer includes one or more layers, and the gold(III) complex supported by tetradentate ligand provided in the present invention is located in at least one of the light-emitting layers.

Specifically, the light-emitting layer can be prepared by vacuum evaporation, solution method or inkjet printing method to form a film containing the gold(III) complex supported by tetradentate ligand.

The Technical Solution Provided in the Present Invention at Least Satisfies at Least One of the Following The tetradentate ligand provided in the present invention is coordinated with gold(III) to form a gold(III) complex supported by tetradentate ligand. The gold(III) complex is used as a light-emitting material or dopant to produce OLED light-emitting devices, showing high light-emitting brightness and electroluminescence efficiency and external quantum efficiency, the measured maximum current efficiency is up to 78 cd $A^{-1}$, the maximum external quantum efficiency EQE is generally greater than 15%, up to 25%, and the EQE generally remains above 11% at a brightness value of 1000 cd $m^{-2}$, up to 22%, and the efficiency roll-off is reduced to 11%, and it is a new type of organic light-emitting material potentially used in OLED.

In addition, this kind of complexes with the same core structure has good universality in light-emitting properties. By adjusting the type and position of the substituents on the core ligand structure, and combining with the use of dispersion medium with different polarities, the emitting color of the complexes can be adjusted.

The present invention provides a preparation method of a new type of gold(III) complex supported by tetradentate ligand. The method utilizes microwave to promote C—H activation and intramolecular Au—C coupling reaction, and when necessary, combining with microwave-promoted intermolecular coordination coupling, can obtain the target product with a 5-5-6 rigid ring structure in a moderate to excellent yield. The gold(III) complex supported by tetradentate ligand provided in the present invention and other gold(III) complexes with similar framework structures all can be prepared by this method, and this method simplifies the synthetic method of the gold(III) complex supported by tetradentate ligand, and has simple operation and satisfactory yield. More importantly, the reaction is controllable and stable, and has a good reproducibility, and is suitable for industrial application In other embodiments, the gold(III) complex supported by tetradentate ligand exhibits above 40% of photoluminescence quantum efficiency in at least one of the medium, and at the same time has above $5\times10^3$ $s^{-1}$ of radiative decay rate constant.

In other embodiments, the gold(III) complex supported by tetradentate ligand independently exhibits above 25% of photoluminescence quantum yield and above $5\times10^3$ $s^{-1}$ of radiative decay rate constant in at least one organic solvent and at least one transparent polymer dispersed substrate films respectively.

In other embodiments, the gold(III) complex supported by tetradentate ligand independently exhibits above 25% of photoluminescence quantum efficiency and at the same time exhibits above $5\times10^4$ $s^{-1}$ of radiative decay rate constant in at least one organic solvent medium and at least one transparent polymer dispersed substrate films respectively.

In other embodiments, the gold(III) complex supported by tetradentate ligand exhibits above 15% of maximum external quantum efficiency as a light-emitting material or dopant in a light-emitting device.

Definition

To facilitate the understanding of the present invention, unless otherwise specified, some terms, abbreviations or other abbreviated words used herein are defined as follows.

"Alkyl", when used alone or in combination with other groups, represents a saturated linear or branched group containing 1-12 carbon atoms, such as methyl, ethyl, n-propyl, isopropyl, n-butyl, sec-butyl, tert-butyl, pentyl, n-pentyl, n-hexyl, isohexyl, n-heptyl, n-octyl, n-decyl, etc.

"Alkenyl", when used alone or in combination with other groups, represents a linear or branched group containing 2-12 carbon atoms and an unsaturated double bond, including linear or branched diene, for example: vinyl, allyl, 1-propenyl, 1-butenyl, 2-butenyl, 3-butenyl, 1-pentenyl, 2-pentenyl, 3-pentenyl, 4-pentenyl, 1-hexenyl, 2-hexenyl, 3-hexenyl, 4-hexenyl, 5-hexenyl, 1-heptenyl, 2-heptenyl, 3-heptenyl, 4-heptenyl, 5-heptenyl, 6-heptenyl, 1,3-butadiene, 1,3-pentadiene, 2-methyl-1,3-butadiene, etc.

"Alkynyl", when used alone or in combination with other groups, represents ethynyl, 1-propynyl, 2-propynyl, 1-butynyl, 2-butynyl, 3-butynyl, 1-pentynyl, 2-pentynyl, 3-pentynyl, 4-pentynyl, 1-hexynyl, 2-hexynyl, 3-hexynyl, 4-hexynyl, 5-hexynyl, linear or branched diynes or triynes, such as 1,3-butadiyne, etc., which may be further substituted with aryl.

"Cycloalkyl", when used alone or in combination with other groups, represents a 3-7 membered carbocyclic group, such as cyclopropyl, cyclobutyl, cyclopentyl, cyclohexyl, etc.

"Cycloalkenyl", when used alone or in combination with other groups, represents a 3-7 membered cyclic group containing one or more than one unsaturated double bond, for example: cycloalkyl, 1-cyclobutenyl, 2-cyclobutenyl, 1-cyclopentenyl, 2-cyclopentenyl, 3-cyclopentenyl, 1,3-cyclopentadienyl, 1-cyclohexenyl, 2-cyclohexenyl, 3-cyclohexenyl, 1,3-cyclohexadienyl, cycloheptenyl, cycloheptadienyl, cycloheptatrienyl, etc.

"Aryl" or "aromatic", when used alone or in combination with other groups, refers to an optionally substituted aromatic carbocyclic group containing 1, 2 or 3 rings, which are connected by a bond or in a fused way, for example: phenyl, biphenyl, naphthyl, tetrahydronaphthalene, dihydroindene, which can be further substituted by other aryl or aryl-containing substituents.

"Heterocyclic group" or "heterocyclic ring", when used alone or in combination with other groups, represents an optionally substituted a 3-7 membered cyclic group containing more than one heteroatom, which is selected from N, S and O. This group includes saturated, partially saturated and aromatic unsaturated heterocyclic groups. Saturated heterocyclic groups are equivalent to the term "heterocycloalkyl" herein, when used alone or in combination with other groups, include the following examples: aziridinyl, azetidinyl, tetrahydrofuranyl, tetrahydrothienyl, oxazolidinyl, thiazolidinyl, benzothiazolyl, pyrrolidinyl, imidazolidinyl, piperidinyl, piperazinyl, thiazinyl, 2-oxopiperidinyl, 4-oxopiperidinyl, 2-oxopiperazinyl, 3-oxopiperazinyl, morpholinyl, thiomorpholinyl, 2-oxomorpholinyl, azepinyl, diazapinyl, oxapinyl, thiapinyl, etc., 1-3-oxanyl, etc. The partially saturated heterocyclic group is equivalent to the term "heterocyclenyl" herein, when used alone or in combination with other groups, includes the following examples: dihydrothienyl, dihydropyranyl, dihydrofuranyl, dihydrothiazolyl, etc. The aromatic unsaturated heterocyclic group is equivalent to the term "heteroaryl" or "heteroaromatic" herein, when used alone or in combination with other groups, can be a monocyclic ring, and can also be a bonded or fused polycyclic ring, which includes the following examples: thiazolyl, oxazolyl, imidazolyl, isoxazolyl, pyrrolyl, pyrazolyl, triazolyl, tetrazolyl, thienyl, furyl, pyridyl, pyrimidinyl, pyrazinyl, pyridazinyl, indolyl, quinolinyl, isoquinolinyl, quinoxalinyl, bipyridyl, acridinyl, phenanthridinyl, phenanthrolinyl, quinazolonyl, benzimidazolyl, benzofuranyl, benzothienyl, benzothiazolyl, benzoxazolyl, benzisoxazolyl, bipyridyl, biphenylpyridyl.

"Heteroalkyl", when used alone or in combination with other groups, represents a linear or branched alkyl containing more than one heteroatom, which is selected from N, S and O.

Examples of it include: methoxymethyl, methoxyethyl, 2-methoxypropyl, dimethylaminoethyl, 2-methylthiobutyl, etc.

Herein, unless otherwise specified, "heteroalkyl" and "heterocyclic group" contain one or more heteroatoms, preferably 1-6, more preferably 1, 2, or 3. When the groups contain multiple heteroatoms, the multiple heteroatoms may be the same or different.

"Halogen", when used alone or in combination with other groups, such as forming "haloalkyl", "perhaloalkyl", etc., refers to fluorine, chlorine, bromine or iodine. The term "haloalkyl" represents alkyl as defined above substituted by one or more halogens, including perhaloalkyl, such as fluoromethyl, difluoromethyl, trifluoromethyl, fluoroethyl, difluoroethyl, trifluoromethyl, etc. The term "haloalkoxy" represents haloalkyl as defined above, which is directly connected to an oxygen atom, such as fluoromethoxy, chloromethoxy, fluoroethoxy, chloroethoxy, etc.

"Acyl", when used alone or in combination with other groups, includes the following forms: —C(=O)H, —C(=O)-alkyl, —C(=O)-aryl, —C(=O)-aralkyl and —C(=O)-heteroaryl, such as formyl, acetyl, propionyl, butyryl, isobutyryl, valeryl, hexanoyl, heptanoyl, benzoyl, etc. The non-C(=O)— part in the acyl may be substituted with optional substituents, including but not limited to halogen, lower alkyl (C1-C4 alkyl), aryl or aryl-containing substituents.

"Ester" is a type of carboxylic acid derivative, when used alone or in combination with other groups, it represents the —COO— group, including: alkoxycarbonyl, such as methoxycarbonyl, ethoxycarbonyl, etc.; aryloxycarbonyl, such as phenoxycarbonyl, naphthoxycarbonyl, etc.; aralkyloxycarbonyl, such as benzyloxycarbonyl, phenethoxycarbonyl, naphthylmethoxycarbonyl; heterocyclyloxycarbonyl, wherein heterocyclyl is defined as above; the non-COO— part of the ester group may be further substituted with optional substituents.

"Acyloxy", when used alone or in combination with other groups, means that acyl as defined above is directly connected to oxygen atom, for example: —OC(=O)-alkyl, —OC(=O)-aryl, —OC(=O)-aralkyl, —OC(=O)-aralkyl, specifically, such as acetoxy, propionyloxy, butyryloxy, isobutyryloxy, benzoyloxy, etc.

"Mono-substituted amino", when used alone or in combination with other groups, represents substituted or unsubstituted C1-C6 alkyl, amino substituted with aryl or aralkyl, for example, methylamido, ethylamido, n-propylamido, n-butylamido, n-pentylamido, anilino, etc., which can be further substituted.

"Disubstituted amino", when used alone or in combination with other groups, represents amino substituted by two groups that may be the same or different, and the substituents are selected from substituted or unsubstituted: (C1-C6) alkane, aryl or arylalkyl, such as dimethylamino, methylethylamino, diethylamino, phenylmethylamino, diphenylamino, etc., which may be further substituted.

"Acylamido", when used alone or in combination with other groups, represents aminocarbonyl with the general formula —C(═O)—N(group)2, mono- or di-substituted aminoacyl as defined above, for example: N-methylacylamido, N,N-dimethylamide, N-ethylamide, N-ethyl-N-phenylamide, N,N-diphenylamide.

"Acylamino", when used alone or in combination with other groups, means that acyl as defined above is connected to amino. For example, it can be $CH_3CONH$—, $C_2H_5CONH$—, $C_3H_7CONH$—, $C_4H_9CONH$—, $C_6H_5CONH$—, etc., which may be substituted.

"MW" and "microwave" refer to the microwave technology used in the experiment. The type of the microwave reactor used in the experiment is "CEM Discover SP".

As used herein, a compound or chemical moiety being described with "substituted" means that at least one hydrogen atom of the compound or chemical moiety is replaced by a second chemical moiety. Non-limiting examples of substituents are those present in the exemplary compounds and embodiments as disclosed herein, deuterium, fluorine, chlorine, bromine, iodine; hydroxyl, oxo; amino (primary, secondary, tertiary), imino, nitro, nitroso; cyano, isocyano, alkyl, heteroalkyl, cycloalkyl, heterocycloalkyl, aryl, heteroaryl, alkenyl, cycloalkenyl, alkynyl; lower alkoxy, aryloxy; mercapto, thioether; phosphine; carboxyl, sulfonato, phosphono; acyl, thiocarbonyl, sulfonyl; amide, sulfonamide; ketone; aldehyde; ester, sulfonate; haloalkyl (for example, difluoromethyl, trifluoromethyl); monocyclic or fused or non-fused polycyclic carbocycloalkyl (for example, cyclopropyl, cyclobutyl, cyclopentyl or cyclohexyl); or monocyclic or fused or non-fused polycyclic heterocycloalkyl (for example, pyrrolidinyl, piperidinyl, piperazinyl, morpholinyl or thiazinyl); or a monocyclic or fused or non-fused polycyclic carbocyclic or heterocyclic aryl (e.g., phenyl, naphthyl, thiazolyl, oxazolyl, imidazolyl, isoxazolyl, pyrrolyl, pyrazolyl, triazolyl, tetrazolyl, thienyl, furyl, pyridyl, pyrimidinyl, pyrazinyl, pyridazinyl, indolyl, quinolinyl, isoquinolinyl, quinoxalinyl, bipyridyl, acridinyl, phenanthridinyl, phenanthrolinyl, quinazolonyl, benzimidazolyl, benzofuranyl, benzothienyl, benzothiazolyl, benzoxazolyl, benzisoxazolyl); or aryl-lower alkyl; —CHO; —CO (alkyl); —CO (aryl); —$CO_2$ (alkyl); —$CO_2$ (aryl); —$CONH_2$; —$SO_2NH_2$; —$OCH_2CONH_2$; —$OCHF_2$; —$OCF_3$; —$CF_3$; —$NH_2$; —NH(alkyl); —N$(alkyl)_2$; —NH(aryl); —N(alkylxaryl); —N$(aryl)_2$. In addition, when the substituent is oxygen, it means that two hydrogen atoms on the same or different carbons are substituted by the same oxygen atom to form a carbonyl or cyclic ether, such as ketone carbonyl, aldehyde carbonyl, ester carbonyl, amide carbonyl, ethylene oxide, etc. In addition, these parts can also be optionally substituted by fused ring structures or bridges (for example, —$OCH_2O$—). In the present invention, they can preferably be substituted by one, two, three, four, five or six substituents which are independently selected from halogen, alkyl, alkoxy, aryl, aryloxy, and —N(aryl)2, or substituted by perhalogen, such as trifluoromethyl, perfluorophenyl. When the substituents contain hydrogen, these substituents may be optionally further substituted by substituents selected from such groups.

As used herein, a compound or chemical moiety being described with "independently" should be understood that the multiple compounds or chemical moieties defined before the term should all mutually without interference and equally enjoy the range of options provided thereafter, and should not be understood to limit any spatial connection relationship between the various groups; the spatial connection relationship is expressed by terms such as "mutually independent" and "connected" herein; it should be distinguished; moreover, in this disclosure, "be independently" and "be respectively independently" and "be respectively independently selected from" have basically the same meaning.

As used herein, the description that two "adjacent" chemical moieties being connected to form a ring structure should be understood to include two situations where two chemical moieties are adjacent in position and adjacent in space. Being adjacent in position exemplarily includes the situation where two groups on the same aromatic ring are in the ortho position, and being adjacent in space exemplarily includes the situation where two groups are respectively located on different connected or condensed aromatic rings but can be close to each other in space.

In this application, "singlet state" is sometimes referred to as the "single state", and correspondingly, "triplet state" is sometimes referred to as the "triple state".

In order to facilitate understanding and avoid confusion, in this application, "Structure of Formula (III)" represents the structural formula numbered m, and "Gold(III)" or "Au(III)" both represent metallic gold with a valence state of +3.

Unless otherwise specified, the "OLED" in this application refers to organic light-emitting diodes. Therefore, in this application, "OLED" is sometimes referred to as "OLED apparatus" or "OLED light-emitting apparatus" or "OLED device" or "OLED light emitting device".

In addition, in order to make the present invention clear and easy to understand, the English names corresponding to the chemical abbreviations involved in the specification or examples is provided, which are specifically as follows:

ACN represents acetonitrile; DMF represents N,N-dimethylformamide; DMA represents N,N-dimethylacetamide; THF represents tetrahydrofuran; DMSO represents N,N-dimethylsulfoxide; TFA represents trifluoroacetic acid; TfOH represents trifluoromethanesulfonic acid; TsOH represents p-toluenesulfonic acid; AcOH represents ethanoic acid, also called acetic acid; $Pd(dba)_2$ represents palladium (0) bis(dibenzylideneacetone); KOAc represents potassium acetate; $Pd(dppf)Cl_2$ represents [1,1'-bis(diphenylphosphino)ferrocene] palladium(II) dichloride; $Pd(PPh_3)_4$ represents tetrakis(triphenylphosphine) palladium(0); Binap represents (±)-2,2'-Bis-(diphenylphosphino)-1,1'-binaphthyl; KOtBu represents potassium tert-butoxide; TCTA represents 4,4',4"-tris(carbazol-9-yl) triphenylamine; TAPC represents 4,4'-cyclohexylbis(N,N-bis(4-methylphenyl)aniline); TPBi represents 1,3,5-tris(1-phenyl-1H-benzimidazol-2-yl)benzene; TmPyPb represents 3,3'-[5'-[3-(3-pyridyl)phenyl][1,1':3',1"-terphenyl]-3,3"-diyl]bipyridine; HAT-CN represents 2,3,6,7,10,11-hexacyano-1,4,5,8,9,12-hexaazatriphenylene; T2T represents 2,4,6-Tris(1,1'-biphenyl)-1,3,5-triazine; ITO represents indium tin oxide.

In order to further illustrate the present invention, the complexes provided in the present invention are described in detail below in conjunction with examples, but they should not be understood as limiting the protection scope of the present invention. Unless otherwise specified, all percentages involved in the examples are by weight and all solvent mixture ratios are by volume.

Preparation of Ligand Compounds and their Precursors

Example 1—Preparation of L1

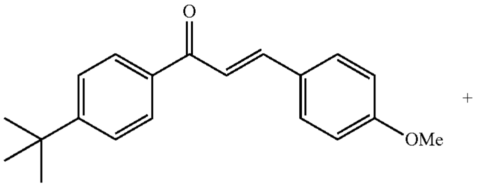

precursor 111

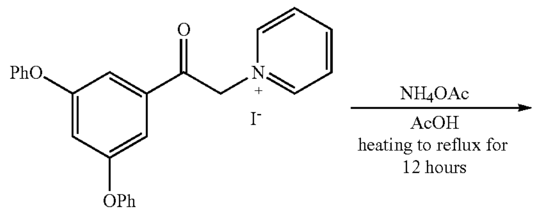

precursor 112

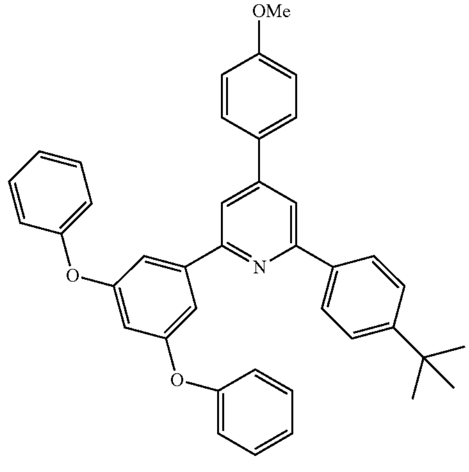

L1

Precursor 111 (2.65 g, 9.00 mmol), precursor 112 (5.04 g, 9.90 mmol), excess ammonium acetate $NH_4OAc$ and AcOH were added to a reaction flask. The resulting mixture was refluxed for 12 hours and then cooled to room temperature. The crude product was extracted with dichloromethane. The organic layer was washed with water for several times to remove excess acid. The collected organic layer was dried with anhydrous magnesium sulfate. After evaporation to dryness, the crude product was purified by column chromatography on silica gel using DCM/hexane (v:v=1:6) as eluents and 2.86 g of pure L1 was obtained with a yield of 55%.

$^1$H NMR (500 MHz, $CD_2Cl_2$): δ 8.06 (d, J=8.5 Hz, 2H), 7.89 (d, J=1.5 Hz, 1H), 7.78 (d, J=1.5 Hz, 1H), 7.71 (d, J=8.5 Hz, 2H), 7.65 (d, J=2.5 Hz, 2H), 7.52 (d, J=8.5 Hz, 2H), 7.37 (t, J=8.0 Hz, 4H), 7.14 (t, J=7.5 Hz, 2H), 7.10 (d, J=8.0 Hz, 4H), 7.05 (d, J=9.0 Hz, 2H), 6.72 (t, J=2.5 Hz, 1H), 3.87 (s, 3H), 1.37 (s, 9H). $^{13}$C NMR (100 MHz, $CD_2Cl_2$): δ 161.05, 159.17, 157.60, 157.37, 156.15, 152.80, 150.06, 143.23, 131.25, 130.27, 128.69, 127.05, 126.03, 123.97, 119.31, 117.08, 116.67, 114.87, 112.92, 110.26, 55.77, 35.00, 31.45. EI-MS: m/z 577.2584 $[M]^+$.

Among them, precursor 111 and the precursor 112 can be prepared according to the following synthetic routes based on conventional reaction conditions.

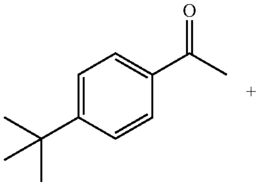

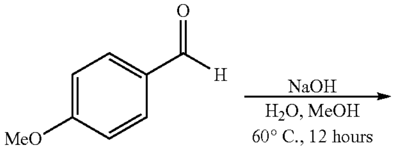

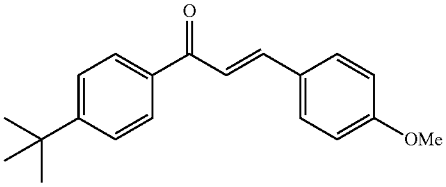

precursor 111

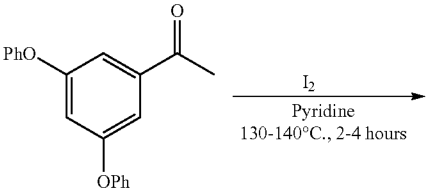

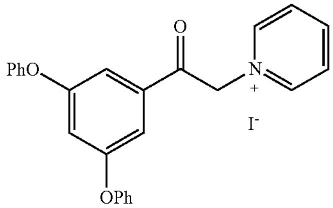

precursor 112

Example 2—Preparation of L2

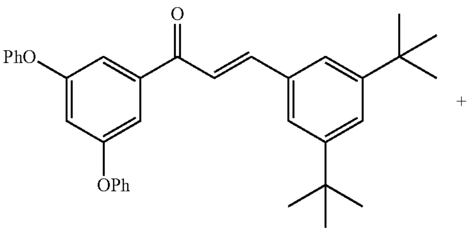

precursor 211

-continued

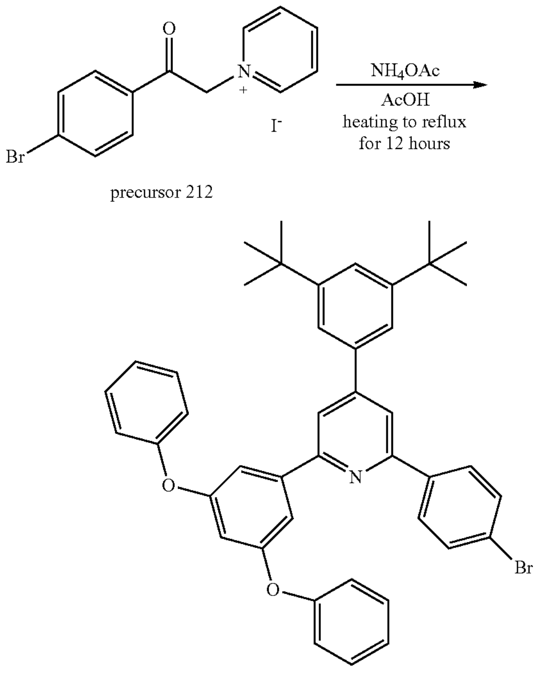

precursor 212

L2

The synthesis was similar to the preparation of Li. Precursor 211 (5.31 g, 10.51 mmol), precursor 212 (4.68 g, 11.57 mmol), excess ammonium acetate $NH_4OAc$ and AcOH were added to a reaction flask. The mixture was refluxed for 12 hours and then cooled to room temperature. The crude product was extracted with dichloromethane. The organic layer was washed with water for several times to remove excess acetic acid. The collected organic layer was dried with anhydrous magnesium sulfate. After evaporation to dryness, the crude product was purified by column chromatography on silica gel using DCM/hexane (v:v=1:6) as eluents and 3.23 g of pure L2 was obtained with a yield of 45%. $^1H$ NMR (500 MHz, $CD_2Cl_2$): δ 8.15 (d, J=8.5 Hz, 2H), 8.01 (s, 1H), 7.94 (s, 1H), 7.76 (d, J=2.0 Hz, 2H), 7.71-7.68 (m, 3H), 7.66 (d, J=1.5 Hz, 2H), 7.45 (t, J=8.0 Hz, 4H), 7.24-7.21 (m, 6H), 6.81 (t, J=2.0 Hz, 2H), 1.52 (s, 8H). $^{13}C$ NMR (125 MHz, $CD_2Cl_2$): δ 159.57, 157.24, 156.42, 156.36, 152.36, 142.85, 138.73, 138.70, 132.26, 130.37, 129.12, 124.26, 123.98, 123.89, 122.06, 119.98, 119.73, 118.36, 118.07, 112.52, 110.09, 35.48, 31.82. EI-MS: m/z 681.2187 $[M]^+$.

Among them, precursor 211 and the precursor 212 can be prepared according to the following synthetic routes based on conventional reaction conditions.

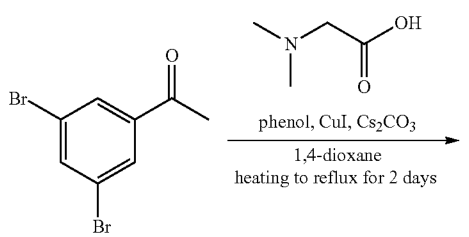

-continued

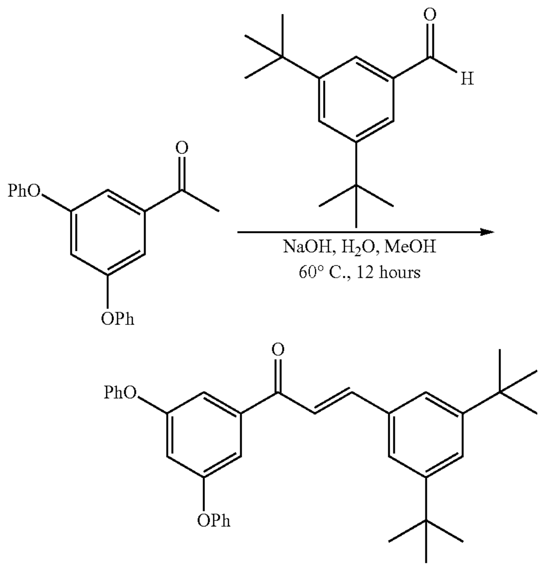

precursor 211

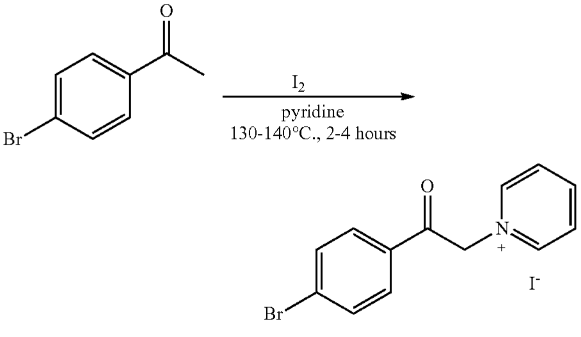

precursor 212

Example 3—Preparation of L3

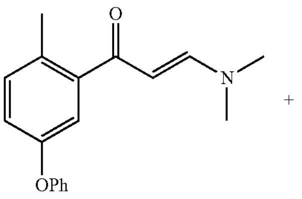

precursor 311

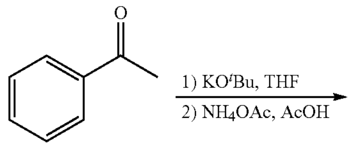

acetophenone

-continued

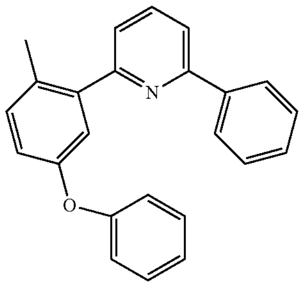

L3

A mixture of acetophenone (1.23 g, 10.25 mmol), KOtBu (2.30 g, 20.50 mmol) and anhydrous tetrahydrofuran was added into a reaction flask and stirred for 2 hours at room temperature under argon. The mixture was stirred for another 12 hours when a dry tetrahydrofuran solution of precursor 311 (2.89 g, 10.25 mmol) was transferred to the mixture by a cannula. Then the resulting mixture was added with excess ammonium acetate $NH_4OAc$ and acetic acid AcOH and heated to reflux for 12 hours. After the reaction, the mixture was cooled to room temperature and extracted with water/dichloromethane. The organic layer was washed with water for several times to remove excess acetic acid. After dried with anhydrous magnesium sulfate, the organic layer was removed of solvent using a rotary evaporator to obtain a crude product, which was purified by $SiO_2$ column chromatography (dichloromethane/hexane=1:6). 2.04 g of pure L3 was obtained with a yield of 59%. $^1H$ NMR (500 MHz, $CD_2Cl_2$): δ 8.09-8.07 (m, 2H), 7.83 (t, J=7.5 Hz, 1H), 7.74 (dd, J=8.0, 0.5 Hz, 1H), 7.50-7.46 (m, 2H), 7.44-7.41 (m, 1H), 7.37-7.32 (m, 3H), 7.30 (d, J=8.5 Hz, 1H), 7.18 (d, J=2.5 Hz, 1H), 7.08 (tt, J=7.0, 1.5 Hz, 1H), 7.07-7.04 (m, 2H), 6.99 (dd, J=8.5, 2.5 Hz, 1H), 2.44 (s, 3H). $^{13}C$ NMR (125 MHz, $CD_2Cl_2$): δ 159.45, 158.08, 156.72, 155.45, 142.36, 139.76, 137.55, 132.51, 131.67, 130.13, 129.37, 129.08, 127.27, 123.42, 122.76, 120.71, 119.25, 118.90, 118.72, 20.09. EI-MS: m/z 337.1446 $[M]^+$.

Among them, precursor 311 can be prepared according to the following synthetic routes based on conventional reaction conditions.

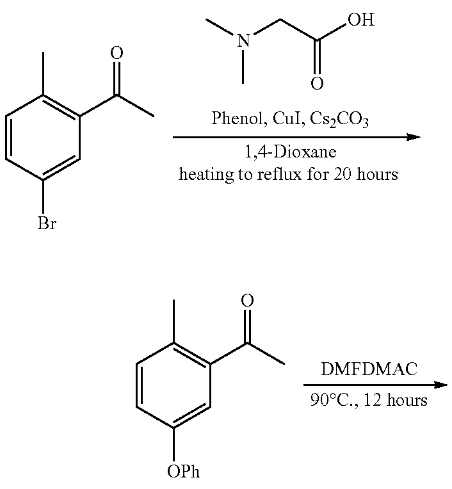

-continued

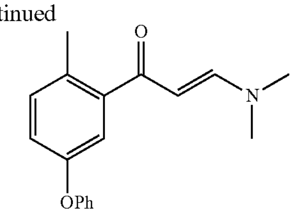

precursor 311

Example 4—Preparation of Precursor 421

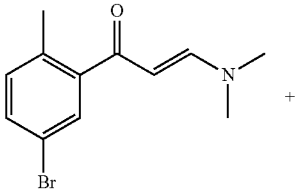

precursor 411

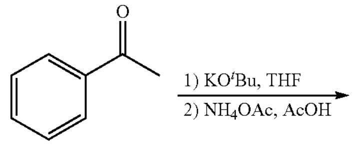

acetophenone

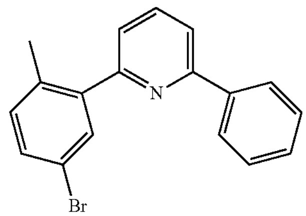

precursor 421

The synthesis was similar to the preparation of L3. A mixture of acetophenone (1.54 g, 12.79 mmol), KOtBu (2.87 g, 25.60 mmol) and anhydrous tetrahydrofuran was added to a reaction flask and stirred for around 2 hours at room temperature under argon. An anhydrous tetrahydrofuran solution of precursor 411 (3.43 g, 12.79 mmol) was added to the mixture which was then stirred for another 12 hours at room temperature. Then, the resulting mixture was added with excess ammonium acetate $NH_4OAc$ and acetic acid AcOH and refluxed for 12 hours. After the reaction, the mixture was cooled to room temperature and extracted with water/dichloromethane. The organic layer was washed with water for several times to remove excess acetic acid. After dried with anhydrous magnesium sulfate, the organic layer was removed of solvent using a rotary evaporator. The crude product was purified through $SiO_2$ column chromatography (dichloromethane/hexane=1:6). 2.57 g of pure L421 was obtained with a yield of 62%. $^1H$ NMR (500 MHz, $CD_2Cl_2$): δ 8.11 (d, J=7.5 Hz, 2H), 7.85 (d, J=8.0 Hz, 1H), 7.74 (t, J=8.0, 1H), 7.67 (d, J=2.5 Hz, 1H), 7.55-7.44 (m, 4H), 7.36 (d, J=7.5 Hz, 1H), 7.23 (d, J=8.0 Hz, 1H), 2.42 (s, 3H). $^{13}C$ NMR (125 MHz, $CD_2Cl_2$): δ 158.55, 157.02, 142.95, 139.86, 139.63, 137.97, 137.60, 135.71, 132.75, 131.38, 129.44, 129.09, 127.28, 122.75, 118.96, 20.33. EI-MS: m/z 323.0275 [M]+.

Among them, precursor 411 can be prepared according to the following synthetic route based on conventional reaction conditions.

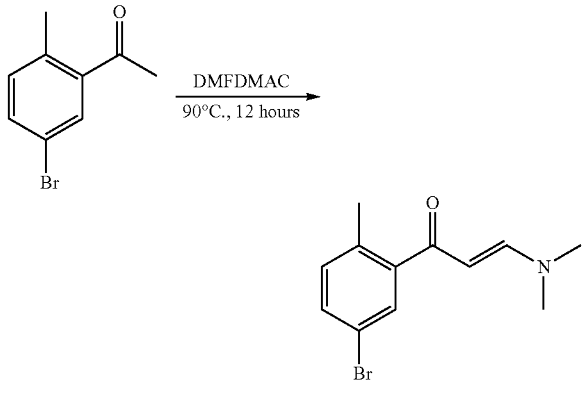

precursor 411

Example 5—Preparation of Precursor 441

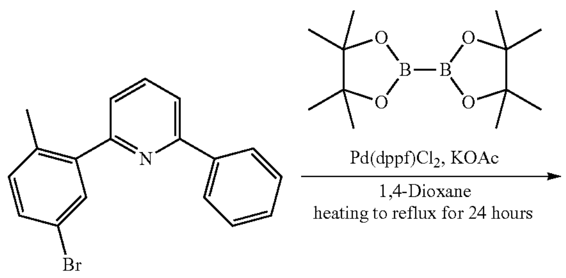

precursor 421

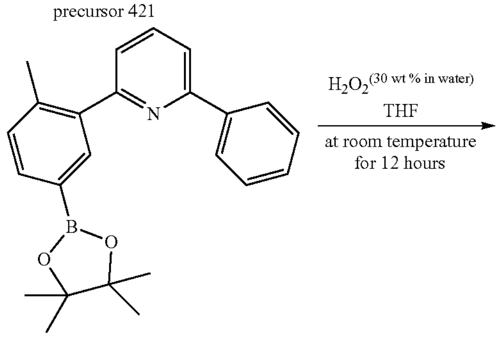

precursor 431

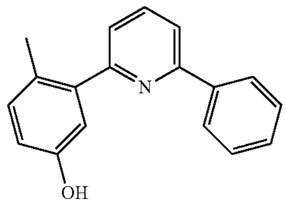

precursor 441

A mixture of precursor 421 (2.57 g, 7.93 mmol), KOAc (2.33 g, 23.79 mmol), Pd(dppf)$Cl_2$ (0.58 g, 0.79 mmol), bis(pinacolato)diboron (4.03 g, 15.86 mmol) and anhydrous 1,4-dioxane was refluxed for 24 hours and then was cooled to room temperature. After evaporation to dryness, the mixture was extracted with water/dichloromethane. The organic layer was collected, dried with anhydrous magnesium sulfate and then removed of solvent using a rotary evaporator to obtain a crude product. 1.62 g of pure precursor 431 was obtained through $SiO_2$ column chromatography (dichloromethane/hexane=1:6) with a yield of 55%. $^1H$ NMR (500 MHz, $CD_2Cl_2$): δ 8.14 (d, J=7.5 Hz, 2H), 7.95 (s, 1H), 7.83 (q, J=7.5, 2H), 7.74 (d, J=8.0 Hz, 1H), 7.52 (t, J=7.5 Hz, 2H), 7.46 (d, J=7.5 Hz, 1H), 7.41 (t, J=7.0 Hz, 2H), 2.54 (s, 3H). $^{13}C$ NMR (125 MHz, $CD_2Cl_2$): δ 160.25, 156.67, 140.66, 140.05, 139.94, 137.47, 136.50, 134.97, 130.77, 129.33, 129.09, 127.33, 122.90, 118.51, 84.16, 83.64, 25.20, 21.13. EI-MS: m/z 371.2031 $[M]^+$.

Precursor 431 was dissolved in tetrahydrofuran (THF), and the mixture was placed in an ice bath. Hydrogen peroxide ($H_2O_2$, 30 wt % in water) was added to the THF solution and the resulting mixture was stirred at room temperature. The progress of the reaction was detected by TLC. After the reaction, the mixture was removed of THF using a rotary evaporator. The crude product was extracted with water/dichloromethane. The organic layer was washed with water for several times to remove excess hydrogen peroxide, dried with anhydrous magnesium sulfate, and then removed of solvent using a rotary evaporator. 1.00 g of precursor 441 was obtained with a yield of 88%. $^1H$ NMR (500 MHz, $CD_2Cl_2$): δ 8.07 (d, J=7.5 Hz, 2H), 7.83 (t, J=8.0 Hz, 1H), 7.72 (dd, J=8.0, 0.5, 1H), 7.51-7.43 (m, 3H), 7.32 (d, J=7.5 Hz, 1H), 7.11 (d, J=8.0 Hz, 1H), 6.89 (d, J=3.0 Hz, 1H), 6.71 (dd, J=8.5, 3.0 Hz, 1H), 3.81 (s, 1H), 2.34 (s, 3H). $^{13}C$ NMR (125 MHz, $CD_2Cl_2$): δ 160.05, 157.04, 154.60, 141.40, 139.73, 137.65, 132.04, 129.37, 129.06, 127.71, 127.50, 122.98, 119.14, 117.24, 116.00, 19.69. EI-MS: m/z 261.1130 $[M]^+$.

Example 6—Preparation of L4

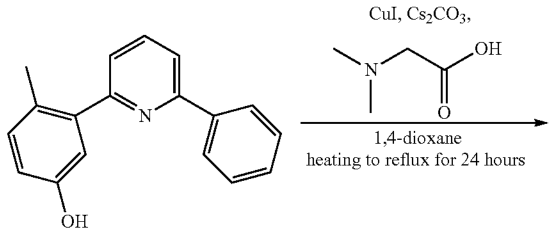

precursor 441

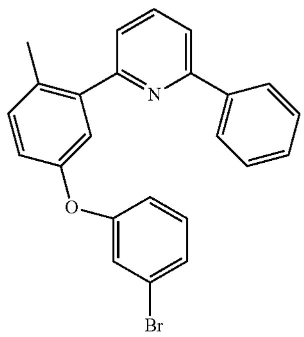

L4

A mixture of precursor 441 (1.00 g, 3.83 mmol), CuI (0.07 g, 0.38 mmol), $Cs_2CO_3$ (3.74 g, 11.49 mmol), N,N-dimethylglycine (0.08 g, 0.76 mmol) and anhydrous 1,4-dioxane was added into a reaction flask and refluxed for 24 hours. After the reaction, the mixture was cooled to room temperature and removed of solvent with a rotary evaporator. The resulting mixture was extracted with water/dichloromethane. The organic layer was dried with anhydrous magnesium sulfate and then removed of solvent with a rotary evaporator to obtain a crude product, which was purified through $SiO_2$ column chromatography (dichloromethane/hexane=1:5). 0.99 g of pure LA was obtained with a yield of 62%. $^1H$ NMR (300 MHz, $CD_2Cl_2$): δ 8.18-8.14 (m, 2H), 7.83 (t, J=7.5 Hz, 1H), 7.77 (dd, J=7.8, 0.9 Hz, 1H), 7.57-7.44 (m, 3H), 7.41-7.36 (m, 2H), 7.32-7.20 (m, 4H), 7.09-7.03 (m, 2H), 2.53 (s, 3H). $^{13}C$ NMR (100 MHz, $CD_2Cl_2$): δ 159.20, 159.12, 156.69, 154.49, 142.52, 139.63, 137.54, 132.76, 132.49, 131.31, 129.41, 129.09, 127.26, 126.23, 123.18, 122.72, 121.61, 121.26, 119.73, 118.73, 117.28, 20.28. EI-MS: m/z 415.0537[M]$^+$.

Example 7—Preparation of Precursor 511

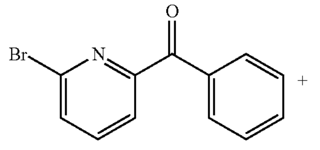

precursor 511

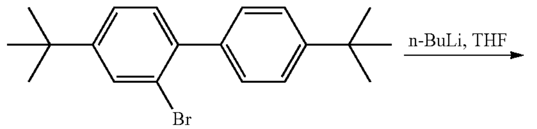

2-bromo-4,4′-di-tert-butyl-1,1′-biphenyl

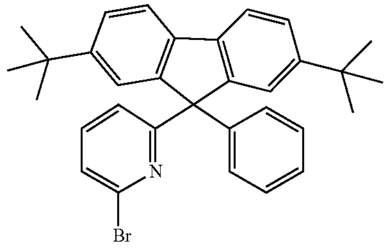

precursor 521

An anhydrous tetrahydrofuran solution of 2-bromo-4,4"-di-tert-butyl-1,1'-biphenyl (3.47 g, 10.05 mmol) was cooled to −78° C. and stirred for 5 minutes under argon. After the addition of n-butyllithium (2.4 M in THF; 4.6 ml, 11.06 mmol), the mixture was stirred for another 2 hours at −78° C. An anhydrous tetrahydrofuran solution of precursor 511 (2.63 g, 10.05 mmol) was added into the resulting mixture which was then stirred at −78° C. for 30 minutes. The mixture was warmed to room temperature and then stirred for another 16 hours. After the reaction, a saturated ammonium chloride aqueous solution was added into the mixture which was then stirred at room temperature for around 20 minutes. The mixture was removed of solvent using a rotary evaporator and extracted with water/dichloromethane. The organic layer was collected, dried with anhydrous magnesium sulfate, and removed of solvent using a rotary evaporator. The obtained product was dissolved in a mixed system (concentrated sulfuric acid: acetic anhydride: glacial acetic acid=2.5 ml: 2.5 ml: 45 ml), and then the mixture was stirred at 300° C. for around 7 hours. After the reaction, the mixture was cooled to room temperature and poured into ice methanol (150 ml). The precipitate obtained by filtration was washed twice with ice methanol, and then the obtained precipitate was dissolved in dichloromethane. The resulting solution was washed with water until the pH of the water layer was close to neutral. The organic layer was collected, dried with anhydrous magnesium sulfate, and then removed of solvent using a rotary evaporator. 3.12 g of pure precursor 521 was obtained with a yield of 61%. $^1H$ NMR (400 MHz, $CD_2Cl_2$): δ 7.69-7.66 (m, 4H), 7.45 (dd, J=8.0, 1.8 Hz, 2H), 7.38-7.32 (m, 2H), 7.27-7.22 (m, 3H), 7.06 (dd, J=6.6, 1.8 Hz, 1H), 7.03-7.00 (m, 2H), 1.32 (s, 18H). $^{13}C$ NMR (125 MHz, $CD_2Cl_2$): δ 165.77, 151.28, 149.15, 146.59, 142.13, 139.11, 138.19, 128.74, 128.01, 126.93, 126.58, 125.46, 124.32, 120.42, 119.76, 67.18, 35.32, 31.65. EI-MS: m/z 494.1468[M]$^+$.

Among them, precursor 511 can be prepared according to the following synthetic routes based on conventional reaction conditions.

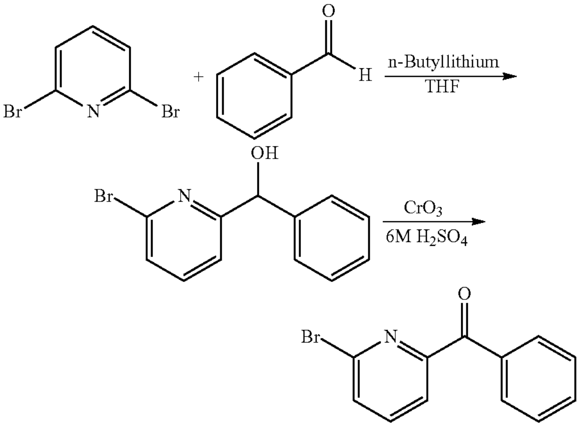

precursor 511

Example 8—Preparation of L5

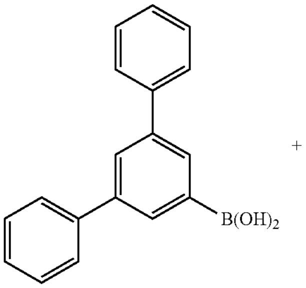

3,5-diphenylphenylboronic acid

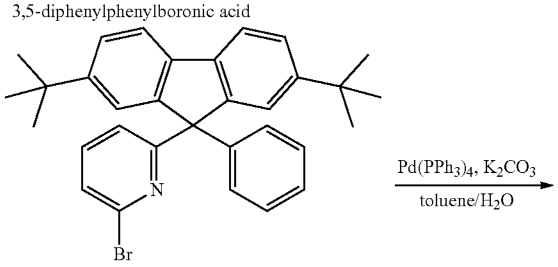

precursor 521

-continued

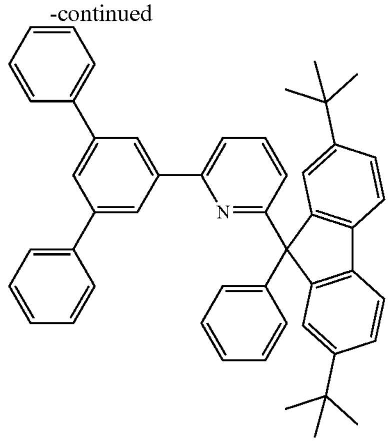

L5

A mixture of precursor 521 (3.00 g, 5.88 mmol), 3,5-diphenylphenylboronic acid (2.42 g, 8.82 mmol), $K_2CO_3$ (2.44 g, 17.64 mmol), $Pd(PPh_3)_4$ (0.68 g, 0.59 mmol) and a mixed solvent of water/toluene (v:v=1:8) was refluxed for 24 hours under argon. After the reaction, the mixture was cooled to room temperature and removed of solvent with a rotary evaporator. The resulting mixture was extracted with water/dichloromethane. The organic layer was collected, dried with anhydrous magnesium sulfate and then removed of solvent with a rotary evaporator to obtain a crude product, which was purified through $SiO_2$ column chromatography (dichloromethane/hexane=1:5). 0.99 g of pure L5 was obtained with a yield of 65%.

$^1H$ NMR (500 MHz, $CD_2Cl_2$): δ 8.14 (d, J=1.5 Hz, 2H), 7.83 (t, J=2.0 Hz, 1H), 7.75 (d, J=8.0 Hz, 1H), 7.71 (d, J=8.0 Hz, 2H), 7.69-7.64 (m, 7H), 7.48 (t, J=7.5 Hz, 4H), 7.44 (dd, J=8.0, 2.0 Hz, 2H), 7.40 (tt, J=7.0, 1.5 Hz, 2H), 7.26-7.16 (m, 5H), 7.13 (d, J=7.5 Hz, 1H), 1.25 (s, 18H). $^{13}C$ NMR (125 MHz, $CD_2Cl_2$): δ 164.65, 156.57, 151.00, 150.38, 146.90, 142.47, 141.40, 140.99, 138.38, 137.53, 129.20, 128.44, 128.42, 127.92, 127.71, 126.86, 126.61, 125.18, 125.03, 124.18, 120.83, 119.68, 118.75, 68.00, 35.23, 31.67. EI-MS: m/z 659.3541 $[M]^+$.

In addition, according to the preparation/detailed synthetic protocols of ligands L1-L5 shown in Examples 1-9, the following ligands can also be prepared based on the given procedures and their detailed synthesis are not shown on here.

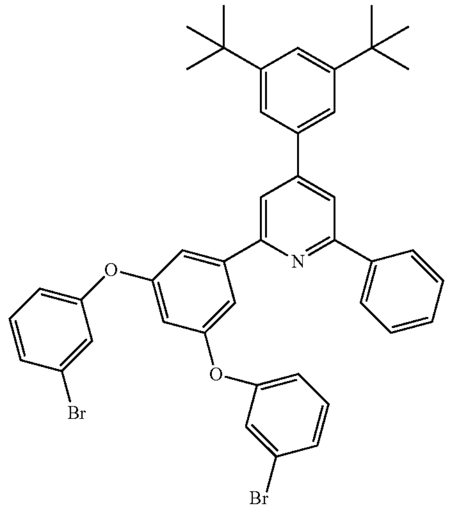

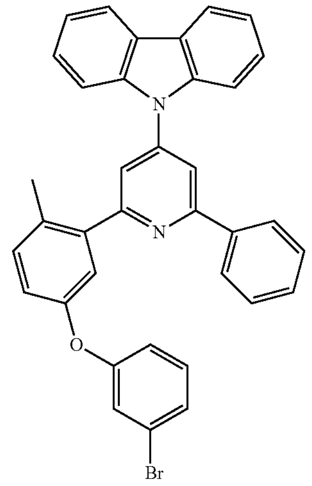

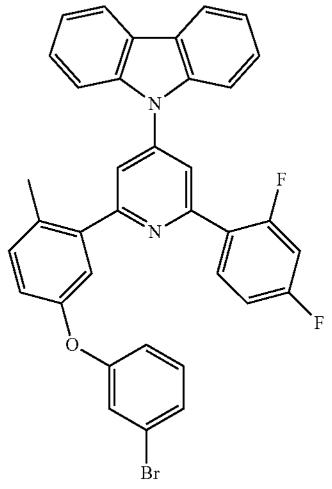

-continued
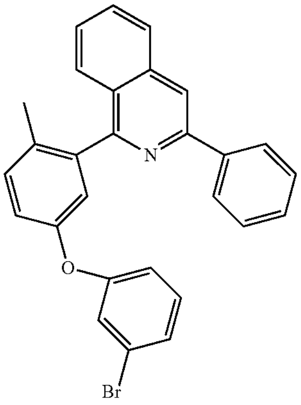
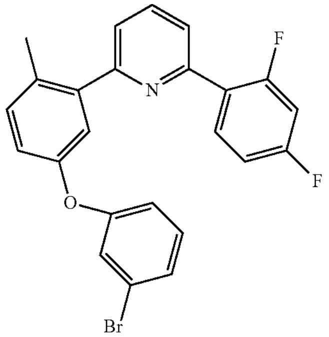
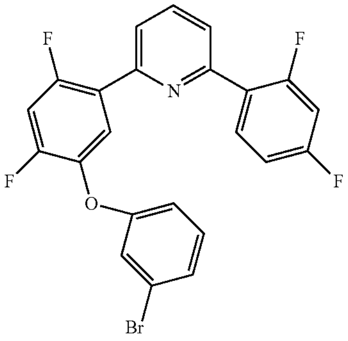
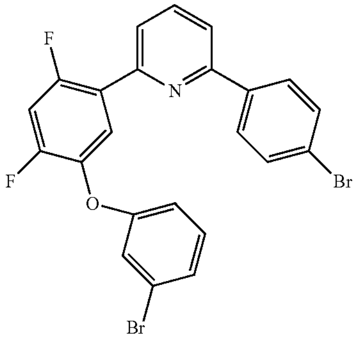
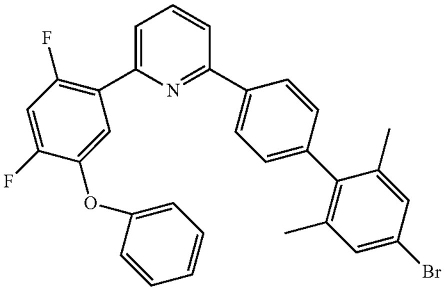
-continued
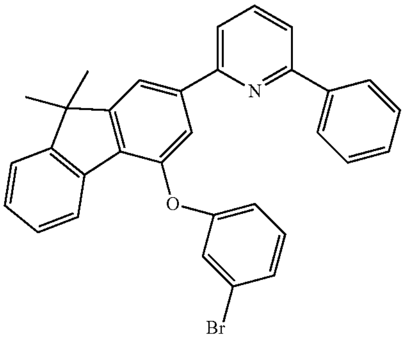
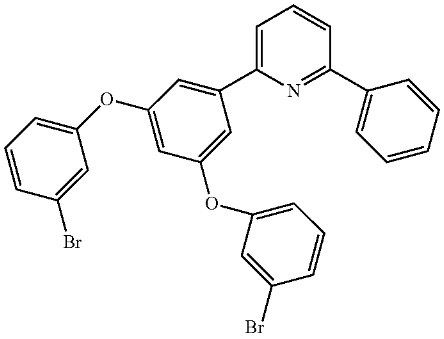
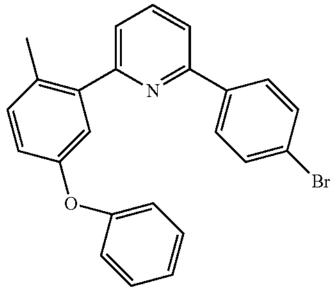
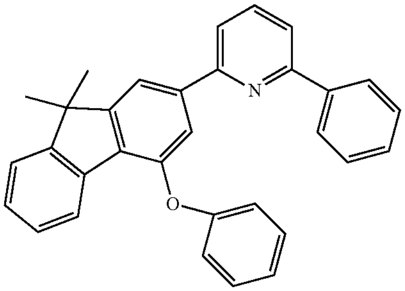
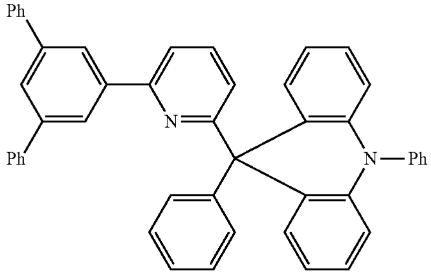

-continued

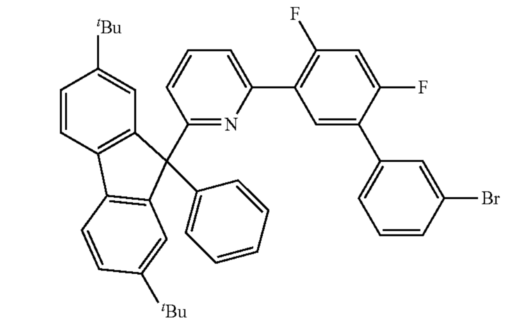

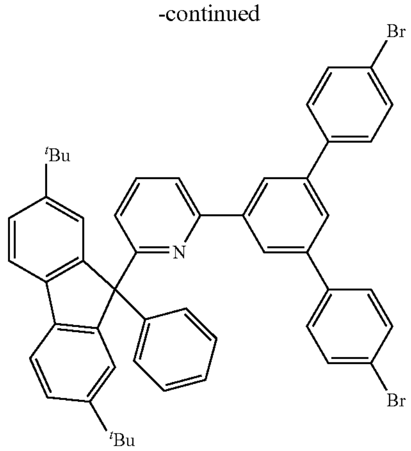

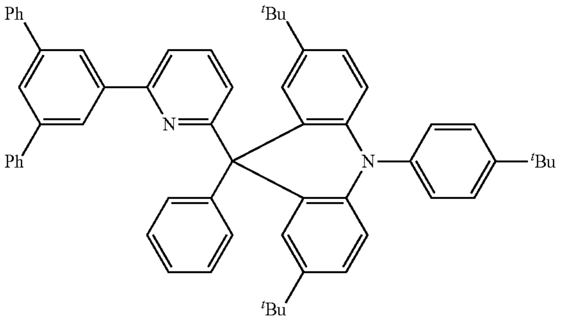

Preparation of a Gold(III) Complex Supported by Tetradentate Ligand

As shown in the following synthetic route, there are two protocols for preparing tetradentate gold(III) complexes (0-I). Tetradentate gold(III) complexes (0-I) can be prepared using cyclometallated gold(III) complexes (0-II) as precursors through C—H (carbon-hydrogen) bond activation and intramolecular Au—C(gold-carbon) bond coupling reaction with the assistance of microwave energy. Tetradentate gold (III) complexes (0-I) can also be prepared using ligands (0-III) as precursors through microwave-assisted C—H bond activation and intermolecular coordination coupling reaction between the ligand and Au(III) reagent. Precursor 0-II can be obtained through the transmetallation from the corresponding organomercury(II) complexes which can be synthesized based on the reaction between ligand (0-III) and Hg(II) Reagent. In addition, the coordination anion ($X_a$) of precursor (0-II) can be changed via conventional methods.

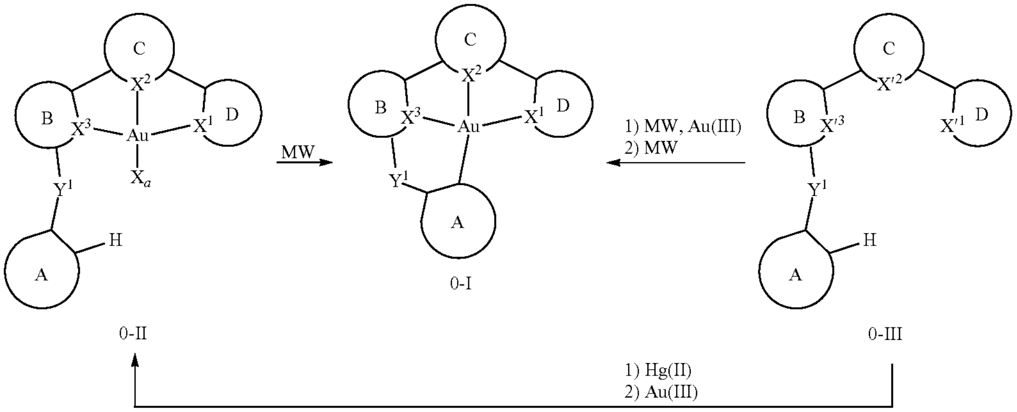

When tetradentate gold(III) complexes are substituted with large or sensitive substituents on the core structure, such as $NR^{17}R^{18}$, tetradentate gold(III) complexes having halogen at the same position were prepared as precursors based on the microwave-assisted method shown in the present invention. The targeted amino-substituted tetradentate gold(III) complex was then synthesized through the cross-coupling reaction between the halogen-substituted tetradentate complex and amine. That is, a versatile class of tetradentate gold(III) complexes can be prepared using tetradentate gold(III) complexes bearing different functional groups for further reactions as precursors. Therefore, the preparation of tetradentate gold(III) complexes provided by the present invention can realize the construction of tetradentate gold(III) complexes with different structures and emission properties. Example 9-L1-Au(III)Cl

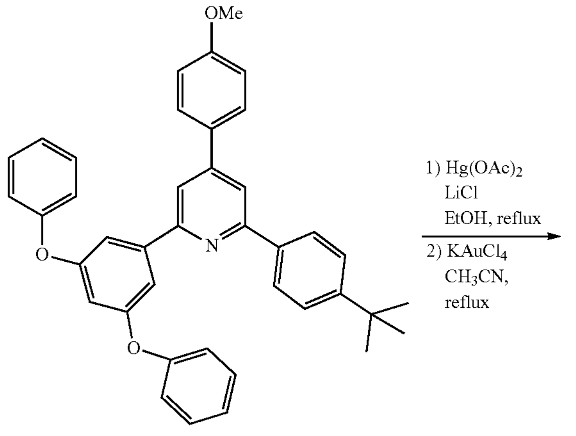

L1

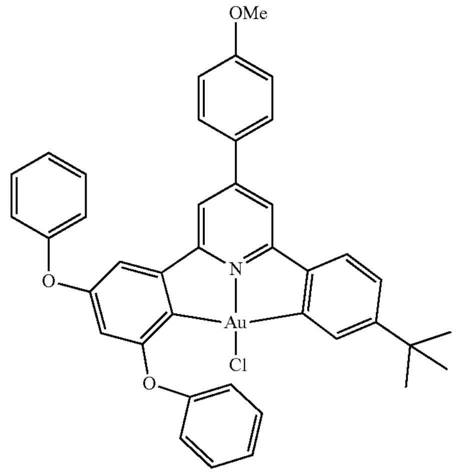

L1-Au(III)Cl

A mixture of L1 (2.00 g, 3.46 mmol), $Hg(OAc)_2$ (1.43 g, 4.50 mmol) and EtOH (45 ml) was refluxed for 48 hours. Then, LiCl (0.73 g, 17.30 mmol) was added into the mixture and the resulting mixture was refluxed for another 2 hours. After the reaction, the mixture was cooled to room temperature. The precipitate was collected by filtration, washed twice with ethanol, and dried under vacuum. The obtained white solid L1-HgCl (1.57 g, 1.93 mmol, yield 56%) was used for the next step without further purification. A mixture of L1-HgCl, $KAuCl_4$ (0.80 g, 2.12 mmol) and acetonitrile (35 ml) was refluxed for 48 hours. After the reaction, the mixture was cooled to room temperature. The yellow solid was collected by filtration, washed with acetonitrile twice, and dried under vacuum. 0.84 g of L1-AuCl (1.04 mmol) as yellow solid was obtained with a yield of 54%.

The above-mentioned preparation of cyclometallated gold (III) chlorides in this example is based on the literature [K-H. Wong, K-K Cheung, M C-W. Chan, C.-M. Che, Organometallics 1998, 17, 3505-3505]. The L1-Au(III)Cl obtained through filtration can be used directly in the next reaction without further purification.

Example 10—L1-Au(III)$OCOCF_3$

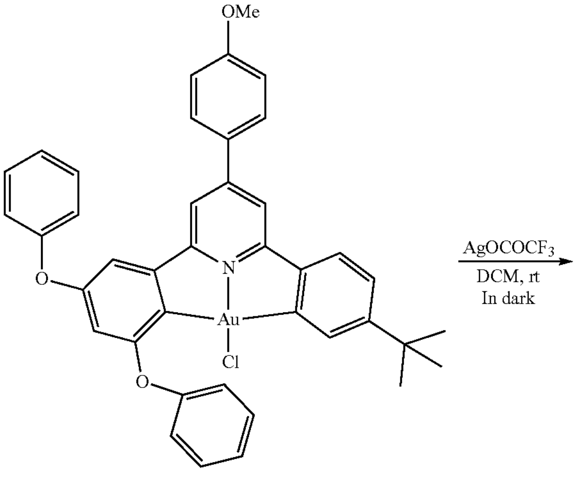

L1-Au(III)Cl

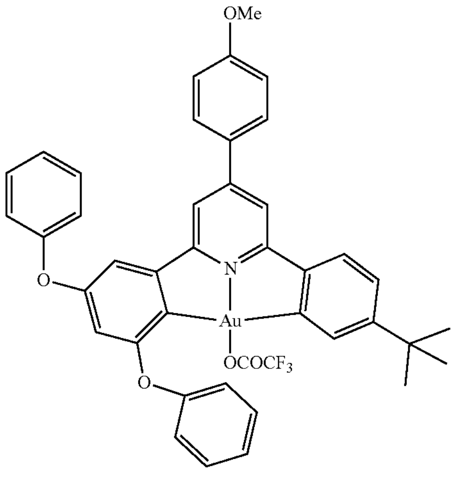

L1-Au(III)$OCOCF_3$

A mixture of L1-Au(III)Cl (0.84 g, 1.04 mmol), $AgOCOCF_3$ (0.25 g, 1.14 mmol) and dichloromethane (45 ml) was stirred for around 16 hours in dark. After the reaction, the filtrate was collected through filtration with Celite. After evaporation to dryness, the crude product L1-Au(III) $OCOCF_3$ was obtained.

The preparation method in this example is based on the literature [D.-A. Rosca, D A Smith, M. Bochmann, Chem. Commun. 2012, 48, 7247-7249]. The prepared crude product L1-Au(III) $OCOCF_3$ can be used directly in the next reaction without further purification.

Example 11—Preparation of Complex 1

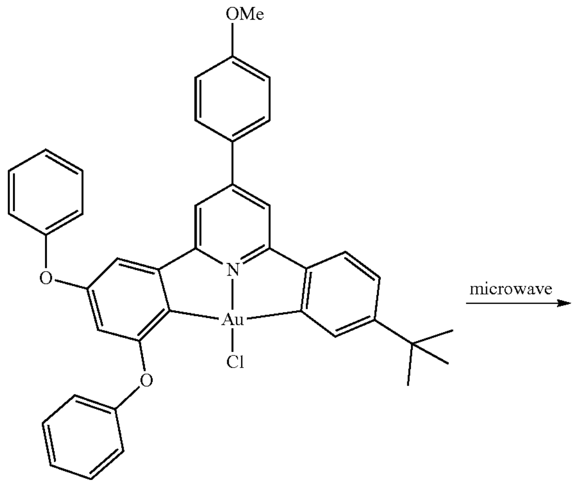

L1-Au(III)Cl

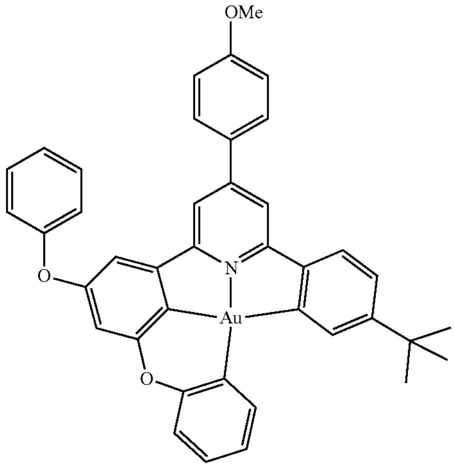

Complex 1

In a 10 ml microwave reaction tube, L1-Au(III)Cl (25 mg, 0.03 mmol) was dissolved in a mixed solvent of ACN/$H_2O$ (v:v=1:1, total 3 ml). The mixture was stirred for 20 min at 120° C. with the use of microwave. After the reaction, water was added into the mixture. Dichloromethane was added into the mixture for the extraction of crude product. The collected organic layer was dried with anhydrous magnesium sulfate. The product was purified through $SiO_2$ column chromatography (dichloromethane/hexane). 3.6 mg of pure complex 1 was obtained with a yield of 15%.

$^1$H NMR (500 MHz, $CD_2Cl_2$): δ 8.48 (dd, J=7.5, 1.5 Hz, 1H), 8.22 (d, J=2.0 Hz, 1H), 7.82-7.80 (m, 2H), 7.74 (d, J=9.0 Hz, 2H), 7.65 (d, J=1.5 Hz, 1H), 7.45-7.38 (m, 5H), 7.28 (d, J=2.0 Hz, 1H), 7.18-7.15 (m, 2H), 7.12 (d, J=8.0 Hz, 2H), 7.08 (d, J=9.0 Hz, 2H), 7.00 (d, J=2.5 Hz, 1H), 3.90 (s, 3H), 1.45 (s, 9H). $^{13}$C NMR (125 MHz, $CD_2Cl_2$): δ 170.29, 163.99, 162.25, 161.71, 158.40, 157.94, 154.32, 154.21, 151.41, 151.28, 149.96, 149.62, 136.45, 134.70, 132.35, 130.49, 130.26, 129.29, 128.52, 126.22, 124.06, 123.99, 122.78, 119.45, 118.44, 116.87, 115.25, 115.10, 114.81, 112.16, 109.48, 35.97, 31.74, 30.30. ESI-MS: m/z 772.2111 $[M+H]^+$. Elemental analysis calculated for $C_{40}H_{32}AuNO_3$+$0.5CH_2Cl_2$: C, 59.75; H, 4.09; N, 1.72; found: C, 59.63; H, 4.09; N, 1.72.

Example 12—Preparation of Complex 1

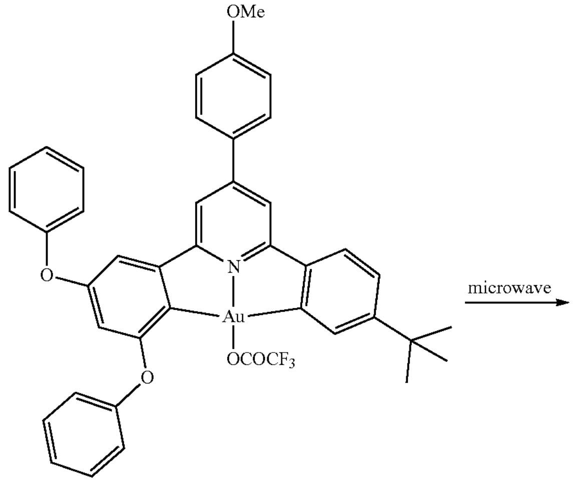

L1-Au(III)OCOCF3

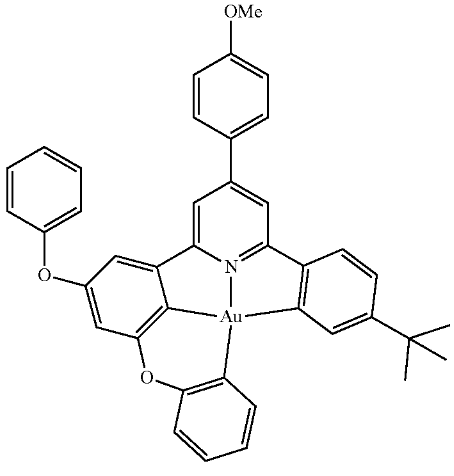

Complex 1

In a 10 ml microwave reaction tube, L1-Au(III)$OCOCF_3$ (28 mg, 0.032 mmol) was dissolved in a mixed solvent system of ACN/$H_2O$ (v:v=1:1, total 3.2 ml). The mixture was stirred for 20 min at 120° C. with the use of microwave. After the reaction, water was added to the system and dichloromethane was added to extract the crude product. The collected organic layer was dried with anhydrous magnesium sulfate. 22.0 mg of pure complex 1 (yield: 90%) was obtained through column chromatography on silica gel using dichloromethane and hexane as eluents.

Example 13—Preparation of Complex 2

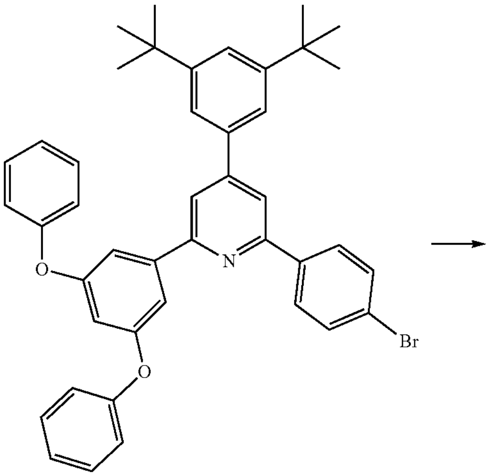

L2

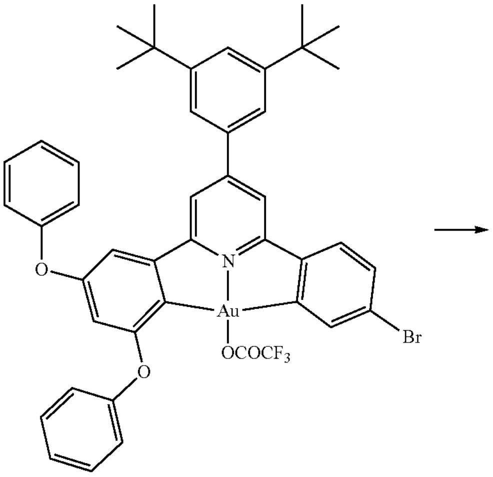

L2-Au(III)$OCOCF_3$

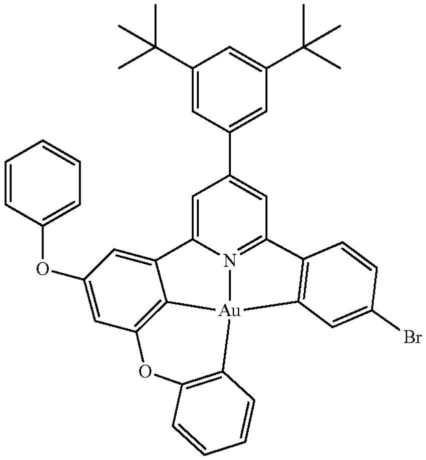

Complex 2

L2-Au(III)$OCOCF_3$ was prepared according to the method used for synthesizing L1-Au(III)$OCOCF_3$ in examples 9-10. In a 10 ml microwave reaction tube, L2-Au (III)$OCOCF_3$ (280 mg, 0.282 mmol) was dissolved in a mixed solvent of $ACN/H_2O$ (v:v=1:1, total 16 ml). The mixture was stirred for 20 min at 120° C. in a microwave. After the reaction, water was added to the mixture and dichloromethane was added to extract the crude product. The collected organic layer was dried with anhydrous magnesium sulfate. The product was purified through $SiO_2$ column chromatography (dichloromethane/hexane). 220 mg of pure complex 2 was obtained with a yield of 89%.

$^1H$ NMR (500 MHz, $CD_2Cl_2$): δ 8.29 (dd, J=7.5, 1.5 Hz, 1H), 8.23 (d, J=2.0 Hz, 1H), 7.78 (s, 1H), 7.75 (d, J=8.5 Hz, 1H), 7.70 (s, 1H), 7.65 (s, 1H), 7.55 (d, J=1.5 Hz, 2H), 7.48 (dd, J=8.5, 2.0 Hz, 1H), 7.42-7.37 (m, 4H), 7.32 (d, J=2.0 Hz, 1H), 7.19-7.11 (m, 4H), 6.96 (d, J=2.0 Hz, 1H), 1.42 (s, 18H). ESI-MS: m/z 876.1737 $[M+H]^+$. Elemental analysis calculated for $C_{43}H_{37}AuBrNO_2$: C, 58.91; H, 4.25; N, 1.60; found: C, 59.08; H, 4.52; N, 1.55.

For complex L2-Au(III)$OCOCF_3$, $^{19}F$ NMR (376 MHz, $CD_2Cl_2$): δ −73.16

Example 14—Preparation of Complexes 3-4

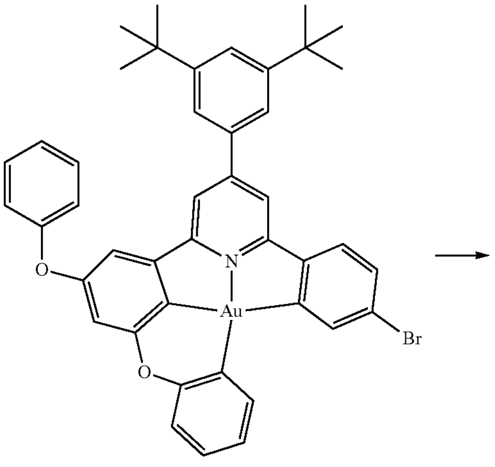

Complex 2

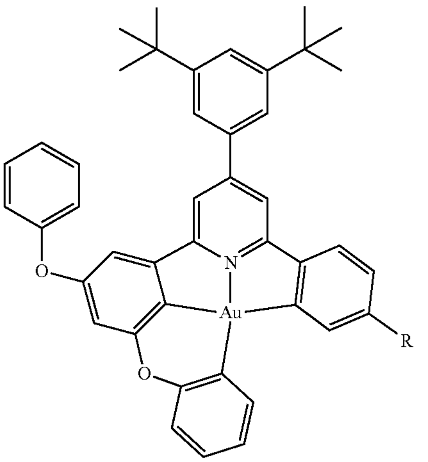

-continued

R =

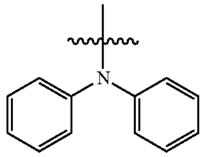

3

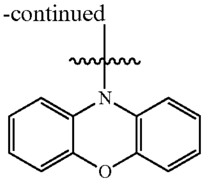

4

Complex 3: A mixture of complex 2 (35 mg, 0.04 mmol), $Pd(dba)_2$ (9.2 mg, 0.008 mmol), Binap (5.0 mg, 0.008 mmol), KOtBu (13.4 mg, 0.12 mmol) was refluxed in toluene for 24 hours under argon. After the reaction, the mixture was cooled to room temperature. Water was added to the mixture and dichloromethane was added to extract the crude product. The collected organic layer was dried with anhydrous magnesium sulfate. The product was purified through $SiO_2$ column chromatography (dichloromethane/hexane). 17 mg of pure complex 3 was obtained with a yield of 45%.

$^1H$ NMR (500 MHz, $CD_2Cl_2$): δ 7.83 (dd, J=8.0, 2.0 Hz, 1H), 7.72-7.69 (m, 2H), 7.65 (d, J=1.5 Hz, 1H), 7.62 (t, J=2.0 Hz, 1H), 7.55-7.53 (m, 3H), 7.40-7.36 (m, 6H), 7.32 (dd, J=8.0, 1.5 Hz, 1H), 7.29-7.24 (m, 6H), 7.20-7.13 (m, 3H), 7.11-7.09 (m, 2H), 6.96 (dd, J=8.0, 2.0 Hz, 1H), 6.92 (d, J=2.0 Hz, 1H), 6.74-6.71 (m, 1H), 1.41 (s, 18H). $^{13}C$ NMR (125 MHz, $CD_2Cl_2$): δ 171.38, 163.57, 161.41, 158.31, 157.60, 156.04, 152.48, 151.45, 151.07, 150.44, 149.61, 147.57, 144.18, 138.07, 135.72, 134.14, 130.29, 129.89, 128.18, 127.39, 127.35, 126.41, 124.81, 124.50, 123.93, 122.41, 122.00, 119.25, 118.34, 118.06, 116.45, 115.78, 114.87, 112.04, 109.00, 35.44, 31.62. ESI-MS: m/z 965.3333 $[M+H]^+$. Elemental analysis calculated for $C_{55}H_{47}AuN_2O_2$: C, 68.46; H, 4.91; N, 2.90; found: C, 68.46; H, 4.91; N, 2.85.

Complex 4: A mixture of complex 2 (90 mg, 0.10 mmol), $Pd(dba)_2$ (23.7 mg, 0.021 mmol), Binap (12.8 mg, 0.021 mmol), KOtBu (33.7 mg, 0.30 mmol) was refluxed in toluene for 24 hours under argon. After the reaction, the mixture was cooled to room temperature. Water was added to the mixture and dichloromethane was added to extract the crude product. The collected organic layer was dried with anhydrous magnesium sulfate. The product was purified through $SiO_2$ column chromatography (dichloromethane/hexane). 30 mg of pure complex 4 was obtained with a yield of 40%.

$^1H$ NMR (500 MHz, $CD_2Cl_2$): δ 8.23 (dd, J=7.5, 1.5 Hz, 1H), 8.05 (d, J=2.0 Hz, 1H), 8.01 (d, J=8.0 Hz, 1H), 7.79 (s, 1H), 7.67-7.65 (m, 2H), 7.58 (d, J=2.0 Hz, 2H), 7.40-7.27 (m, 6H), 7.16 (t, J=7.5 Hz, 1H), 7.07-7.02 (m, 3H), 6.86 (d, J=2.0 Hz, 1H), 6.70-6.60 (m, 6H), 6.16 (dd, J=8.0, 1.5 Hz, 2H), 1.44 (s, 18H). $^{13}C$ NMR (125 MHz, $CD_2Cl_2$): δ 173.98, 162.69, 161.56, 158.61, 157.23, 156.62, 152.63, 152.08, 151.08, 150.81, 149.28, 144.44, 141.09, 137.85, 137.17, 135.86, 134.78, 132.66, 130.36, 128.75, 128.69, 128.53, 125.07, 124.19, 123.74, 122.89, 122.14, 121.66, 119.53, 118.15, 117.03, 116.54, 115.71, 115.69, 113.88, 112.19, 108.91, 35.50, 31.65. ESI-MS: m/z 978.3072 $[M]^+$. Elemental analysis calculated for $C_{55}H_{45}AuN_2O_3$+MeOH: C, 66.53; H, 4.89; N, 2.77; found: C, 66.77; H, 4.68; N, 2.84.

It is worth noting that the following complexes with other amino-substituents can also be prepared using the method shown in Example 14 with the use of complex 2 as precursor.

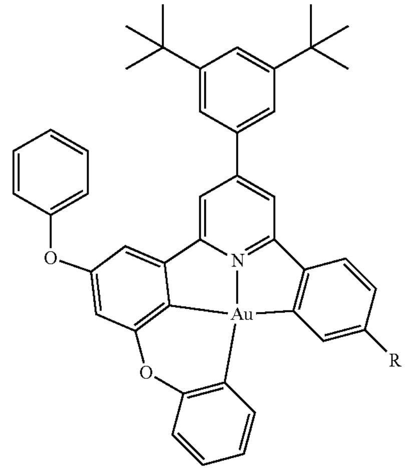

R =

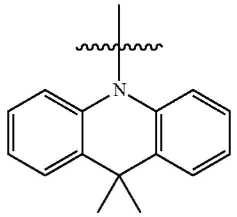

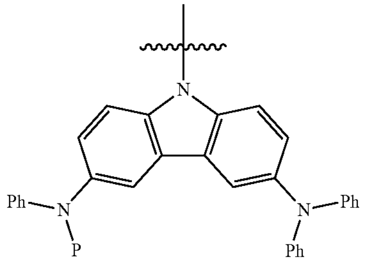

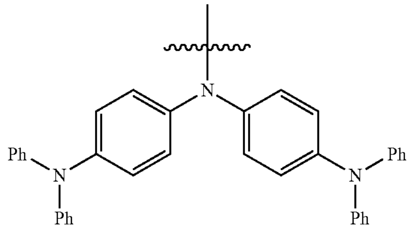

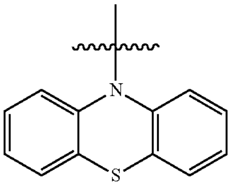

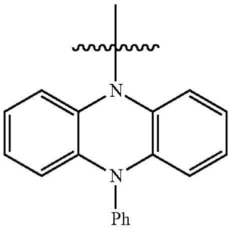

Example 15—Preparation of Complex 5

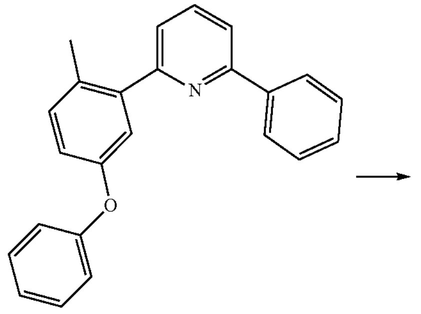

L3

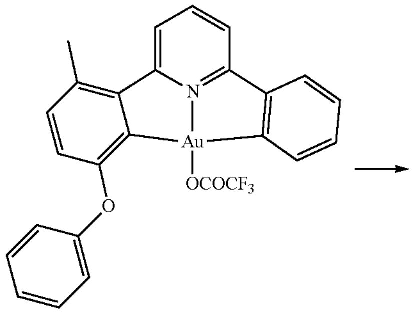

L3-Au(III)OCOCF$_3$

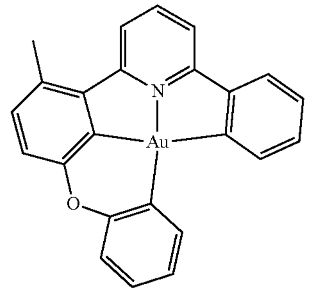

Complex 5

L3-Au(III)OCOCF$_3$ was prepared according to the method for synthesizing L1-Au(III)OCOCF$_3$ in examples 9-10. In a 10 ml microwave reaction tube, L3-Au(III)OCOCF$_3$ (27 mg, 0.042 mmol) was dissolved in a mixed solvent of ACN/$H_2O$ (v:v=1:1, total 3 ml). The mixture was stirred for 20 min at 120° C. in a microwave. After the reaction, water was added to the mixture and dichloromethane was added to extract the crude product. The collected organic layer was dried with anhydrous magnesium sulfate and removed of solvent using a rotary evaporator. The product was purified through $SiO_2$ column chromatography (dichloromethane/hexane). 20 mg of pure complex 5 was obtained with a yield of 89%.

$^1$H NMR (500 MHz, $CD_2Cl_2$): δ 8.35 (dd, J=7.5, 1.5 Hz, 1H), 8.06 (d, J=7.0 Hz, 1H), 7.83 (t, J=8.0 Hz, 1H), 7.75 (d, J=8.0 Hz, 1H), 7.71 (d, J=7.0 Hz, 1H), 7.59 (d, J=8.0 Hz, 1H), 7.49 (td, J=7.0, 1.0 Hz, 1H), 7.43-7.36 (m, 2H), 7.30 (td, J=7.5, 1.0 Hz, 1H), 7.21 (d, J=8.0 Hz, 1H), 7.14-7.11 (m, 1H), 7.08 (d, J=8.0 Hz, 1H), 2.64 (s, 3H). $^{13}$C NMR (100 MHz, $CDCl_3$): δ 171.02, 164.55, 163.06, 152.05, 149.55, 148.42, 148.32, 141.58, 140.04, 136.50, 135.21, 133.51, 132.80, 131.10, 128.39, 126.77, 126.33, 122.38, 121.40, 118.93, 117.87, 117.58, 117.26, 22.91. EI-MS: m/z 531.0901 $[M]^+$. Elemental analysis calculated for $C_{24}H_{16}AuNO$: C, 54.25; H, 3.04; N, 2.64; found: C, 54.14; H, 2.87; N, 2.66.

Example 16—Preparation of Complex 5

In a 10 ml microwave reaction tube, ligand L3 (28 mg, 0.08 mmol), $Au(OAc)_3$ (0.03 g, 0.09 mmol) and sodium trifluoroacetate (0.05 g, 0.36 mmol) were mixed in acetic acid/$H_2O$ (v:v=1:1, total 3 ml). The mixture was stirred for 30 min at 150° C. in a microwave. After the reaction, the mixture was cooled to room temperature. Water was added to the system, and dichloromethane was added to extract the crude product. The organic layer was washed with water 2-3 times until the pH value of the water layer was close to neutral. The organic layer was dried with anhydrous magnesium sulfate and removed of solvent under vacuum. The resulting mixture was directly dissolved in a mixed solvent of ACN/$H_2O$ (v:v=1:1, total 10 ml). Then, the mixture was stirred for 70 min at 140° C. in a microwave. After the reaction, the mixture was cooled to room temperature. Water was added to the system, and dichloromethane was added to extract the crude product. The collected organic layer was dried with anhydrous magnesium sulfate, and then removed of solvent using a rotary evaporator. Complex 5 was purified through column chromatography on silica gel using dichloromethane and hexane as eluents. 14 mg of pure product was obtained with a yield of 33%.

Example 17—Preparation of Complex 6

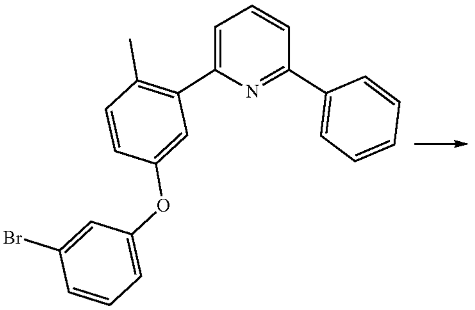

L4

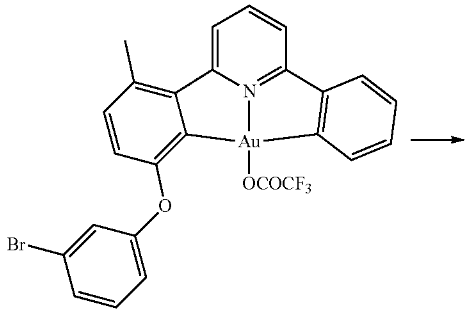

L4-Au(III)OCOCF$_3$

-continued

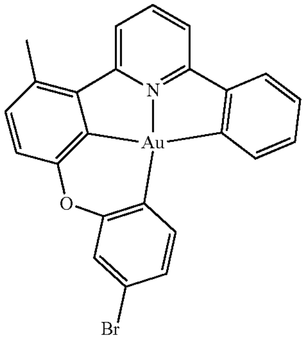

6

$L4\text{-}Au(III)OCOCF_3$ was prepared according to the method used to synthesize $L1\text{-}Au(III)OCOCF_3$ in examples 9-10. In a 10 ml microwave reaction tube, L4-Au(III) $OCOCF_3$ (20 mg, 0.028 mmol) was dissolved in a mixed solvent of $ACN/H_2O$ (v:v=1:1, total 2 ml). The mixture was stirred for 20 min at 115° C. in a microwave. After the reaction, water was added to the mixture and dichloromethane was added to extract the crude product. The collected organic layer was dried with anhydrous magnesium sulfate and removed of solvent using a rotary evaporator. The product was purified through silica gel column chromatography (dichloromethane/hexane). 16 mg of pure complex 6 was obtained with a yield of 92%.

$^1$H NMR (500 MHz, $CD_2Cl_2$): δ 8.22 (dd, J=8.0, 2.0 Hz, 1H), 8.00 (d, J=7.0 Hz, 1H), 7.92 (td, J=8.0, 2.5 Hz, 1H), 7.83 (dd, J=8.5, 3.0 Hz, 1H), 7.76 (d, J=7.5 Hz, 1H), 7.66 (dd, J=8.0, 2.5 Hz, 1H), 7.57 (s, 1H), 7.51 (t, J=7.0 Hz, 1H), 7.33 (t, J=7.5 Hz, 1H), 7.24-7.22 (m, 2H), 7.14 (d, J=8.5 Hz, 1H), 2.70 (s, 3H). ESI-MS: m/z 610.0039 $[M+H]^+$. Elemental analysis calculated for $C_{24}H_{15}AuBrNO+H_2O$: C, 45.88; H, 2.73; N, 2.23; found: C, 46.24; H, 2.56; N, 2.28.

For $L4\text{-}Au(III)OCOCF_3$, $^{19}$F NMR (376 MHz, CD2C12): δ −73.07.

Example 18—Preparation of Complexes 7 and 8

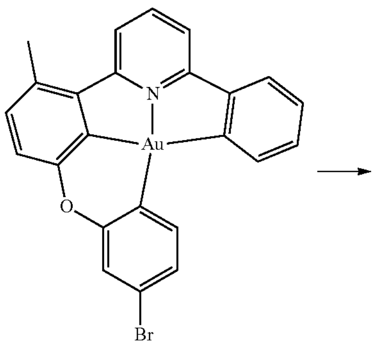

Complex 6

-continued

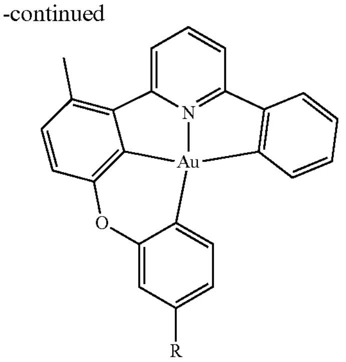

R =

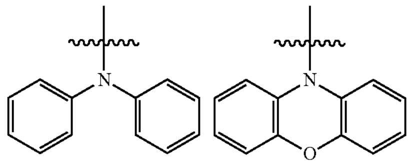

7

8

Preparation of complex 7: A mixture of complex 6 (90 mg, 0.15 mmol) diphenylamine (76.2 mg, 0.45 mmol), $Pd(dba)_2$ (17.3 mg, 0.03 mmol), Binap (37.4 mg, 0.06 mmol) and KOtBu (50.5 mg, 0.45 mmol) was heated to reflux in toluene (35 ml) for 24 hours. After the reaction, the mixture was cooled to room temperature. Water was added to the system, and dichloromethane was added to extract the crude product. The organic layer was collected and dried with anhydrous magnesium sulfate. The pure target was purified through column chromatography on silica gel using dichloromethane and hexane as eluents. 44 mg of pure complex 7 was obtained with a yield of 43%. $^1$H NMR (500 MHz, $CD_2Cl_2$): δ 8.25 (d, J=8.0 Hz, 1H), 8.07 (d, J=7.5 Hz, 1H), 7.94 (t, J=8.0 Hz, 1H), 7.87 (d, J=8.0 Hz, 1H), 7.78 (d, J=7.5 Hz, 1H), 7.70 (d, J=8.0 Hz, 1H), 7.49 (t, J=7.5 Hz, 1H), 7.33-7.28 (m, 5H), 7.17 (d, J=7.0 Hz, 5H), 7.13 (d, J=8.5 Hz, 1H), 7.10 (d, J=2.5 Hz, 1H), 7.06 (t, J=7.5 Hz, 2H), 6.86 (dd, J=8.5, 2.5 Hz, 1H), 2.72 (s, 3H). ESI-MS: m/z 699.1661 $[M+H]^+$. Elemental analysis calculated for $C_{36}H_{25}AuN_2O$: C, 61.90; H, 3.61; N, 4.01; found: C, 61.71; H, 3.61; N, 4.10.

Preparation of complex 8: A mixture of complex 6 (150 mg, 0.25 mmol) and phenoxazine (137.4 mg, 0.75 mmol), $Pd(dba)_2$ (14.4 mg, 0.025 mmol), Binap (31.1 mg, 0.05 mmol), and KOtBu (84.2 mg, 0.75 mmol) was heated to reflux in toluene for 24 hours. After the reaction, the mixture was cooled to room temperature. Water was added to the system, and dichloromethane was added to extract the crude product. The organic layer was collected and dried with anhydrous magnesium sulfate. The pure target was purified through column chromatography on silica gel using dichloromethane and hexane as eluents. 82 mg of pure complex 8 was obtained with a yield of 47%.

$^1$H NMR (500 MHz, $CD_2Cl_2$): δ 8.61 (d, J=8.0 Hz, 1H), 8.13 (dd, J=7.0, 1.0 Hz, 1H), 7.97 (t, J=8.0 Hz, 1H), 7.90 (d, J=8.0 Hz, 1H), 7.81 (dd, J=8.0, 1.0 Hz, 1H), 7.73 (d, J=7.5 Hz, 1H), 7.55 (td, J=7.0, 1.0 Hz, 1H), 7.42 (d, J=2.5 Hz, 1H), 7.36 (td, J=7.5, 1.0 Hz, 1H), 7.29 (d, J=8.5 Hz, 1H), 7.19 (d, J=8.5 Hz, 1H), 7.10 (dd, J=8.0, 2.5 Hz, 1H), 6.70-6.60 (m, 6H), 6.11 (dd, J=7.5, 2.0 Hz, 2H), 2.75 (s, 3H). ESI-MS: m/z 712.1395 $[M]^+$. Elemental analysis calculated for $C_{36}H_{23}AuN_2O_2+H_2O$: C, 59.19; H, 3.45; N, 3.83; found: C, 59.18; H, 3.27; N, 3.92.

It is worth noting that the following complexes with different amino substituents can also be prepared using the same or similar method as in Example 18 with the use of complex 6 as precursor.

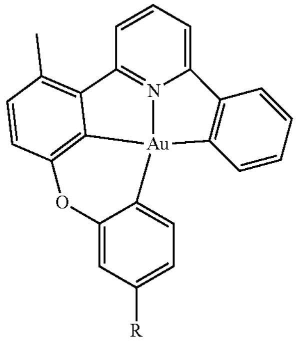
R =
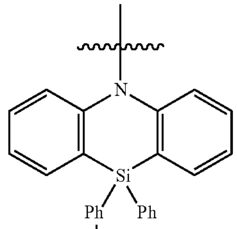
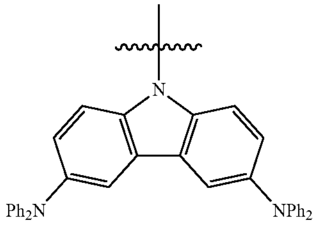
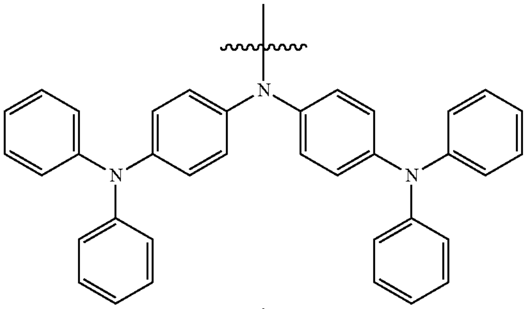
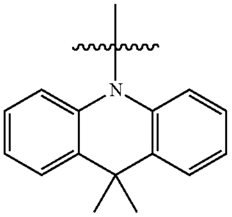
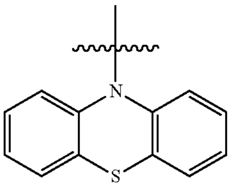
Similarly, based on the synthetic protocols shown in example 9 to example 18, other gold(III) complexes supported by the same or similar tetradentate ligand frameworks or substituted with different substituents can also be prepared.
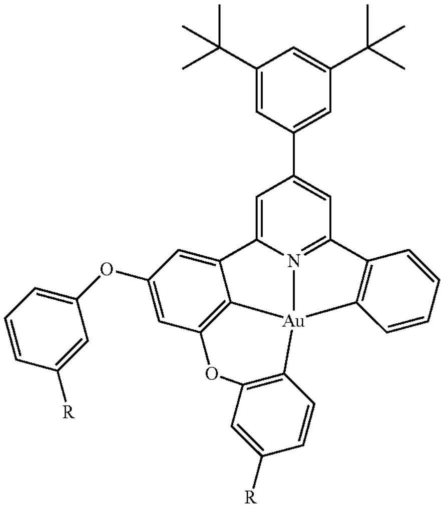
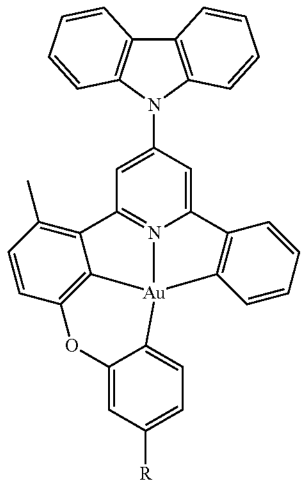
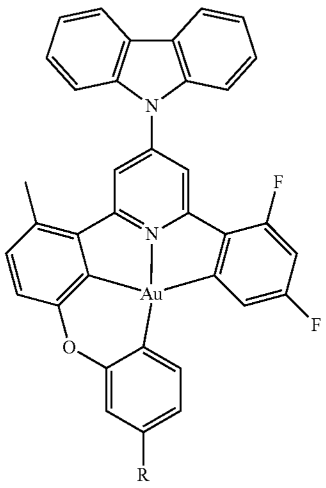

-continued
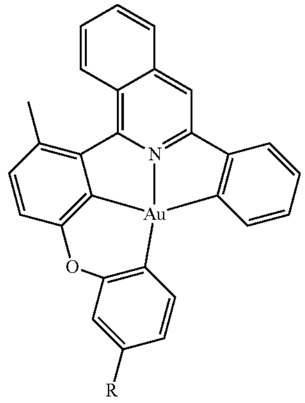
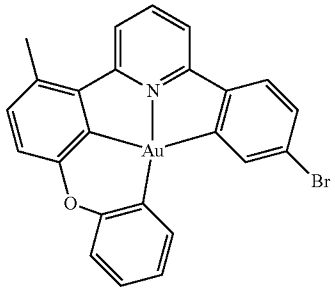
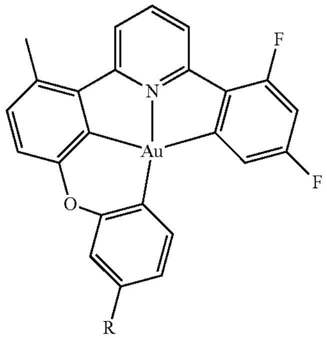
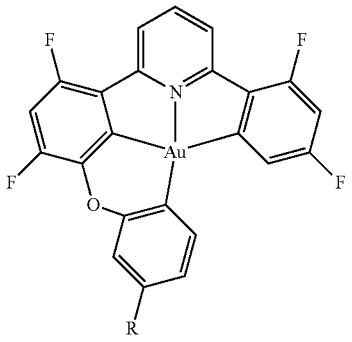
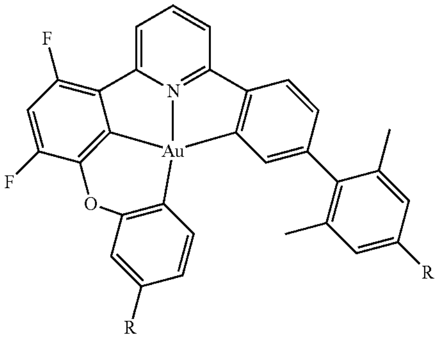
-continued
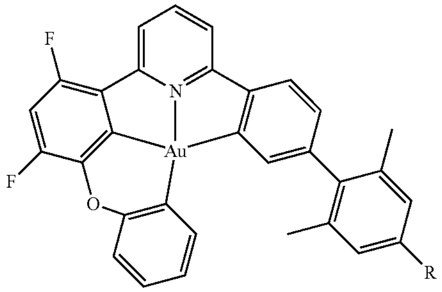
R =
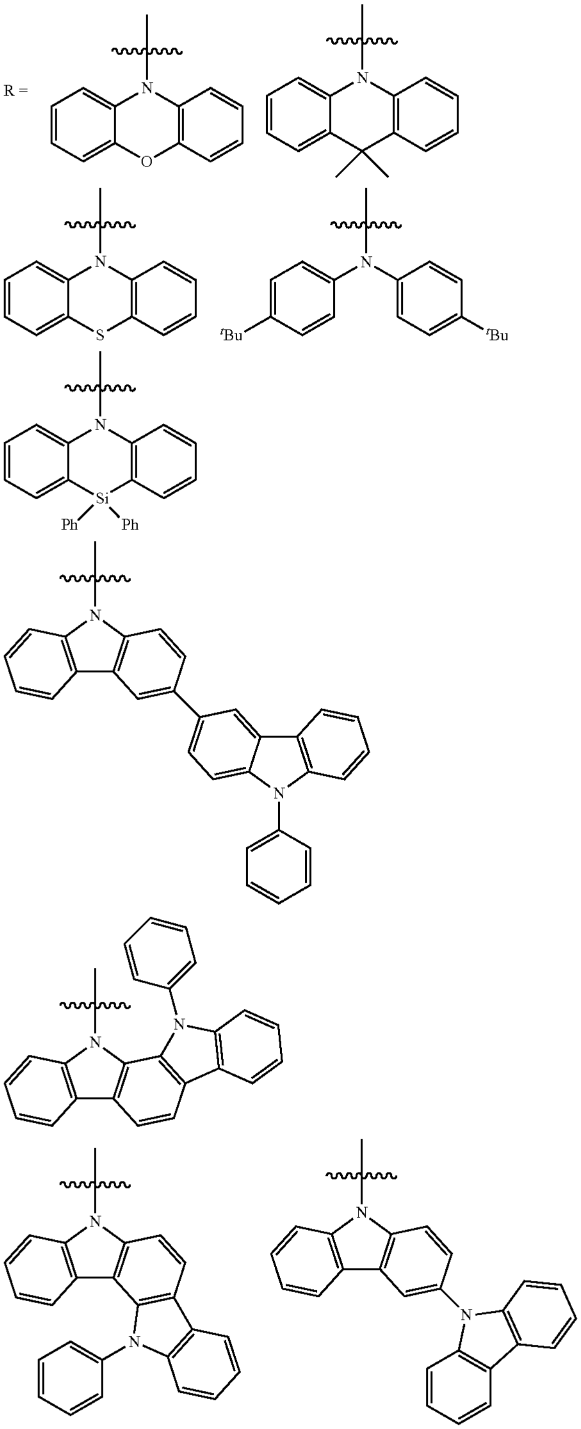

-continued

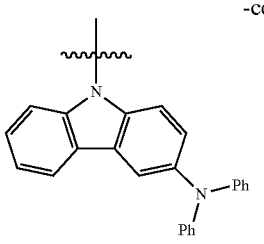

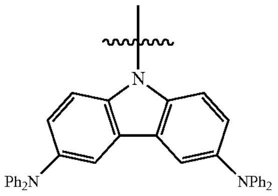

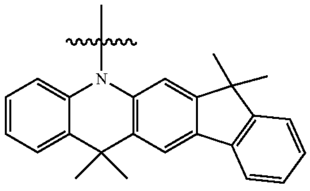

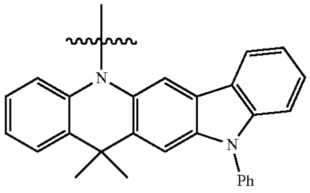

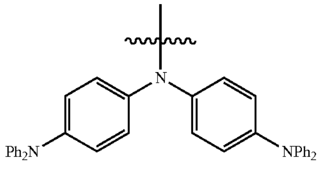

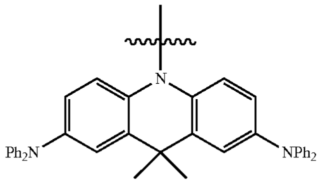

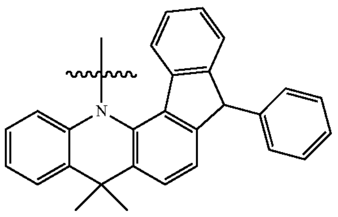

Example 19—Preparation of Complex 9

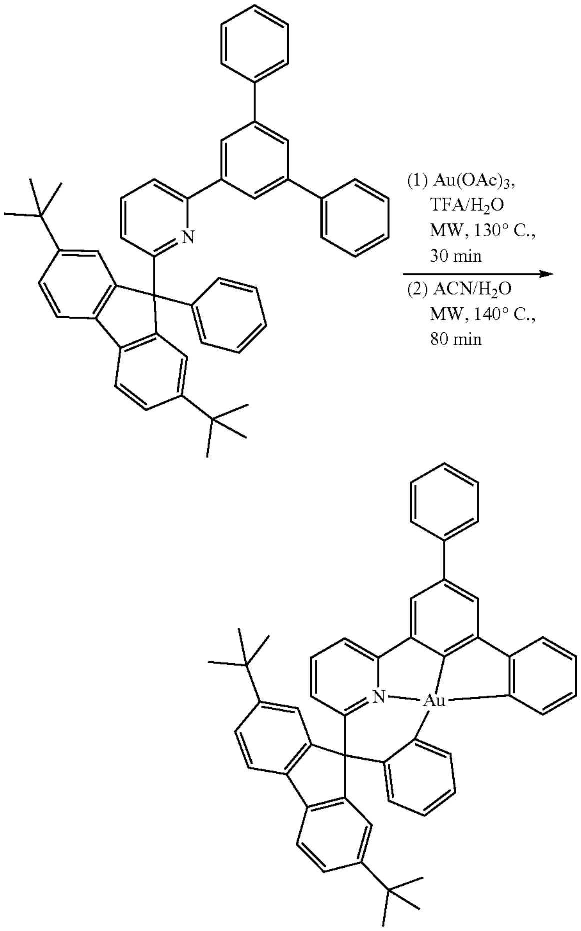

Complex 9

In a 35 ml microwave reaction tube, ligand L5 (35 mg, 0.05 mmol) and $Au(OAc)_3$ (0.02 g, 0.06 mmol) were mixed in a mixed solvent of $TFA/H_2O$ (v:v=1:1, total 12 ml). The mixture was stirred for 30 min at 130° C. in a microwave. After the reaction, the mixture was cooled to room temperature. Water was added to the system and dichloromethane was added to extract the crude product. The organic layer was washed with water 2-3 times until the pH of the water layer was close to neutral. The organic layer was dried with anhydrous magnesium sulfate and removed of organic solvent using a rotary evaporator. The resulting mixture was dissolved in a mixed solvent of $ACN/H_2O$ (v:v=1:1, total 12 ml). Then, the mixture was stirred for 80 min at 140° C. in a microwave. After the reaction, the mixture was cooled to room temperature. Water was added to the system and dichloromethane was added to extract the crude product. The organic layer was dried with anhydrous magnesium sulfate, and then removed of organic solvent using a rotary evaporator. The target was purified through column chromatography on silica gel using dichloromethane and hexane as eluents. 24 mg of pure complex 9 was obtained with a yield of 32%.

$^1H$ NMR (500 MHz, $CD_2Cl_2$): δ 8.29 (d, J=7.0 Hz, 1H), 8.06 (s, 2H), 7.93 (d, J=7.5 Hz, 1H), 7.83 (d, J=8.0 Hz, 1H), 7.76 (s, 1H), 7.72-7.68 (m, 6H), 7.65 (d, J=7.5 Hz, 1H), 7.51

(t, J=7.5 Hz, 2H), 7.46 (dd, J=8.0, 1.5 Hz, 2H), 7.40 (t, J=7.5 Hz, 1H), 7.33 (t, J=7.5 Hz, 1H), 7.25-7.22 (m, 2H), 7.01-6.97 (m, 2H), 6.93-6.89 (m, 1H), 1.25 (s, 18H). $^{13}C$ NMR (125 MHz, $CD_2Cl_2$): δ 181.80, 169.29, 166.53, 162.47, 158.63, 152.28, 151.71, 149.77, 148.35, 143.99, 143.25, 142.35, 141.72, 141.55, 138.65, 138.14, 135.12, 129.25, 128.21, 127.80, 127.71, 127.34, 126.74, 126.06, 125.66, 124.81, 122.88, 122.79, 122.02, 121.39, 120.30, 119.59, 75.37, 35.46, 31.60. ESI-MS: m/z 854.3043 $[M+H]^+$. Elemental analysis calculated for $C_{50}H_{42}AuN$: C, 70.33; H, 4.96; N, 1.64; found: C, 70.25; H, 5.27; N, 1.64.

Example 20—Preparation of Complex 9

In a 35 ml microwave reaction tube, ligand L5 (35 mg, 0.05 mmol), $Au(OAc)_3$ (0.02 g, 0.06 mmol) and sodium trifluoroacetate (0.04 g, 0.29 mmol) were mixed in mixed solvent of $AcOH/H_2O$ (v:v=2:1, total 12 ml). The mixture was stirred for 25 min at 170° C. in a microwave. After the reaction, the mixture was cooled to room temperature. Water was added to the system, and dichloromethane was added to extract the crude precursor. The organic layer was collected and then washed with water 2-3 times until the pH of the water layer was close to neutral. The organic layer was dried with anhydrous magnesium sulfate and removed of organic solvent using a rotary evaporator. Then, the resulting mixture was dissolved in a mixed solvent of $ACN/H_2O$ (v:v=1:2, total 12 ml) and then was stirred for 80 min at 130° C. in a microwave. After the reaction, the mixture was cooled to room temperature. Water was added to the system and dichloromethane was added to extract the crude product. The collected organic layer was dried with anhydrous magnesium sulfate, and then removed of organic solvent using a rotary evaporator. The target was purified through column chromatography on silica gel using dichloromethane and hexane as eluents. 29 mg of pure complex 9 was obtained with a yield of 39%.

Similarly, based on the synthetic protocols of gold(III) complexes supported by the same or similar ligand frameworks or substituted with different substituents, other gold (III) complexes supported by the similar tetradentate frameworks can also be prepared, as shown in the following:

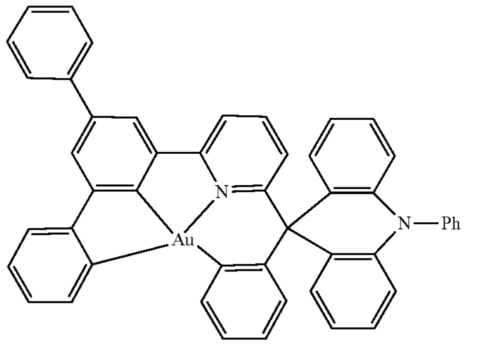

-continued

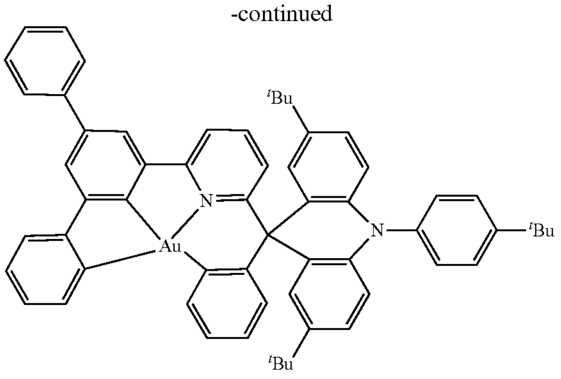

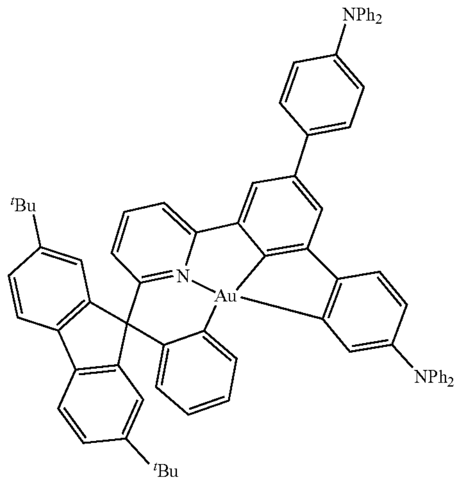

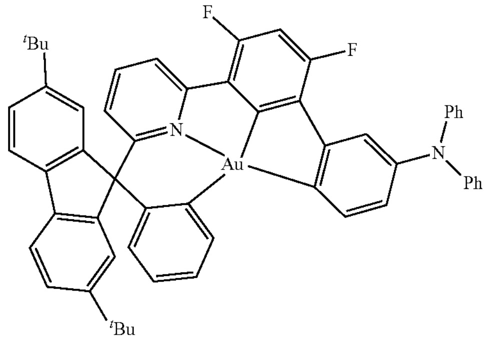

Example 21—Photophysical Properties of Complexes 1-8

Measurement of UV-Vis absorption spectra: the complex was dissolved in the solvent at a concentration of $2\times10^{-5}$ mol/L. After deoxygenation of the complex solution, the absorption spectrum of the complex was measured at room temperature using the machine "Hewlett-Packard 8453 diode array spectrophotometer". Measurement of emission spectra: emission spectra recorded in four different media, in which conditions 1)-3) were all measured with the instrument "Horiba Fluorolog-3 spectrophotometer". 1) Solution-state emission: the complex was dissolved in the solvent at a concentration of $2\times10^{-5}$ mol/L. After deoxygenation of the complex solution, the emission spectrum of the complex in solution was measured at room temperature. 2) Solid-state emission: the solid of the complex was put in a quartz tube with an inner diameter of 4 mm. The solid-state emission spectra of the complex were measured at both room temperature and 77 K (in liquid nitrogen). 3) Glassy-state emission: a very small amount of the complex was dissolved in a mixed solvent (ethanol/methanol/dichloromethane=4:1:1, solvent volume ratio), and the prepared solution was placed into a quartz tube with an inner diameter of 4 mm. The emission spectrum of glassy-state emission was measured at 77 K (in liquid nitrogen). 4) The complex and PMMA were dissolved in chlorobenzene to obtain a transparent solution with a mass fraction of 4 wt % of the complex. 50 μL of the solution was dropped on a quartz plate with a size of 1 cm×1 cm×0.1 cm. It was dried at 80° C. and a transparent quartz plate containing 4 wt % of the complex in PMMA was obtained. The emission of the complex in PMMA thin film was measured at room temperature using the instrument "Hamamatsu C11347 Quantaurus-QY Absolute PL quantum yields measurement system". Measurement of emission lifetime (τ): emission lifetimes were measured using the instrument "Quanta Ray GCR 150-10 pulsed Nd:YAG laser system".

Figure 2:
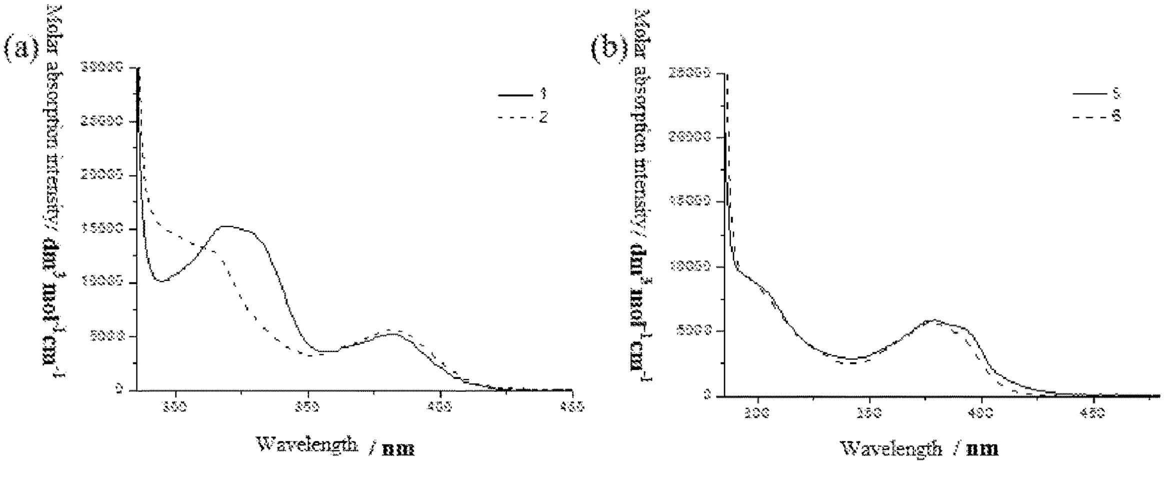
FIG. 2 shows the absorption spectra of (a) complexes 1 and 2 and (b) complexes 5 and 6 in deoxygenated toluene (the complex concentration is $2\times10^{-5}$ mol/L) at room temperature in an embodiment of the present invention.
Figure 3:
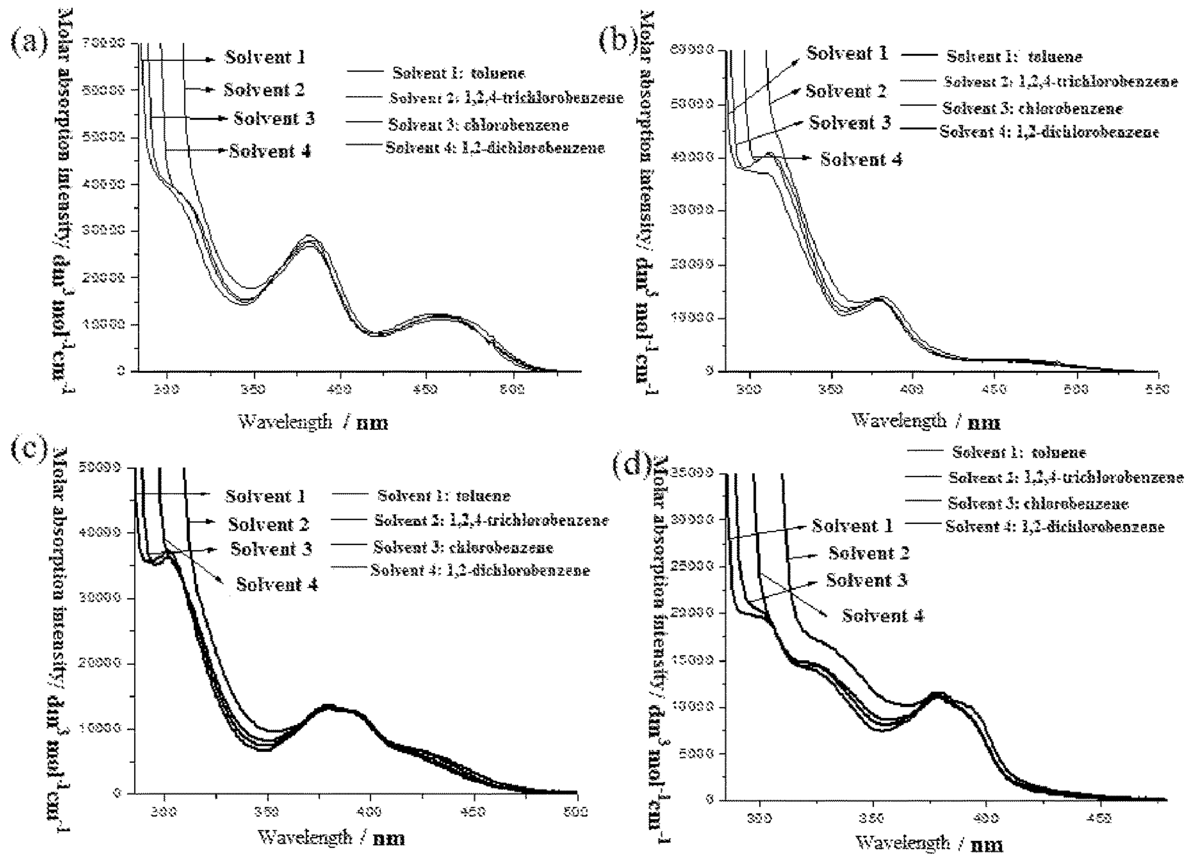
FIG. 3 shows the absorption spectra of (a) complex 3, (b) complex 4, (c) complex 7 and (d) complex 8 in different deoxygenated solvents (the complex concentration is $2\times10^{-5}$ mol/L) at room temperature in an embodiment of the present invention.
Figure 4:
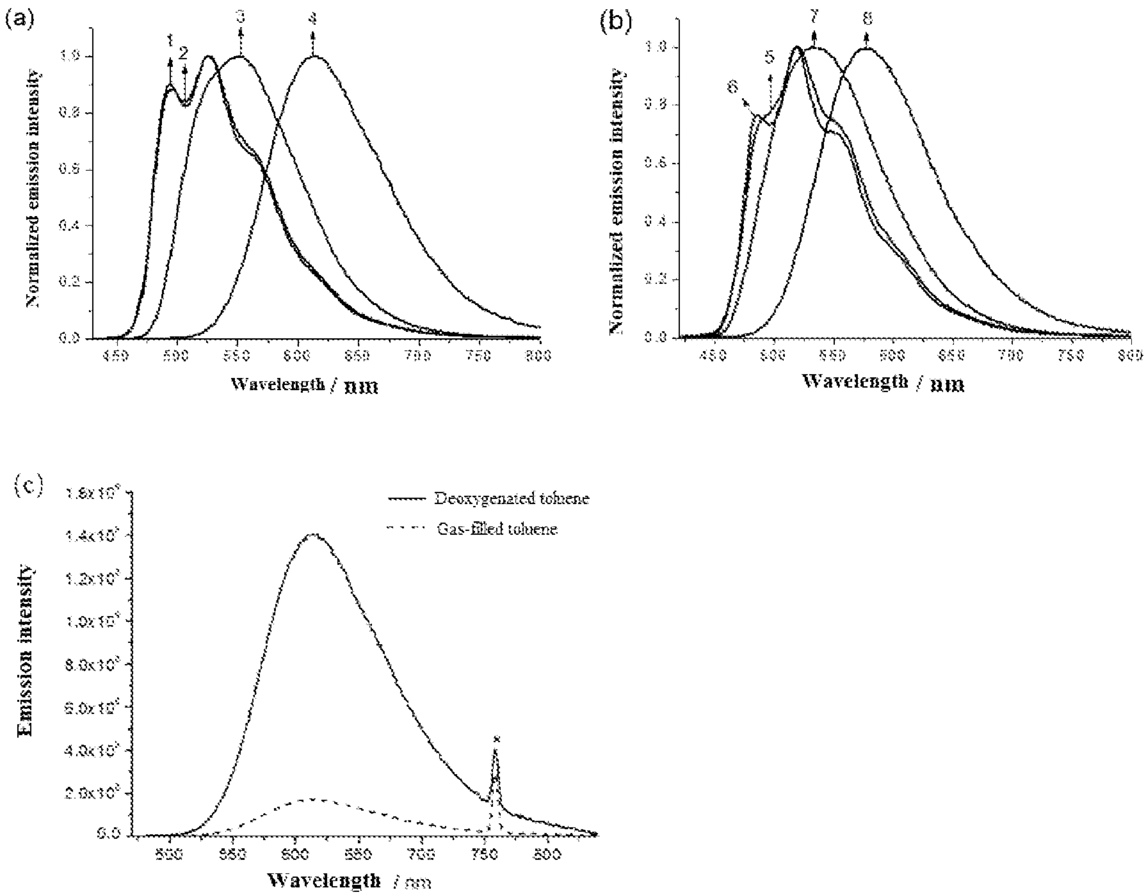
FIG. 4 shows the emission spectra of (a) complexes 1-4 and (b) complexes 5-8 in deoxygenated toluene (the complex concentration is $2\times10^{-5}$ mol/L) at room temperature; emission spectra of (c) complex 4 in deoxygenated/aerated toluene at a concentration of 2×10−5 mol/L (the asterisk "*" indicates second order diffraction of the excitation wavelength of 380 nm) at room temperature in an embodiment of the present invention.
Figure 5:
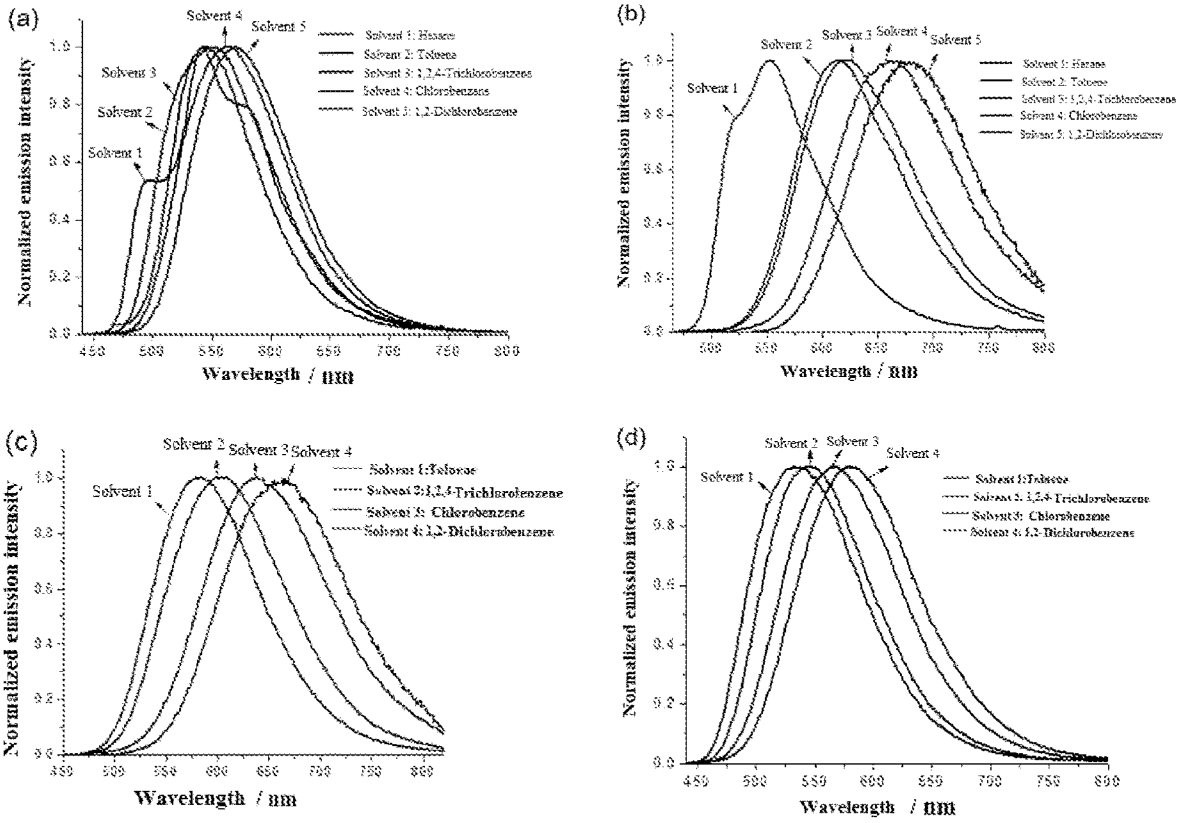
FIG. 5 shows the emission spectra of (a) complex 3, (b) complex 4, (c) complex 7 and (d) complex 8 in different deoxygenated solvents (the complex concentration is $2\times10^{-5}$ mol/L) at room temperature in an embodiment of the present invention.
Figure 6:
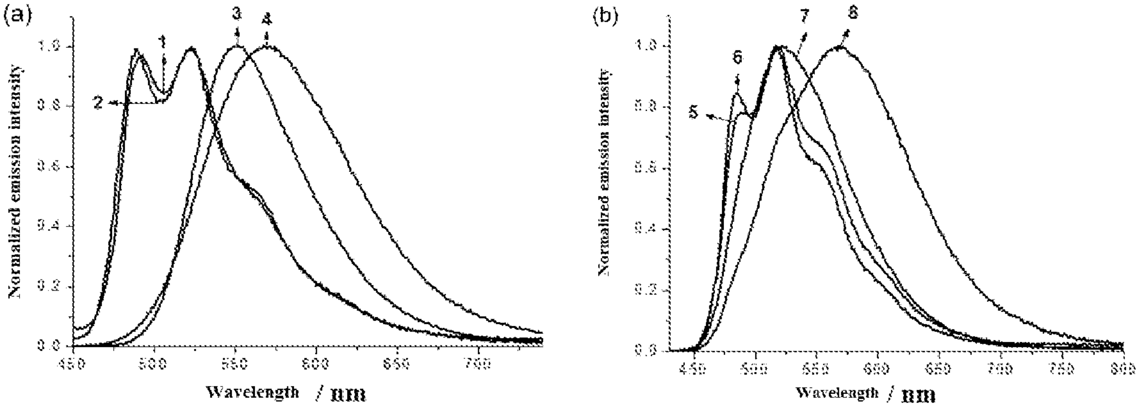
FIG. 6 shows the emission spectra of (a) complexes 1-4 and (b) complexes 5-8 in PMMA thin films (with 4 wt % of $Au^{III}$ complex) at room temperature in an embodiment of the present invention.
Figure 7:
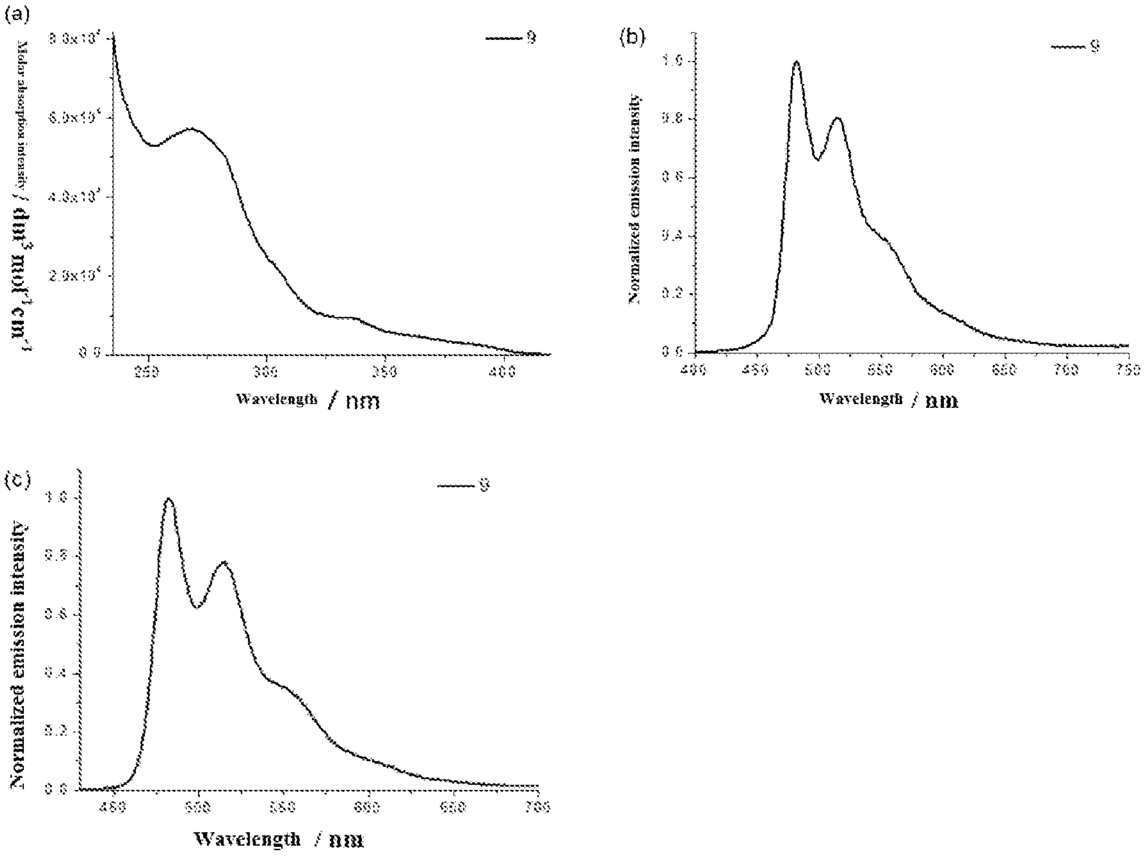
FIG. 7 shows the absorption spectrum (a) and emission spectrum (b) of complex 9 in deoxygenated dichloromethane (the complex concentration is $2\times10^{-5}$ mol/L) at room temperature; emission spectrum (c) of complex 9 in PMMA thin films (with 4 wt % of $Au^{III}$ complex) at room temperature in an embodiment of the present invention.
Figure 8:
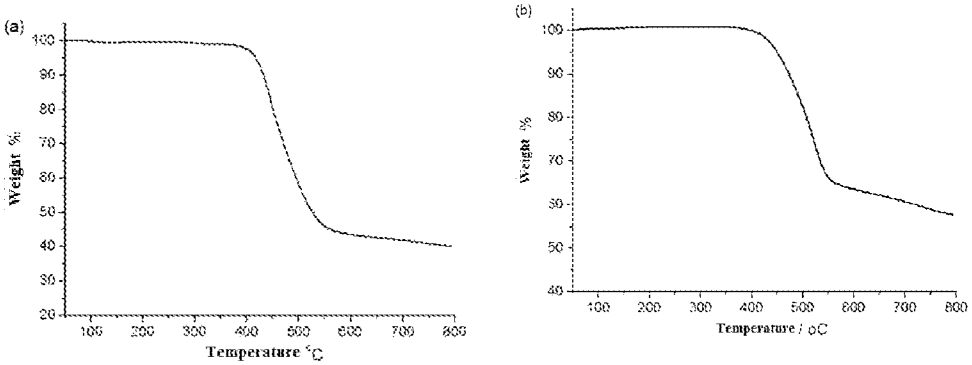
FIG. 8 shows the TGA thermograms of complexes 3 and 4, in which (a) complex 3 shows a 2 wt % weight loss at 394° C.; (b) complex 4 shows a 2 wt % weight loss at 429° C. in an embodiment of the present invention.

The results are shown in FIG. 2-8. FIG. 2 shows, in an embodiment of the present invention, the absorption spectra of (a) complexes 1 and 2 and (b) complexes 5 and 6 in deoxygenated toluene solution (the complex concentration is $2\times10^{-5}$ mol/L) at room temperature; FIG. 3 shows, in an embodiment of the present invention, the absorption spectra of (a) complex 3, (b) complex 4, (c) complex 7, and (d) complex (8) in different deoxygenated solvents (the complex concentration is $2\times10^{-5}$ mol/L) at room temperature; FIG. 4 shows, in an embodiment of the present invention, the emission spectra of (a) complexes 1-4 and (b) complexes 5-8 in deoxygenated toluene (the complex concentration is $2\times10^{-5}$ mol/L) at room temperature, the emission spectra of (c) complex 4 in deoxygenated/aerated toluene at a concentration of $2\times10^{-5}$ mol/L at room temperature (the asterisk "*" represents the second-order transmission of the excitation wavelength of 380 nm); FIG. 5 shows, in an embodiment of the present invention, the emission spectra of (a) complex 3, (b) complex 4, (c) complex 7, and (d) complex (8) in different deoxygenated solvents (the complex concentration is $2\times10^{-5}$ mol/L) at room temperature; FIG. 6 shows, in an embodiment of the present invention, the emission spectra of (a) complexes 1-4 and (b) complexes 5-8 in PMMA thin films (4 wt % of the Au(III) complex doped in PMMA) at room temperature; FIG. 7 shows, in an embodiment of the present invention, the absorption (a) and emission (b) spectra of complex 9 in deoxygenated dichloromethane (the complex concentration is $2\times10^{-5}$ mol/L) at room temperature, and emission spectrum (c) of complex 9 in PMMA thin film (4 wt % of the complex doped in PMMA) at room temperature; FIG. 8 shows the TGA thermograms of complexes 3 and 4 in an embodiment of the present invention, in which (a) complex 3 shows 2 wt % weight loss at 394° C. and (b) complex 4 shows 2 wt % weight loss at 429° C.; FIG. 2 and FIG. 3 shows that in toluene, complexes 1-8 show intense absorption bands at 300-330 nm [$\varepsilon=(1\text{-}4)\times10^4$ $dm^3mol^{-1}cm^{-1}$], and moderately intense absorption bands at 380-400 nm [$\varepsilon=(5\text{-}29)\times10^3$ $dm^3mol^{-1}dm^{-1}$]. For complexes 3, 4, 7 and 8, broad and weak absorption bands at 420-500 nm were also observed. These broad and weak absorption bands are ascribed to the intraligand charge transfer transition ($^1$ILCT) from π (diphenylamine or phenoxazine) to π* (C^C^N^C ligand).

As shown in FIG. 3, the absorption spectra of complexes 3, 4, 7 and 8 are almost insensitive to solvent polarity with negligible changes in spectral shifts but minor changes in absorption intensity.

As shown in FIG. 4, complexes 1-8 exhibit three different types of emission profiles: complexes 1-2 and 5-6 display vibronic emission bands with emission quantum yields of up to 54% and emission lifetimes of up to 225 μs. Their radiative decay rate constants ($k_r$) are small, ranging from $1.2\times10^3$ to $5.8\times10^3$ $s^{-1}$. Therefore, supported by large Stokes shift, vibronic-structured emission bands and small radiative decay rate constants $k_r$ (~$10^3$ $s^{-1}$), the emission of complexes 1-2 and 5-6 is assigned as phosphorescence stemming from metal-perturbed intraligand π to π* transitions ($^3$IL) of the [C^C^N^C] ligand; on the other hand, the comparison made in complexes 2, 3, 4 or complexes 5, 6 or complexes 7, 8 shows that these complexes have similar C^C^N^C framework but they show completely different emission properties. Complexes 3, 4, 7, and 8 show structureless, broad emission bands with relatively large radiative decay rate constants. That means that the introduction of amino groups changes emission properties. For complex 3, the emission is sensitive towards solvent polarity with red-shifted emission maxima from 550 nm in toluene to 570 nm in 1,2-dichlorobenzene, suggesting the emissive excited state with significant charge transfer character. Together with featureless broad emission bands, long emission lifetimes and moderate radiative decay rate, the emission of 3 is derived from $^3$ILCT [π(diphenylamine) to π*(C^C^N^C)] excited state. Taking complex 4 as an example, the solvent is changed from toluene to 1,2-dichlorobenzene and the emission maximum is red-shifted by 66 nm, indicating that its emissive excited state also has significant charge transfer character. The emission of complex 4 was also collected in deoxygenated toluene and aerated toluene. As shown in FIG. 4(*c*), the emission intensity in aerated condition is much lower than that in degassed toluene, indicating that triplet excited states are involved in the emission mechanism. Together with broad emission bands, short emission lifetimes (shorter than 1 μs) and relatively large radiative decay rate $k_r$, the emission of complex 4 is assigned as thermally activated delayed fluorescence (TADF) originating from the intraligand charge transfer transition ($^1$ILCT) [π (N-substituent)→π* (C^C^N^C ligand)].

Gold(III) complexes supported by amino-substituted tetradentate ligand shown in the present invention display short emission lifetimes and $^3$ILCT or thermally activated delayed fluorescence (TADF) emission properties.

Photophysical properties of complexes 1-8 at room temperature were shown in Table 1 below.

TABLE 1

| Complex | Absorption In degassed toluene $\lambda_{abs}$ [nm] (ε [×10$^3$ mol$^{-1}$ dm$^3$ cm$^{-1}$])[a] | Emission: In degassed toluene $\lambda_{em}$ [nm] (Φ, τ [μs]; $k_r$ [10$^3$ s$^{-1}$])[b] | Emission: 4 wt % in PMMA thin film $\lambda_{em}$ [nm] (Φ, τ [μs]; $k_r$ [10$^3$ s$^{-1}$])[c] |
|---|---|---|---|
| 1 | 317 (15.16), 331 (14.20), 381 (5.21) | 495, 526, 565 (0.54; 93.07; 5.80) | 492, 523, 560 (0.20; 43.77; 4.57) |
| 2 | 315 (12.75), 381 (5.60) | 498, 526, 567 (0.40; 77.11; 5.19) | 490, 522, 562 (0.04; 90.06; 0.44) |
| 3 | 302 (38.73), 382 (29.02), 456 (br, 12.29) | 524, 550 (0.77; 94.34; 8.16) | 550 (0.47; 56.81; 8.27) |
| 4 | 311 (37.04), 380 (13.35), 465 (br, 2.07)[a] | 612 (0.47; 0.62; 758.06) | 570 (0.62; 1.82; 340.66) |
| 5 | 304 (8.09), 379 (5.89), 394 (5.00) | 493, 521 (0.28; 225.18; 1.24) | 489, 519, 555 (0.056; 147; 0.38) |
| 6 | 300(8.53), 378 (5.70), 390 (4.75) | 485, 518, 552 (0.26; 152.21; 1.71) | 486, 518, 555 (0.06; 90.38; 0.66) |
| 7 | 301 (37.06), 380(13.26), 393 (12.32), 424 (br, 6.68) | 533 10.94; 1.61; 583.85) | 523 (0.45; 3.43; 131.20) |
| 8 | 303 (19.28), 325 (13.88), 378 (10.98), 391 (9.21), 422 (br, 1.16) | 580 (0.74; 0.79; 936.71) | 568 (0.27; 1.06; 254.72) |

[a]ε was measured when the concentration of complexes 1-8 in deoxygenated toluene was 2 × 10$^{-5}$ mol/L,
[b]emission quantum yields (Φ) of complexes 1-8 were measured in degassed toluene (the complex concentration was 2 × 10$^{-5}$ mol/L) using Hamamatsu C11347 Quantaurus-QY Absolute PL photoluminescence absolute quantum yield measurement system;
τ refers to emission lifetime;
$k_r$ represents radiative decay rate constant,
[c]emission quantum yield of thin-film samples (containing 4 wt % tetradentate Au(III) complexes) was measured using Hamamatsu C11347 Quantaurus-QY Absolute PL photoluminescence absolute quantum yield measurement system.

2) the absorption of complex 9 in deoxygenated dichloromethane at a concentration of 2×10$^{-5}$ mol/L was shown on here: absorption maxima with corresponding absorption coefficient ε [×10$^3$ mol$^{-1}$ dm$^3$ cm$^{-1}$] 269 (57.08), 282 (50.48), 304 (22.33), 335 (9.24), 359 (4.99), 389 (2.52). The emission maxima of complex 9 in deoxygenated dichloromethane at a concentration of 2×10$^{-5}$ mol/L locate at 483, 515, 555 nm.

3) The solvent effect on emission of complexes 3, 4, 7, and 8 (in different solvents) is shown in FIG. 5. Photophysical properties of complexes 3 and 4 are shown in Table 2 below.

TABLE 2

| Complex | Medium | Emission $\lambda_{max}$ [nm] | τ [μs] | ϕ [%] | $k_r$ [s$^{-1}$] × 10$^5$ | $k_{nr}$ [s$^{-1}$] × 10$^5$ |
|---|---|---|---|---|---|---|
| 3 | Toluene | 524,550 | 94.34 | 77 | 0.08 | 0.02 |
| | 1,2,4-Trichlorobenzene | 544 | 50.11 | 66 | 0.13 | 0.07 |
| | Chlorobenzene | 562 | 41.49 | 74 | 0.18 | 0.06 |
| | o-dichlorobenzene | 570 | 31.84 | 86 | 0.27 | 0.04 |
| 4 | Toluene | 612 | 0.62 | 47 | 7.58 | 8.55 |
| | 1,2,4-Trichlorobenzene | 624 | 0.55 | 46 | 8.36 | 9.82 |
| | Chlorobenzene | 660 | 0.14 | 11 | 7.86 | 63.57 |
| | o-dichlorobenzene | 678 | 0.075 | 5 | 6.67 | 126.67 |

The data of complexes 7 and 8 are shown in Table 3 below.

TABLE 3

| Complex | Medium | Emission $\lambda_{max}$ [nm] | τ [μs] | ϕ [%] | $k_r$ [s$^{-1}$] × 10$^5$ | $k_{nr}$ [s$^{-1}$] × 10$^5$ |
|---|---|---|---|---|---|---|
| 7 | Toluene | 533 | 1.61 | 94 | 5.84 | 9.63 |
| | 1,2,4-Trichlorobenzene | 546 | 0.85 | 87 | 10.24 | 1.53 |
| | Chlorobenzene | 565 | 0.67 | 87 | 12.99 | 1.94 |
| | o-dichlorobenzene | 580 | 0.57 | 87 | 15.26 | 2.28 |
| 8 | Toluene | 580 | 0.79 | 74 | 9.37 | 0.28 |
| | 1,2,4-Trichlorobenzene | 606 | 0.65 | 55 | 8.46 | 0.53 |
| | Chlorobenzene | 640 | 0.17 | 14 | 8.24 | 50.59 |
| | o-dichlorobenzene | 661 | 0.076 | 5 | 6.58 | 125.00 |

Example 22—General Procedure for Preparing the Device a) A pre-patterned ITO transparent glass substrate was ultrasonically cleaned with detergent and rinsed with deionized water, then sequentially cleaned in an ultrasonic bath of deionized water, acetone and isopropanol, and dried for later use;

b) The dried substrate was transferred to a vacuum chamber, and sequentially deposited through thermal evaporation to obtain multiple functional layers with predetermined thickness in the OLED successively; and c) Finally, LiF and Al (cathode) were sequentially deposited on the electron transport layer film by vacuum thermal evaporation.

The measurement conditions of each parameter are:

The thickness of each material layer of vacuum deposition was monitored in situ using a quartz oscillation film thickness meter. EL spectrum, brightness, Commission internationale de l'éclairage (CIE) and electroluminescence efficiency were measured by Photo Research Inc PR-655 or Hamamatsu photonics absolute external quantum efficiency measurement system. Voltage-current characteristic was measured using Keithley 2400 power supply. All devices were characterized in an atmospheric environment under unpackaged conditions.

Example 23—Complex 4 as an Emissive Dopant in OLED

Complex 4 was used as an emissive dopant with doping concentrations of 4 wt %, 8 wt % and 16 wt %. The structure of the OLED device from anode to cathode was in turn: ITO/HAT-CN (5 nm)/TAPC(50 nm)/TCTA: Complex 4 (doping concentration, 10 nm)/TmPyPb (50 nm)/LiF (1.2 nm)/Al (100 nm). The corresponding OLED devices were fabricated according to the general preparation method provided in Example 22 and predetermined structural component parameters, wherein the detailed procedures are shown on here:

a) A pre-patterned ITO transparent glass substrate was ultrasonically cleaned with detergent and rinsed with deionized water, then sequentially cleaned in an ultrasonic bath of deionized water, acetone and isopropanol, and dried for later use;

b) The dried substrate was transferred to a vacuum chamber, and sequentially deposited through thermal evaporation to obtain multiple functional layers with predetermined thickness in the OLED successively, including: HAT-CN (hole injection layer) with a thickness of 5 nm, TAPC (hole transport layer HTL) with a thickness of 50 nm, TCTA (light emitting layer EML) with a thickness of 10 nm which was doped with 4 wt %, 8 wt % and 16 wt % of complex 4 respectively, TmPyPb (electron transport layer ETL) with a thickness of 50 nm;

c) Finally, LiF with a thickness of 1.2 nm (electron injection layer) and Al with a thickness of 100 nm (cathode) were sequentially deposited on the electron transport layer film by vacuum thermal evaporation to obtain the OLED devices.

It should be noted that the doping concentration=the mass of the guest material/(the mass of the guest material+the mass of the host material)×100%.

Figure 9:
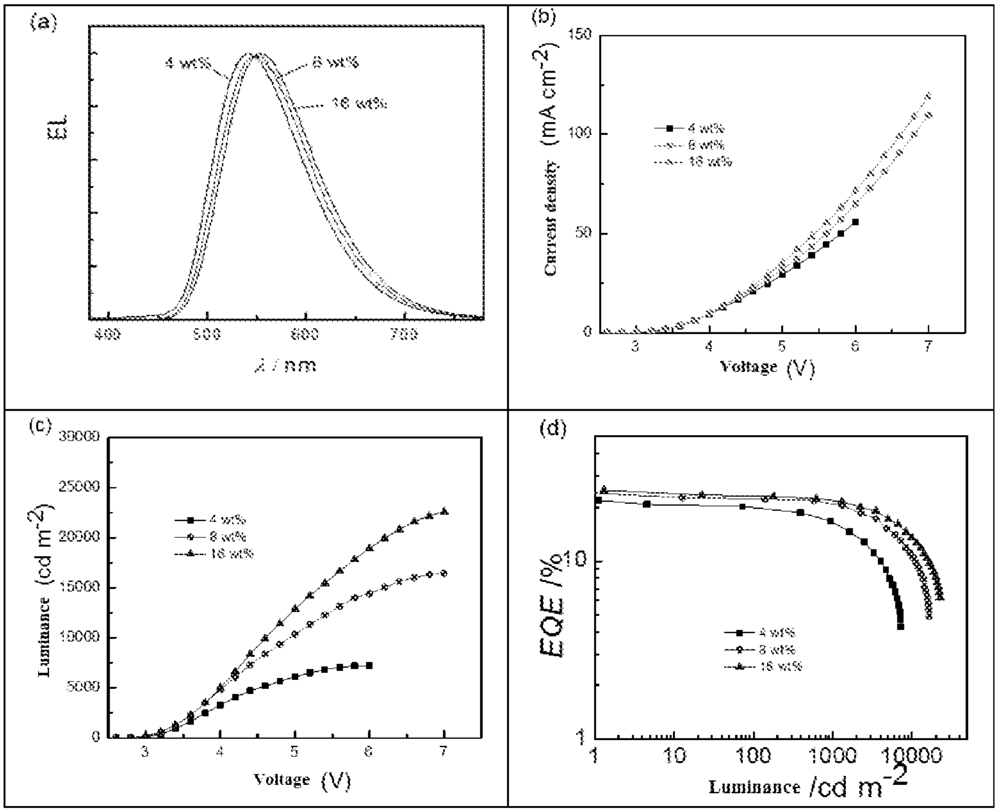
FIG. 9 shows the performance of OLED devices prepared by using complex 4 as a dopant in an embodiment of the present invention: (a) emission spectra of the 4-based devices with different doping concentrations; (b) current density-voltage characteristics of the 4-based devices with different doping concentrations; (c) luminance-voltage characteristics of the 4-based devices with different doping concentrations; (d) EQE-luminance characteristics of OLEDs based on complex 4 with different doping concentrations.

Finally, the performance of the OLED device based on complex 4, such as voltage-current characteristics, EL spectrum, luminance, efficiency and Commission internationale de l'éclairage (CIE), was measured. And the data are shown on Table 4 and FIG. 9.

TABLE 4

Electroluminescent properties of the 4-based devices

| Serial number | dopant concentration (wt %) | L [cd $m^{-2}$][a] | CE[cd $A^{-1}$][b] Max | CE 1000 cd $m^{-2}$ | PE[lm $W^{-1}$][c] Max | PE 1000 cd $m^{-2}$ | EQE[%][d] Max | EQE 1000 cd $m^{-2}$ | CIE[(x,y)][e] |
|---|---|---|---|---|---|---|---|---|---|
| 1 | 4 | 7300 | 76.10 | 53.23 | 91.98 | 49.18 | 21.99 | 16.79 | 0.38, 0.56 |
| 2 | 8 | 16500 | 70.82 | 64.44 | 81.73 | 62.38 | 24.37 | 21.21 | 0.40, 0.55 |
| 3 | 16 | 22700 | 77.78 | 67.48 | 94.00 | 63.72 | 25.03 | 22.01 | 0.43, 0.54 |

[a]Maximum luminance;
[b]Current efficiency;
[c]Power efficiency;
[d]External quantum efficiency;
[e]CIE coordinates at a luminance of 1000 cd $m^{-2}$; CIE refers to Commission internationale de l'éclairage.

As shown in Table 4, green electroluminescence, maximum current efficiency of 70-80 cd $A^{-1}$, maximum external quantum efficiency of up to 25%, external quantum efficiency of up to 22% at a luminance of 1000 cd $m^{-2}$ and efficiency roll-offs down to 12.1% have been achieved. As increasing the doping concentration from 4% to 8%, maximum luminance, current efficiency, external quantum efficiency and efficiency roll-offs were significantly changed. Small changes were observed when the dopant concentration was increased to 16%.

Example 24—Complex 7 as an Emissive Dopant in OLEDs (The Investigation on the Doping Concentration)

Figure 10:
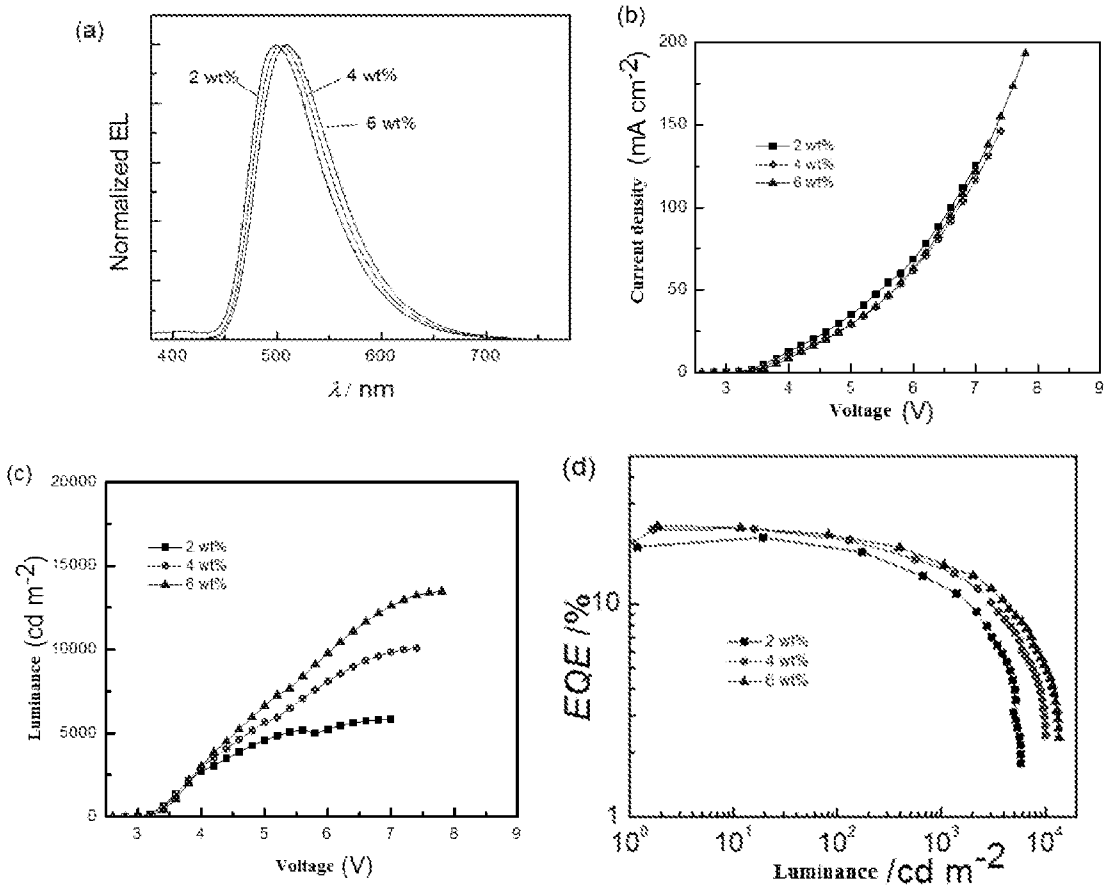
FIG. 10 shows the performance of OLED devices prepared by using complex 7 as an emissive dopant in an embodiment of the present invention.

Complex 7 was used as an emissive dopant with doping concentrations of 2 wt %, 4 wt % and 6 wt %. The structure of the OLED device from anode to cathode was in turn: ITO/HAT-CN (5 nm)/TAPC (40 nm)/TCTA: Complex 7 (20 nm)/TmPyPb (50 nm)/LiF (1.2 nm)/Al (100 nm). With reference to Example 23, the OLED devices based on complex 7 were fabricated based on the general preparation method provided in Example 22 and predetermined structural component parameters. Finally, the performance of the OLED device based on complex 7, such as voltage-current characteristics, EL spectrum, luminance, efficiency and Commission internationale de l'éclairage (CIE), was measured. And the data are shown on Table 5 and FIG. 10.

TABLE 5

Electroluminescent properties of the 7-based devices

| Serial number | dopant concentration (wt %) | L [cd $m^{-2}$][a] | CE[cd $A^{-1}$][b] Max | CE[cd $A^{-1}$][b] 1000 cd $m^{-2}$ | PE[lm $W^{-1}$][c] Max | PE[lm $W^{-1}$][c] 1000 cd $m^{-2}$ | EQE[%][d] Max | EQE[%][d] 1000 cd $m^{-2}$ | CIE[(x,y)][e] |
|---|---|---|---|---|---|---|---|---|---|
| 1 | 2% | 5850 | 55.89 | 33.14 | 59.85 | 30.50 | 20.68 | 12.26 | 0.23, 0.48 |
| 2 | 4% | 11000 | 66.99 | 42.27 | 75.15 | 38.69 | 22.71 | 15.35 | 0.25, 0.51 |
| 3 | 6% | 13500 | 69.34 | 45.60 | 75.31 | 39.81 | 23.52 | 15.44 | 0.26, 0.54 |

[a]Maximum luminance;
[b]Current efficiency;
[c]Power efficiency;
[d]External quantum efficiency;
[e]CIE coordinates at a luminance of 1000 cd $m^{-2}$; CIE refers to Commission internationale de l'éclairage.

As shown in Table 5, high-efficiency blue-green electroluminescence, maximum current efficiency of 56-70 cd $A^{-1}$ and maximum external quantum efficiency of up to 23% have been achieved at a lower doping concentration. A further increase in the doping concentration has a negligible impact on EQE, PE and CE. At a practical luminance of 1000 cd $m^{-2}$, EQE can be maintained at 12-16% in these devices.

Example 25—Complex 7 as an Emissive Dopant in OLED Devices (HTL/Co-Host Material/Doping Concentration)

Figure 11:
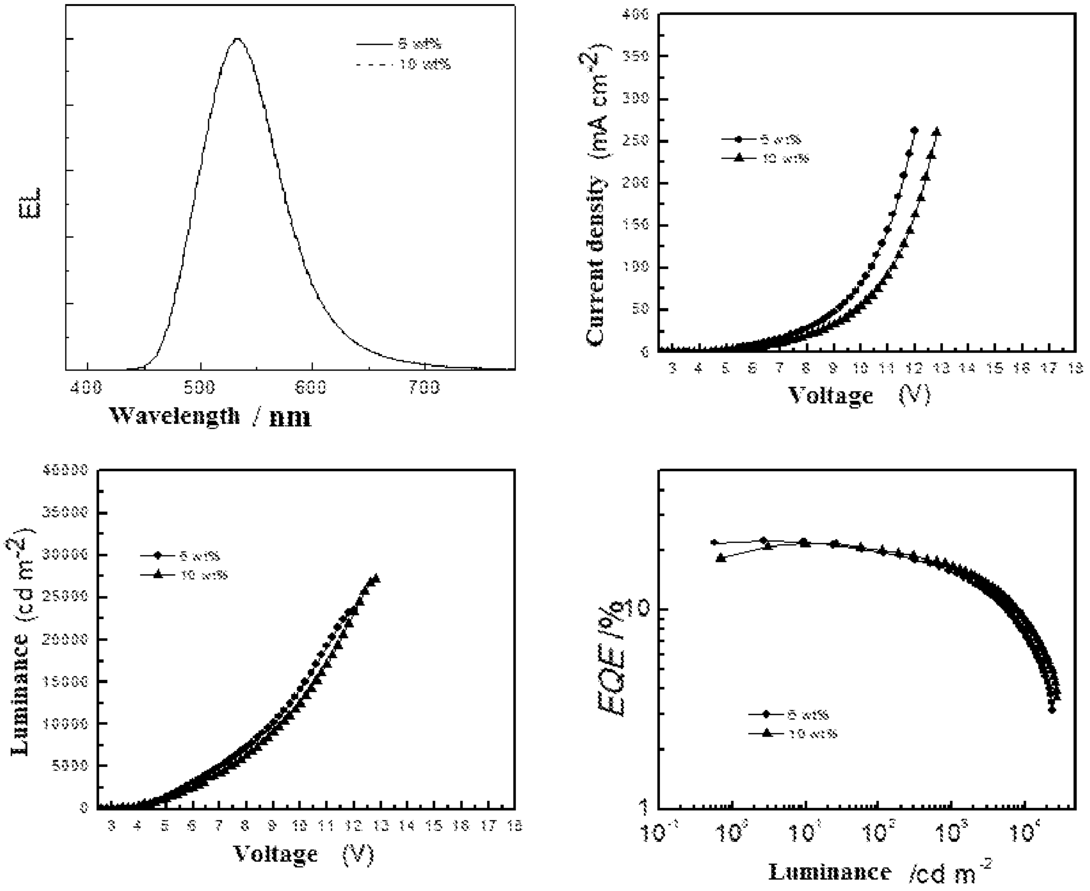
FIG. 11 shows the performance of OLED devices prepared by using complex 7 as an emissive dopant in an embodiment of the present invention.

The OLED devices shown in this example were fabricated with complex 7 as an emissive dopant, and TCTA and TPBi as co-host materials in EML. The doping concentration is 6 wt % and 10 wt %. The structure of the OLED device from anode to cathode was in turn: ITO/HAT-CN (5 nm)/TAPC (40 nm)/TCTA (10 nm)/TCTA:TPBi: Complex 7 (20 nm)/TPBi (10 nm)/TmPyPb (40 nm)/LiF (1.2 nm)/Al (100 nm). With reference to Example 23, the OLED devices based on complex 7 were fabricated based on the general preparation method shown in Example 22 and predetermined structural component parameters. Finally, the performance of the OLED device based on complex 7, such as voltage-current characteristics, EL spectrum, luminance, efficiency and Commission internationale de l'éclairage (CIE), was measured. And the data are shown on Table 6 and FIG. 11.

TABLE 6

Electroluminescent properties of the 7-based devices

| Serial number | dopant concentration (wt %) | L [cd $m^{-2}$][a] | CE[cd $A^{-1}$][b] Max | CE[cd $A^{-1}$][b] 1000 cd $m^{-2}$ | PE[lm $W^{-1}$][c] Max | PE[lm $W^{-1}$][c] 1000 cd $m^{-2}$ | EQE[%][d] Max | EQE[%][d] 1000 cd $m^{-2}$ | CIE[(x,y)][e] |
|---|---|---|---|---|---|---|---|---|---|
| 1 | 6% | 23520 | 64.20 | 44.62 | 75.33 | 29.55 | 22.34 | 15.41 | 0.31, 0.59 |
| 2 | 10% | 27260 | 62.22 | 47.99 | 67.01 | 31.10 | 21.65 | 16.62 | 0.31, 0.59 |

[a]Maximum luminance;
[b]Current efficiency;
[c]Power efficiency;
[d]External quantum efficiency;
[e]CIE coordinates at a luminance of 1000 cd $m^{-2}$; CIE refers to Commission internationale de l'éclairage.

As shown in Table 6, high-efficiency green electroluminescence, maximum current efficiency of 62-64 cd $A^{-1}$ and maximum external quantum efficiency of up to 22% have been achieved. At a luminance of 1000 cd $m^{-2}$, external quantum efficiency can be maintained above 15%.

Example 26—Complex 8 as an Emissive Dopant in OLED Devices

Figure 12:
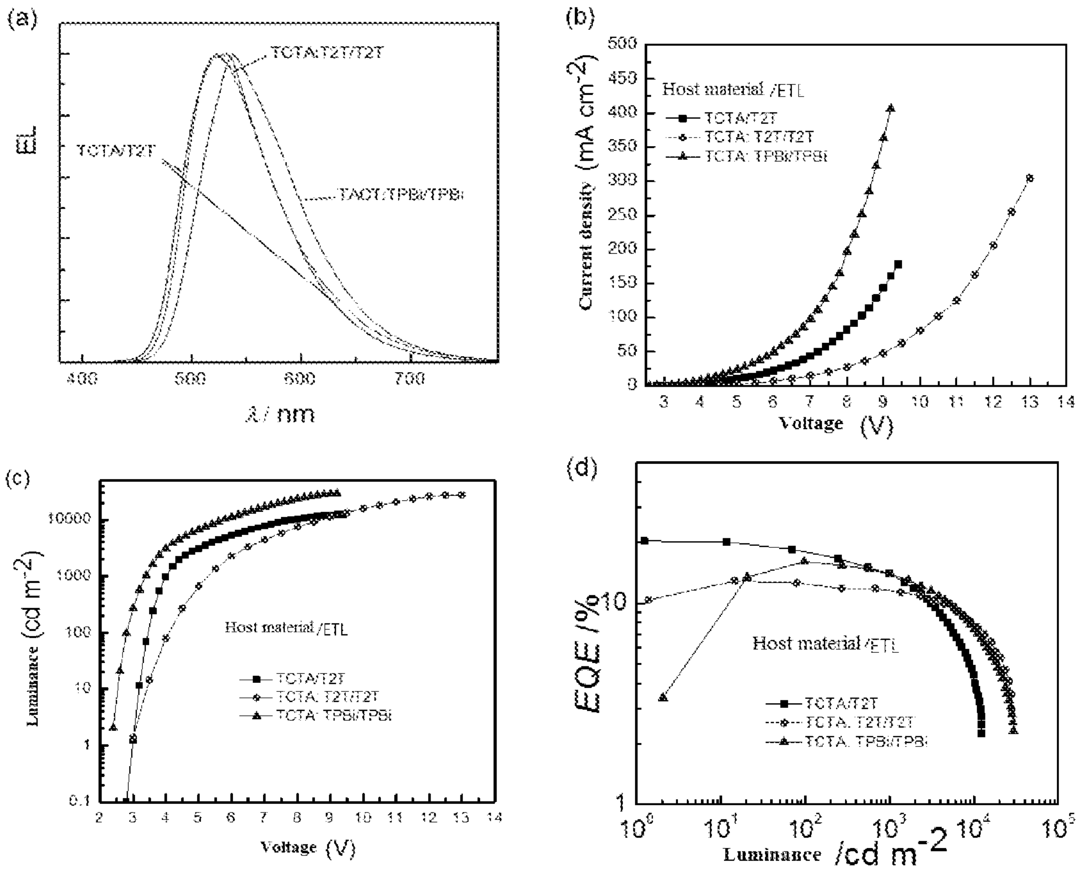
FIG. 12 shows the performance of OLED devices prepared by using complex 8 as an emissive dopant in an embodiment of the present invention.

Complex 8 was used as an emissive dopant with doping concentrations of 4 wt %. The structure of the OLED device from anode to cathode was in turn: ITO/HAT-CN (5 nm)/TAPC (40 nm)/TCTA (10 nm)/guest material:Complex 8 (4 wt %, 10 nm)/ETL (10 nm)/TmPyPb (40 nm)/LiF (1.2 nm)/Al (100 nm). With reference to Example 23, the OLED devices based on complex 8 were fabricated based on the general preparation method provided in Example 22 and predetermined structural component parameters. Finally, the performance of the OLED device based on complex 7, such as voltage-current characteristics, EL spectrum, luminance, efficiency and Commission internationale de l'éclairage (CIE), was measured. And the data are shown on Table 7 and FIG. 12.

Example 28—the Investigation on Operational Lifetimes

Device Lifetime Evaluation:

The OLEDs used to evaluate the long-term stability of Au(III) complexes have a common device structure of ITO/HAT-CN (20 nm)/PT-301 (160 nm)/PT-603I (5 nm)/LPH604:Au-emitter (30 nm)/PT-74M (5 nm)/LET321: Liq (25 nm, 1:1)/Liq (1 nm)/Al (100 nm). All materials except for the Au-emitter were purchased from Lumtec. They were used as received without further purification. The OLEDs were fabricated in a Kurt J. Lesker SPECTROS vacuum deposition system and encapsulated by a 200-nm-thick Al2O3 thin film deposited by atomic layer deposition (ALD) technique in a Kurt J. Lesker SPECTROS ALD system. EQE values of the gold(III) complexes in the devices for lifetime evaluation were given as follows: 16.16% for complex 4, 9.3% for complex 8 and 11.1% for the reference complex 6.

The operational lifetimes ($LT_{95}$, $LT_{50}$) of devices prepared with tetradentate gold(III) emitters 4 and 8 were measured under the above conditions and compared with

TABLE 7

Electroluminescent properties of the 8-based devices

| Serial number | Host materials/ ETL | L [cd $m^{-2}$][a] | CE[cd $A^{-1}$][b] Max | CE 1000 cd $m^{-2}$ | PE[lm $W^{-1}$][c] Max | PE 1000 cd $m^{-2}$ | EQE[%][d] Max | EQE 1000 cd $m^{-2}$ | CIE[(x,y)][e] |
|---|---|---|---|---|---|---|---|---|---|
| 1 | TCTA/T2T | 12440 | 63.08 | 43.80 | 66.02 | 34.40 | 20.33 | 12.01 | 0.32, 0.56 |
| 2 | (TCTA:T2T)/ T2T | 27810 | 40.18 | 35.98 | 36.06 | 21.54 | 12.89 | 11.58 | 0.34, 0.57 |
| 3 | (TCTA:TPBi)/ TPBi | 29500 | 51.17 | 44.16 | 57.41 | 40.81 | 16.09 | 13.88 | 0.39, 0.56 |

[a]Maximum luminance;
[b]Current efficiency;
[c]Power efficiency;
[d]External quantum efficiency;
[e]CIE coordinates at a luminance of 1000 cd $m^{-2}$; CIE refers to Commission internationale de l'éclairage.

The OLED devices shown in Table 7 display high-efficiency yellow-green electroluminescence. At a doping concentration of 4%, the single host material (for serial number 1) and co-host material (for serial numbers 2 and 3) were used in the EML of the OLEDs. Maximum current efficiency of 40-63 cd $A^{-1}$ and maximum external quantum efficiency of up to 20% have been achieved in these devices. At a luminance of 1000 cd $m^{-2}$, maximum EQE can be maintained up to 14%, indicating that different host materials and structural designs have a minor effect on external quantum efficiency.

Example 27—the Investigation on Thermal Stability

The measurement of thermal stability: The thermal stability of complexes 3 and 4 was examined using the instrument "TGA Q50" at a heating rate of 10° C. per minute with the temperature ranging from 40° C. to 800° C. FIG. 8(*a*) shows the TGA thermogram of complex 3 which shows 2 wt % weight loss at 394° C.; FIG. 8(*b*) shows the TGA thermogram of complex 4 which shows 2 wt % weight loss at 429° C. It shows that complexes 3 and 4 show excellent thermal stability.

those shown by the best-performing tridentate gold(III) emitter (complex 6 in the literature S1) under the same device configuration for a fair comparison (Table 8). In electroluminescence (EL) spectra, emission maxima of 587, 543 and 581 nm were observed in devices based on tetradentate gold(III) emitters 4, 8 and the tridentate counterpart complex 6 in the literature S1, respectively. The devices of 4 and 8 exhibited operational lifetimes $LT_{95}$ of 1.97 and 0.27 h at their initial luminance of 10390 and 10236 cd $m^{-2}$ respectively, corresponding to estimated $LT_{9S}$ of up to 105 h at a practical luminance of 1000 cd $m^{-2}$ and 5280 h at 100 cd $m^{-2}$, which are remarkably better (>250 times) than those of the tridentate 6-based device measured in the same device structure. There are another three studies of phosphorescent gold(III)-OLEDs based on gold(III) complexes supported by tridentate ligand reported by Yam's group for comparison, in which the devices based on them showed estimated $LT_{95}$ of up to 10 h at 1000 cd $m^{-2}$ and 500 h at 100 cd $m^{-2}$[S2-S4]. Compared with the operational lifetimes of gold(III)-OLEDs fabricated with gold(III) complexes supported by tridentate ligand, the significantly improved device lifetimes achieved by gold(III)-TADF complexes with tetradentate ligand signify the importance of employing tetradentate ligand scaffold in the design of stable and structurally robust Au(III)-TADF emitters for practical applications.

Device lifetime (operational lifetime) is generally obtained by measuring the OLED obtained in the vacuum-deposited method, which is used to detect the stability of the OLED device, generally expressed as $LT_{95}$, $LT_{90}$, $LT_{80}$, $LT_{50}$. $LT_X$ is defined as the device operational lifetime dropped to X % of the initial luminance.

The operational lifetimes are shown in table 8.

TABLE 8

Comparison of estimated operational lifetimes of gold(III)-OLEDs.

| Gold(III) Emitter | $L_0$/ cd $m^{-2}$ | $LT_{95}$/hours at $L_0$ | $LT_{95}$/hours at 1000 cd $m^{-2}$ [g] | $LT_{95}$/hours at 100 cd $m^{-2}$ [g] | $LT_{50}$/hours at $L_0$ | $LT_{50}$/hours at 1000 cd $m^{-2}$ [g] | $LT_{50}$/hours at 100 cd $m^{-2}$ [g] |
|---|---|---|---|---|---|---|---|
| Complex 4[a] | 10390 | 1.97 | 105 | 5281 | 120[h] | 6418[h] | 321683[h] |
| Complex 8[a] | 10236 | 0.27 | 14 | 706 | 25 | 1304 | 65337 |
| Complex 6[a] in reference S1 | 6225 | 0.018 | 0.4 | 20.2 | 2.57 | 57.5 | 2884 |
| Complex 3 in reference S2 | 4435[b] | 0.8[c] | 10[c] | 504[c] | 105[b] | 1321[b] | 66208[b] |
| Complex 1 in reference S3 | 940[d] | 7[d] | — | 316 | — | — | — |
| Complex 7 in reference S4 | 4220[e] | — | — | — | — | — | 48[f] |

[a]Gold(III)-OLEDs based on tetradentate complexes 4 and 8 and the tridentate complex 6 were made in the same device configuration under our laboratory conditions.

[b]Data taken from Table S11 in reference S2.

[c]Value estimated from FIG. 6 in reference S2.

[d]Data $LT_{70}$ taken from reference S3.

[e]The initial luminance estimated from the device data based on 5 wt % complex 7 (driving current density of 20 mA $cm^{-2}$ and max. current efficiency 21.1 cd $A^{-1}$).

[f]Data taken from reference S4.

[g] $LT_{95}/LT_{50}$ at luminance of 1000 cd $m^{-2}$ and 100 cd $m^{-2}$ were respectively estimated by using the formula $LT(L_1) = LT(L_0) \times (L_0/L_1)^{1.7}$ where $L_0$ refers to initial luminance and $L_1$ refers to desired luminance.

[h]Data refer to operational lifetimes $LT_{53}$ at luminance of 10390, 1000 and 100 cd $m^{-2}$.

[S1] D. Zhou, W.-P. To, Y. Kwak, Y. Cho, G. Cheng, G. S. M. Tong, C.-M. Che, *Adv. Sci.* 2019, 6, 1802297.

[S2] L.-K. Li, M.-C. Tang, S.-L. Lai, M. Ng, W.-K. Kwok, M.-Y. Chan, V. W.-W. Yam, *Nat. Photonics* 2019, 13, 185-191.

[S3] M.-C. Tang, M.Y. Leung, S.-L. Lai, M. Ng, M.-Y. Chan, V. W.-W. Yam, *J. Am. Chem. Soc.* 2018, 140, 13115-13124.

[S4] M.-C. Tang, W.-K. Kwok, S.-L. Lai, W.-L. Cheung, M.-Y. Chan, V. W.-W. Yam, *Chem. Sci.* 2019, 10, 594-605.

Figure 13:
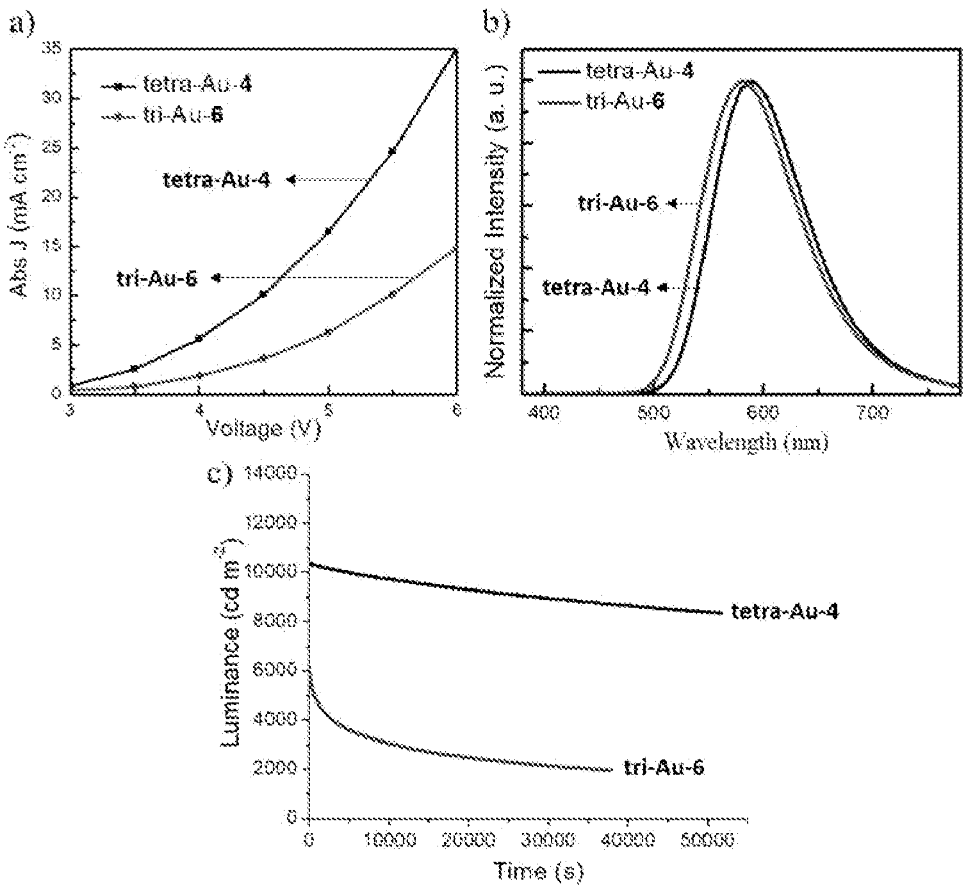
FIG. 13 shows the comparison of the device performance between a tetradentate gold(III) complex 4 and a tridentate gold(III) complex 6 in reference S1: a) current density-voltage curves of devices; b) EL spectra of devices; c) luminance decay against operation time. (tetra-Au-4 and tri-Au-6 refer to tetradentate gold(III)-TADF complex 4 and the reported tridentate gold(III)-TADF complex 6 in reference S1, respectively. These device data were measured under our laboratory conditions.)

FIG. 13 shows the comparison of the OLED performance of tetradentate gold(III)-TADF complex 4 shown in the present invention and tridentate gold(III) complex 6 reported in the reference S1. a) Current density-voltage curves of devices; b) EL spectra of devices; c) Luminance decay against operation time. (tetra-Au-4 and tri-Au-6 refer to tetradentate gold(III)-TADF complex 4 shown in the present invention and tridentate gold(III) complex 6 reported in the literature S1, respectively.

In summary of the above examples, it is found that complexes 1-8 show prominent emission properties, such as emission quantum yields, emission lifetimes, and radiative decay rate constants, especially for complexes 3, 4, 7 and 8 showing $^3$ILCT or TADF emission properties. The OLED devices fabricated with these complexes as emissive dopants show blue-green to green-yellow electroluminescence with high luminance, electroluminescence efficiency and maximum external quantum efficiency. Maximum current efficiency of up to 78 cd $A^{-1}$, maximum external quantum efficiency generally above 20% and of up to 25% and efficiency roll-off down to 11% have been achieved. At a practical luminance of 1000 cd $m^{-2}$, EQE can be maintained up to 11%. As is investigated by TGA, these complexes are thermally stable in both air and humid environments, and show the great potential in the development of high-efficiency OLEDs in the market.

According to the literatures, the emission of the reported gold(III) complexes is mainly dominant by phosphorescence, and the OLEDs based on them showed maximum EQEs of up to 21.6% (*Nat. Photonics* 2019, 13, 185-191). These reported gold(III) emitters are different from the tetradentate gold (III)-TADF complexes shown by the present invention in terms of emission origin, the structure of the chelating ligand and the core structure of the complex. Compared to the reported gold(III) complexes, gold (III)-TADF complexes with tetradentate ligand shown in the present invention exhibit better performance in OLEDs with maximum EQEs of up to 25.03% and EQEs of up to 22.01% at a practical luminance of 1000 cd $m^{-2}$. Gold(III) complexes with tetradentate ligands substituted with different substituents at different positions can achieve or basically achieve satisfactory emission performance that meets the requirements of commercial applications. These are currently the best results achieved in OLED devices based on cyclometallated gold(III) complexes. Therefore, the use of gold(III) complexes supported by tetradentate ligand provided by the present invention as emissive dopants in OLED devices has outstanding advantages.

All references cited herein, including publications, patent applications and patents, are incorporated herein by reference to the same extent as separately and specifically indicating that each reference is incorporated by reference and is described in its entirety herein.

The terms "a", "an" and "the" and similar designations shall be considered to cover both singular and plural forms when used to describe the context of the present invention, unless otherwise specified herein or there is an clear conflict in the context.

The ranges of values recited herein are only intended to be used as shorthand notations for individually referring to each individual value falling within the range, and unless otherwise indicated herein, each individual value is incorporated into this specification as if individually recited herein. Unless otherwise specified, all accurate values provided herein represent corresponding approximate values (for example, all exemplary accurate values provided based on specific factors or measurements can be considered as corresponding approximate measured values that are also modified by "about" as needed).

The use of any and all examples or exemplary language (eg, "for example") provided herein is only intended to better clarify the present invention and does not constitute a limitation on the scope of the present invention, unless otherwise indicated. The language in this specification should not be construed as indicating that any element is necessary for implementing the present invention, unless it is clearly stated that it is.

When referring to elements in any aspect or embodiment of the present invention, descriptions using terms such as "comprising", "having", "including" or "containing" are intended herein to provide support for similar aspects or embodiments of the present invention of "consisting of" specific elements and "essentially consisting of" specific elements or "essentially include" specific elements, unless otherwise indicated or there is a clear conflict in the context (for example, when the composition described herein contains specific elements, it should be understood as to also describe the composition consisting of this element, unless otherwise indicated or there is a clear conflict in the context).

The above are only the preferred embodiments of the present invention. It should be pointed out that without departing from the principle of the present invention, those ordinary skilled in the art can make several improvements and modifications, and these improvements and modifications should also be regarded as the protection scope of the present invention.

The invention claimed is:

1. A gold (III) complex, wherein the gold (III) complex has a chemical structure as shown in formula (I):

formula (I)

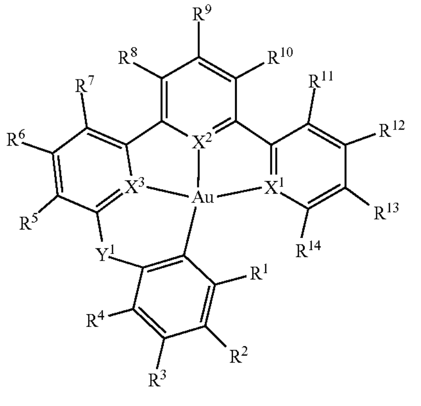

wherein $X^1$, $X^2$, $X^3$ are independently selected from carbon and nitrogen, and only one of $X^1$, $X^2$, $X^3$ is nitrogen;

$Y^1$ is O, $CR^{15}R^{16}$ or S;

$R^1$-$R^{16}$ are independently selected from hydrogen, deuterium, halogen, nitro, cyano, isocyano, trifluoromethyl, or independently selected from the following substituted or unsubstituted groups: $C_{1-15}$ alkyl, $C_{3-18}$ cycloalkyl, $C_{2-15}$ alkenyl, $C_{3-18}$ cycloalkenyl, $C_{2-15}$ alkynyl $C_{6-30}$ aryl, $C_{7-35}$ aralkyl, $C_{2-20}$ heteroalkyl, $C_{3-20}$ heterocycloalkyl, $C_{5-30}$ heterocycloalkenyl, $C_{5-30}$ heteroaryl, $C_{6-30}$ heteroaralkyl, $C_{1-20}$ alkoxy, $C_{6-30}$ aryloxy, $C_{5-30}$ heteroaryloxy, $NR^{17}R^{18}$, acyl acylamino, acyloxy, ester group, acylamido, sulfonylamino, sulfonyloxy, sulfonato, sulfonylamido and trialkylsilyl; wherein $R^{17}$ and $R^{18}$ are independently selected from the following substituted or unsubstituted groups: $C_{1-15}$ alkyl, $C_{3-18}$ cycloalkyl, $C_{2-15}$ alkenyl, $C_{3-18}$ cycloalkenyl, $C_{2-15}$ alkynyl, $C_{6-40}$ aryl, $C_{7-45}$ aralkyl, $C_{2-20}$ heteroalkyl, $C_{3-20}$ heterocycloalkyl, $C_{5-30}$ heterocycloalkenyl, $C_{5-30}$ heteroaryl, $C_{6-30}$ heteroaralkyl, $C_{1-20}$ alkoxy, $C_{6-30}$ aryloxy and $C_{5-30}$ heteroaryloxy;

the $NR^{17}R^{18}$ is a group represented by the following structure or a derivative group of the group represented by the following structure in which a hydrogen is substituted by one or more, same or different substituents:

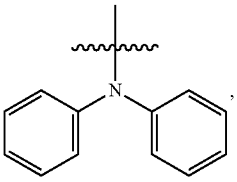,
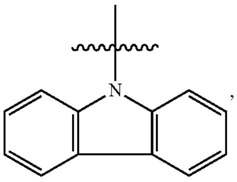,
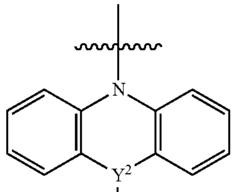,
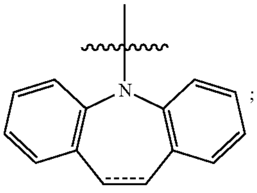;

wherein, $Y^2$ is O, S, $CR^{20}R^{21}$, $SiR^{22}R^{23}$ or $NR^{24}$, $R^{20}$-$R^{24}$ are independently selected from hydrogen, deuterium, halogen, substituted or unsubstituted $C_{1-15}$ alkyl, substituted or unsubstituted $C_{6-30}$ aryl; the substituents in the substituted derivative groups are halogen, $C_{1-20}$ alkyl, $C_{1-20}$ alkoxy, $C_{1-20}$ alkylthio, 5-6 membered cycloalkyl, 5-6 membered heterocycloalkyl, $C_{6-30}$ aryl, $C_{6-30}$ aryloxy, $C_{5-30}$ heteroaryl, $C_{2-15}$ alkenyl, or $C_{2-15}$ alkynyl.

2. The gold (III) complex according to claim 1, wherein the total number of carbon atoms of the groups $R^1$-$R^{16}$ is 1-80.

3. The gold (III) complex according to claim 1, wherein at least one of $R^1$-$R^{16}$ is not hydrogen;

and/or at least one of $R^1$-$R^{14}$ is $NR^{17}R^{18}$, and/or $R^1$-$R^{14}$ comprise 1-3 $NR^{17}R^{18}$ groups;

and/or at least one of $R^2$, $R^3$, $R^6$, $R^9$, $R^{12}$, and $R^{13}$ is $NR^{17}R^{18}$.

4. The gold (III) complex according to claim 1, wherein when $R^1$-$R^{16}$ are groups containing substituents, the substituents on the groups are halogen, nitro, cyano, trifluoromethyl, $C_{1-20}$ alkyl, $C_{1-20}$ alkoxy, $C_{1-20}$ alkylthio, 5-6 membered cycloalkyl, 5-6 membered heterocycloalkyl, $C_{6-30}$ aryl, $C_{6-30}$ aryloxy, $C_{5-30}$ heteroaryl, $C_{2-15}$ alkenyl or $C_{2-15}$ alkynyl.

5. The gold (III) complex according to claim 1, wherein $R^1$-$R^{16}$ are independently selected from hydrogen, deuterium, fluorine, chlorine, bromine, iodine, nitro, cyano, isocyano, trifluoromethyl, ester group, acyloxy, acylamido, sulfonylamino, sulfonyloxy, sulfonato, sulfonylamido, trialkylsilyl, methyl, ethyl, n-propyl, isopropyl, n-butyl, isobutyl, tert-butyl, n-pentyl, isopentyl, neopentyl, n-hexyl, n-heptyl, n-octyl, n-nonyl, n-decyl, methoxy, ethoxy, n-propoxy, isopropoxy, n-butoxy, isobutoxy, tert-butoxy, n-pentoxy, isopentoxy, neopentyloxy, n-hexoxy, n-heptyloxy, n-octyloxy, n-nonyloxy, n-decyloxy, cyclopropyl, cyclobutyl, cyclopentyl, cyclohexyl, cycloheptyl, cyclooctyl, vinyl, propenyl, butenyl, pentenyl, hexenyl, ethynyl, propynyl, butynyl, pentynyl, cyclopentenyl, cyclohexenyl, cycloheptenyl, phenyl, naphthyl, anthryl, phenanthryl, fluorenyl, phenylmethyl, phenylethyl, phenylpropyl, phenoloxy, methylphenyl, ethylphenyl, n-propylphenyl, isopropylphenyl, n-butylphenyl, isobutylphenyl, tert-butylphenyl, n-pentylphenyl, isopentylphenyl, neopentylphenyl, n-hexylphenyl, n-heptylphenyl, n-octylphenyl, n-nonylphenyl, n-decylphenyl, dimethylphenyl, diethylphenyl, di-n-propylphenyl, diisopropylphenyl, di-n-butylphenyl, diisobutylphenyl, di-tert-butylphenyl, di-n-pentylphenyl, di-isopentylphenyl, di-neo-pentylphenyl, di-n-hexylphenyl, di-n-heptylphenyl, di-n-octylphenyl, di-n-nonylphenyl, di-n-decylphenyl, diphenylaminophenyl, furyl, pyranyl, pyridyl, pyrimidinyl, thiazolyl, oxazolyl, imidazolyl, isoxazolyl, pyrrolyl, pyrazolyl, triazolyl, tetrazolyl, thienyl, furyl, pyridyl, pyrimidinyl, pyrazinyl, pyridazinyl, indolyl, quinolinyl, isoquinolinyl, quinoxalinyl, bipyridyl, acridinyl, phenanthridinyl, phenanthrolinyl, quinazolonyl, benzimidazolyl, benzofuranyl, benzothienyl, benzothiazolyl, benzoxazolyl, benzisoxazolyl, pyrrolidinyl, piperidinyl, piperazinyl, morpholinyl, thiazinyl and the following structural formula:

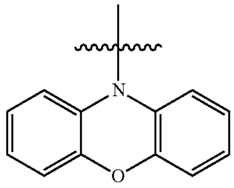
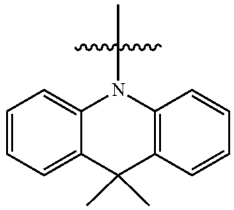

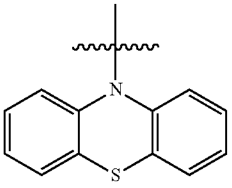

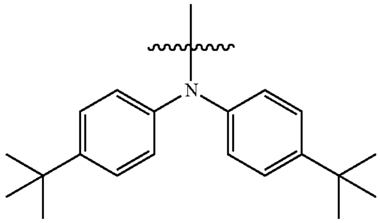

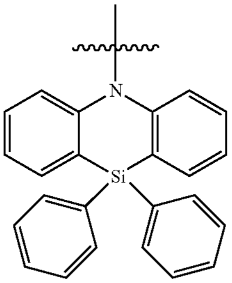

-continued

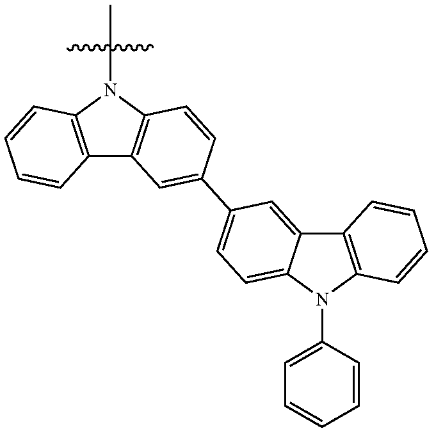

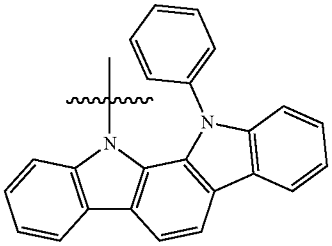

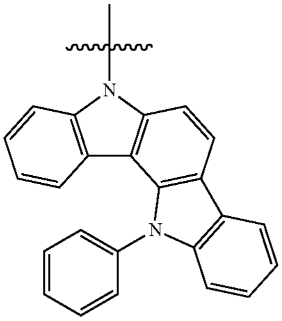

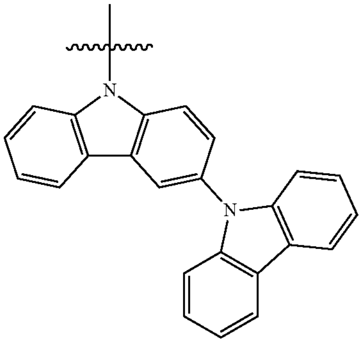

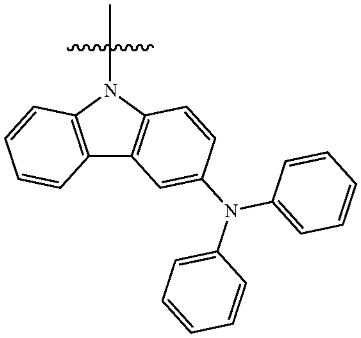

-continued
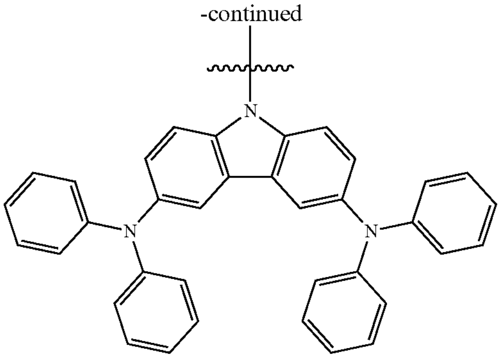
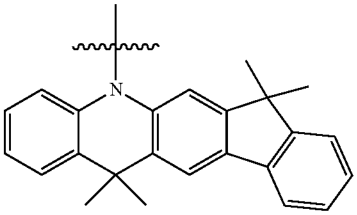
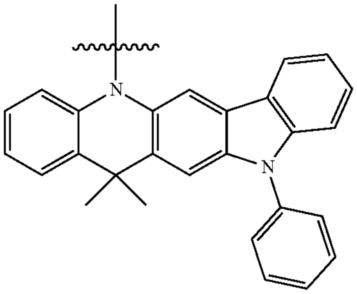
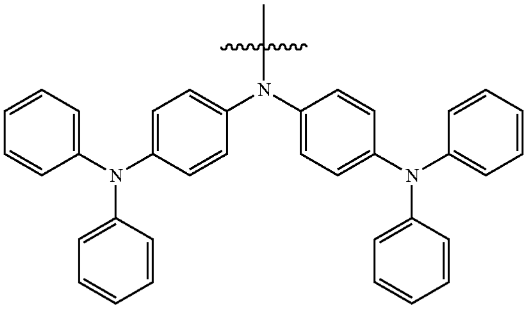
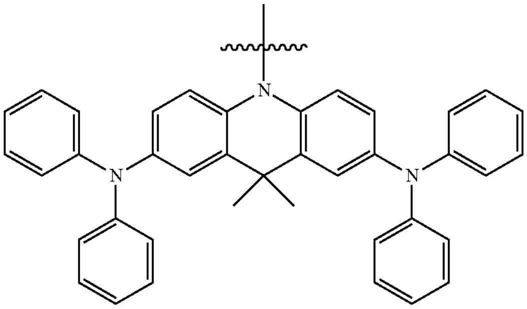
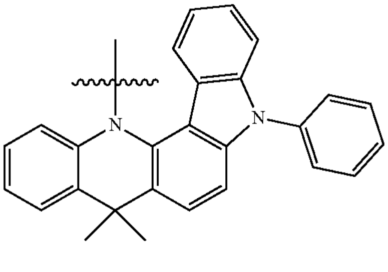
.
6. The gold (III) complex according to claim 1, wherein the gold (III) complex is specifically as follows:
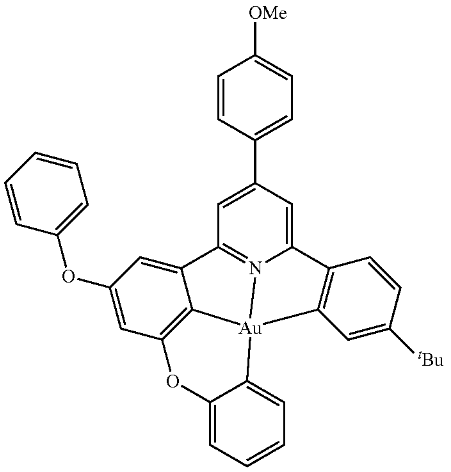
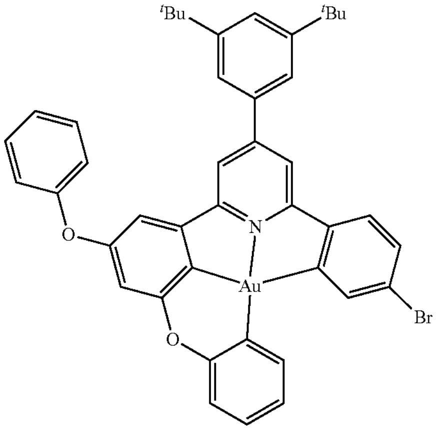
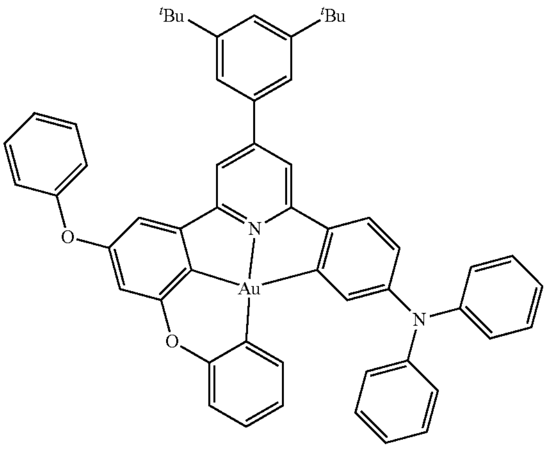

-continued
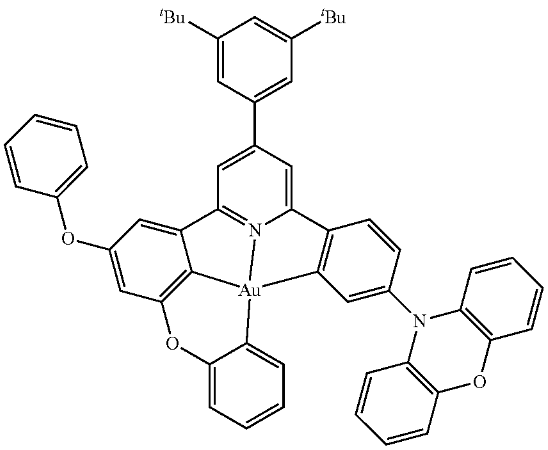
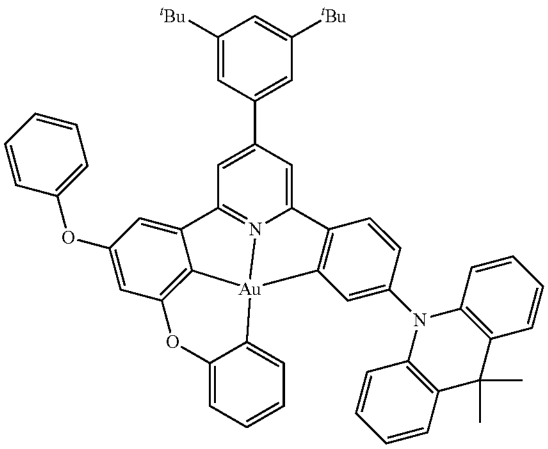
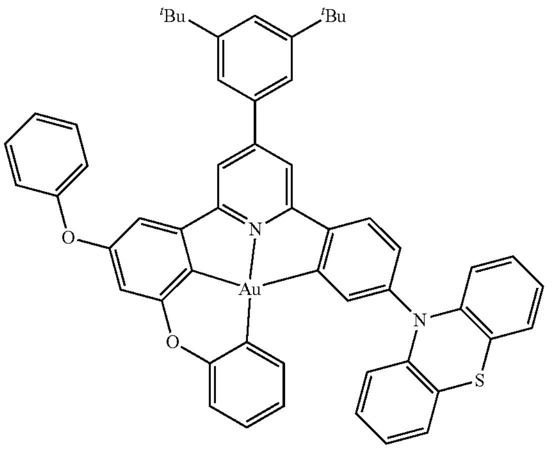
-continued
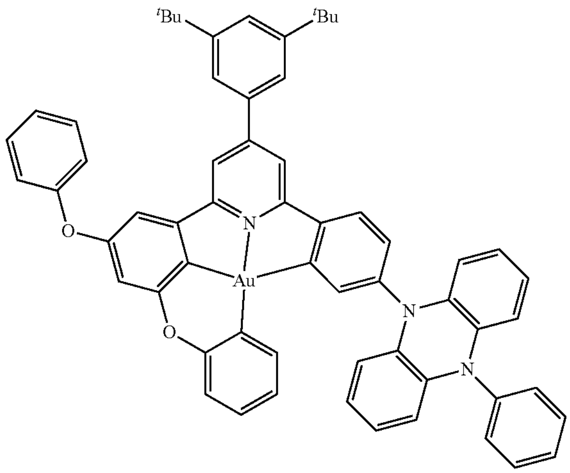
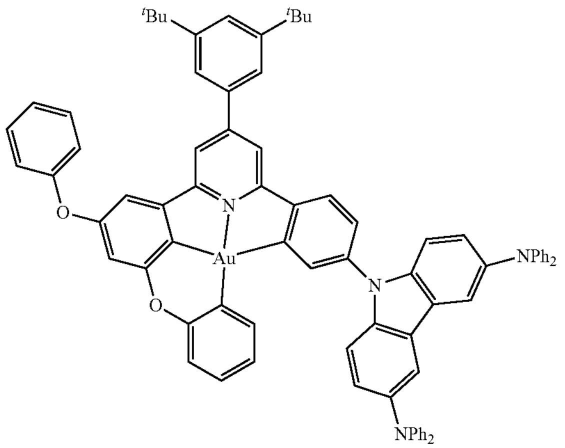
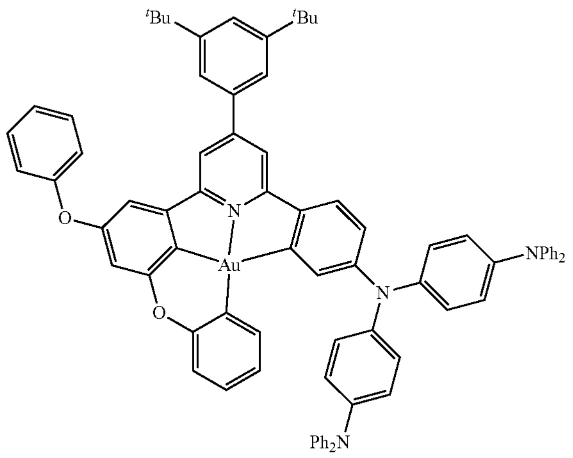

-continued
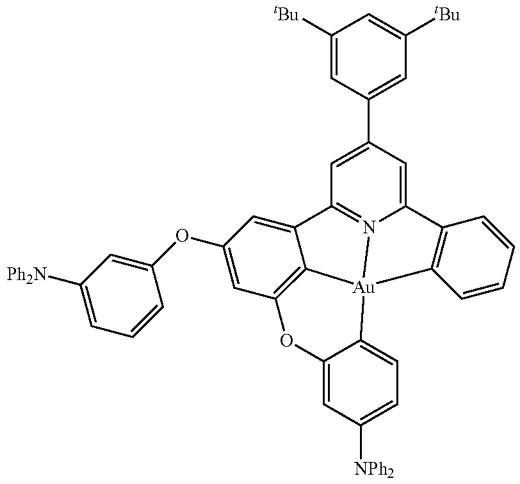
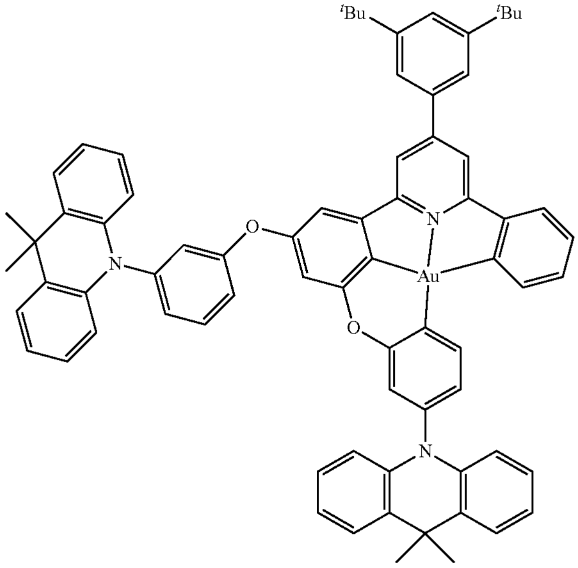
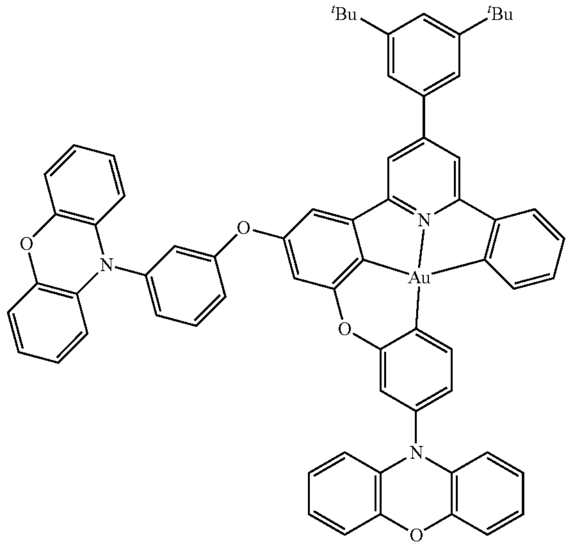
-continued
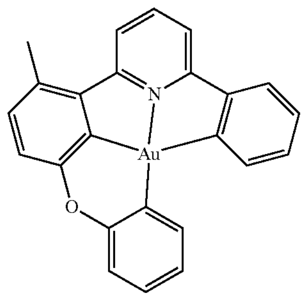
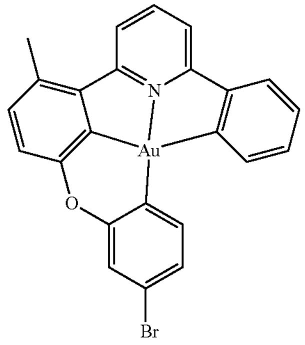
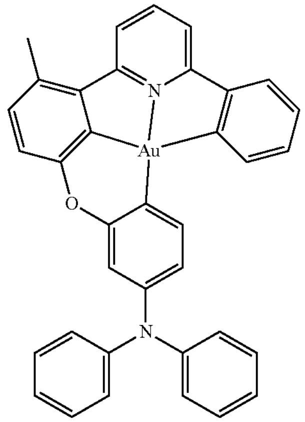
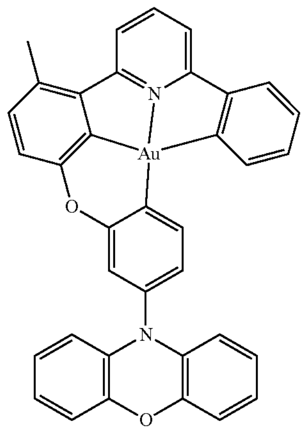

-continued
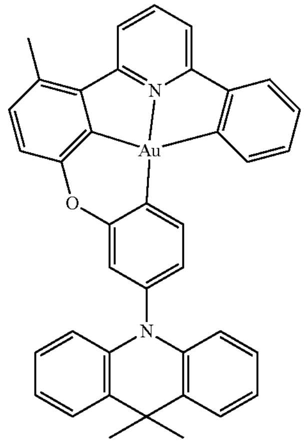
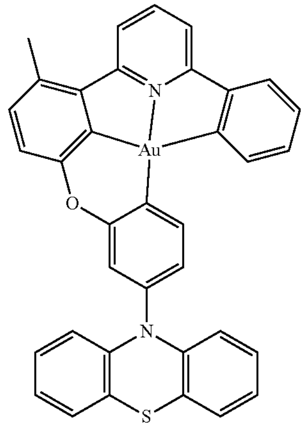
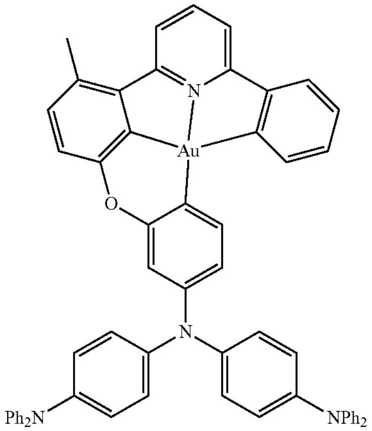
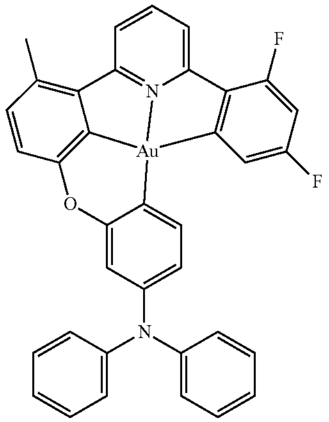
-continued
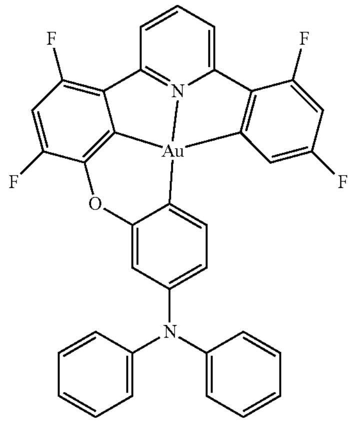
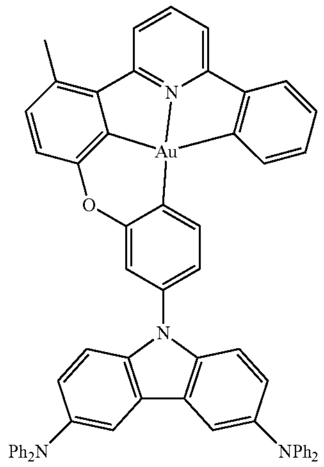
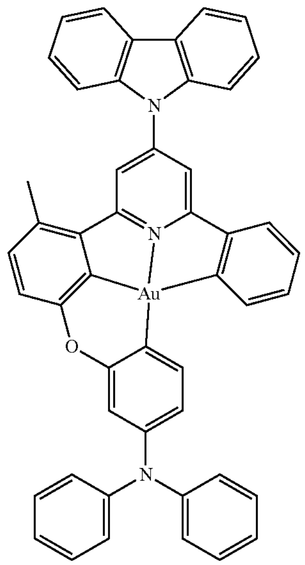

-continued
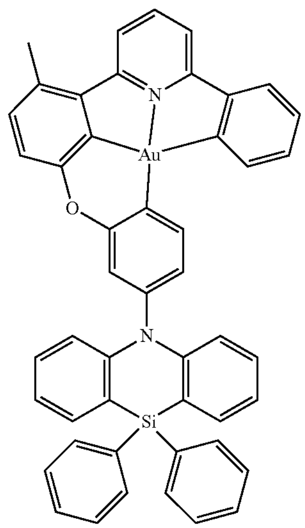
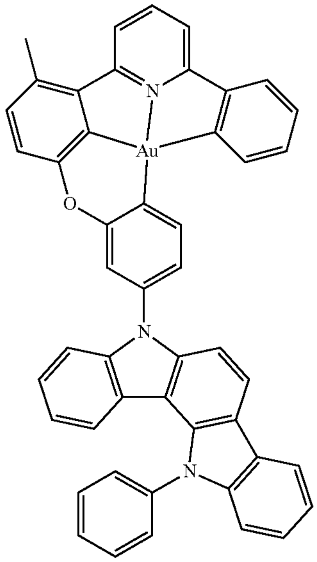
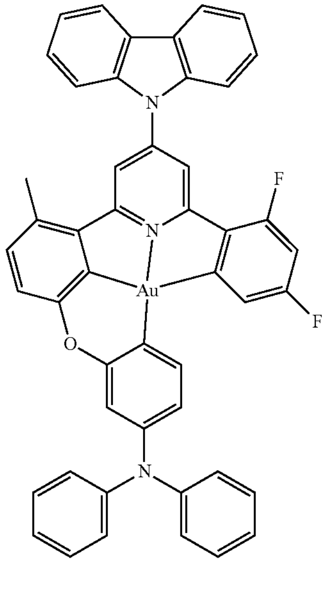
-continued
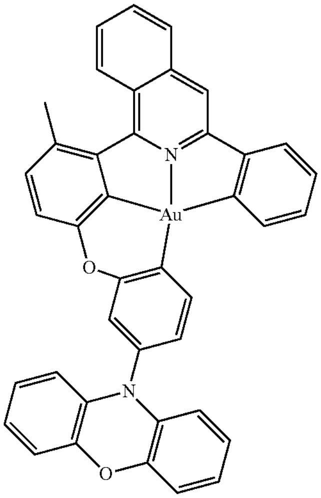
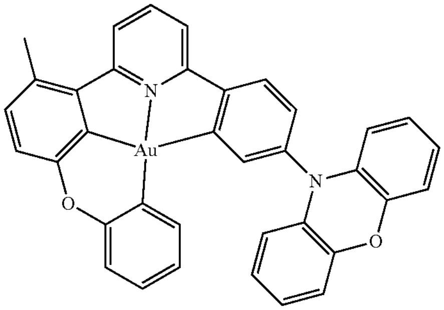
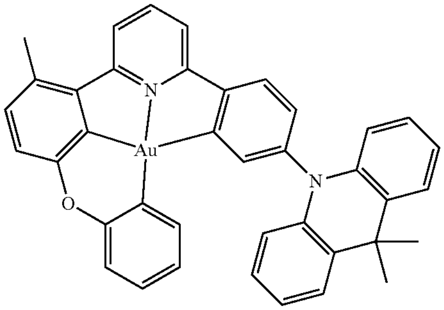
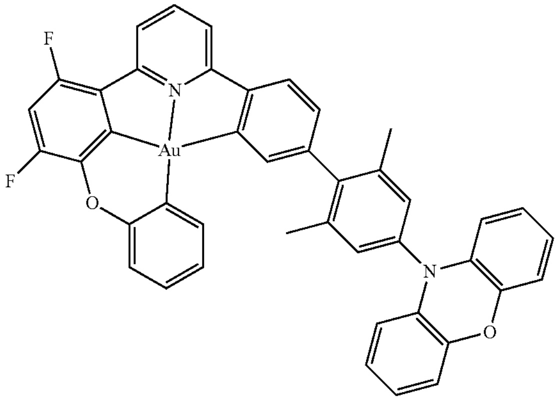

-continued
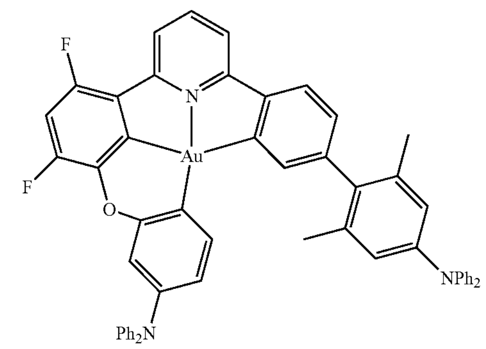
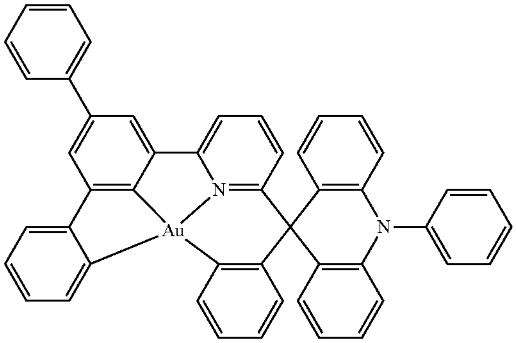
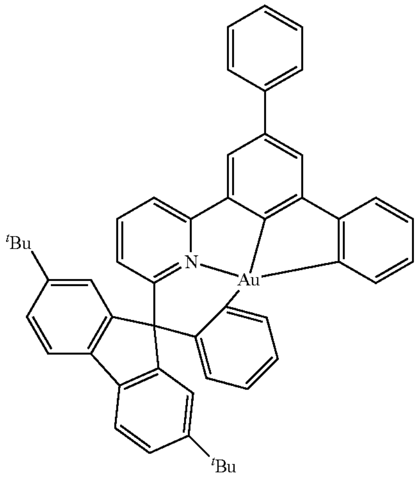
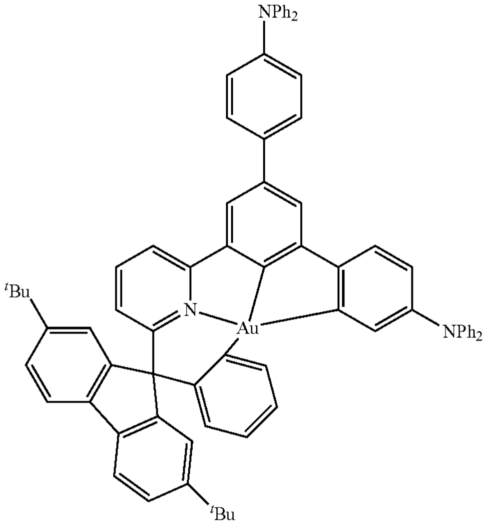
-continued
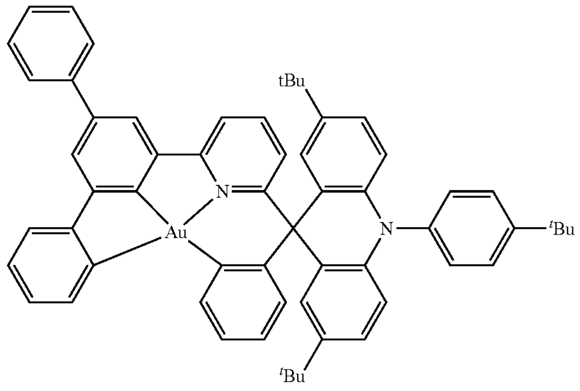
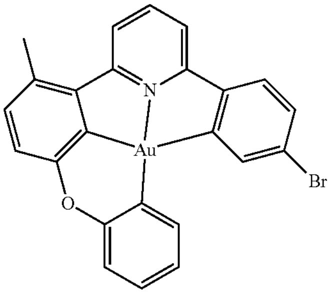
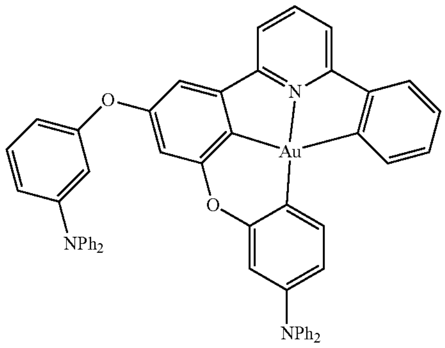
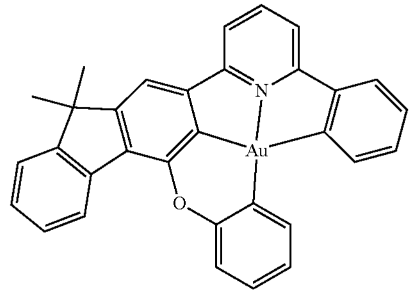

-continued

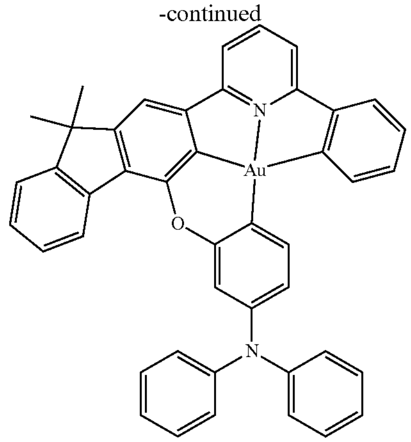

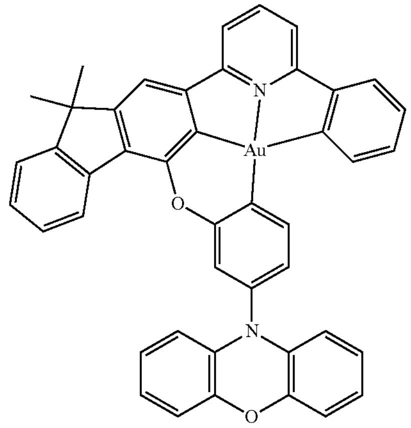

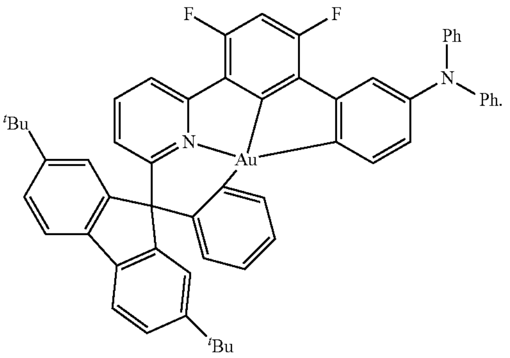

7. A method for preparing the gold (III) complex according to claim 1, comprising reacting the gold (III) complex of formula (II) under microwave conditions to obtain a complex of formula (I);

or reacting an organic compound of formula (III) with gold (III) reagent under microwave conditions to obtain a gold (III) complex of formula (I);

Formula (II)

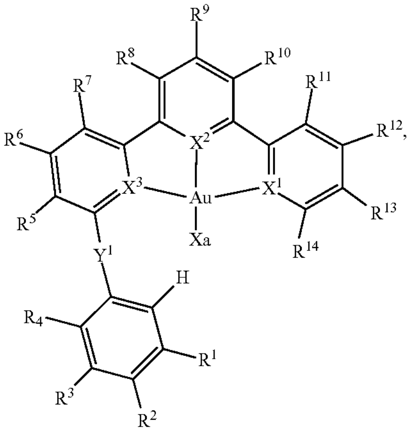

Formula (I)

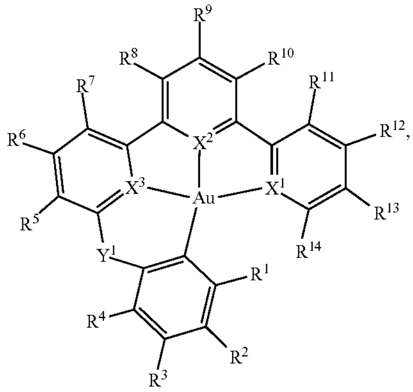

Formula (III)

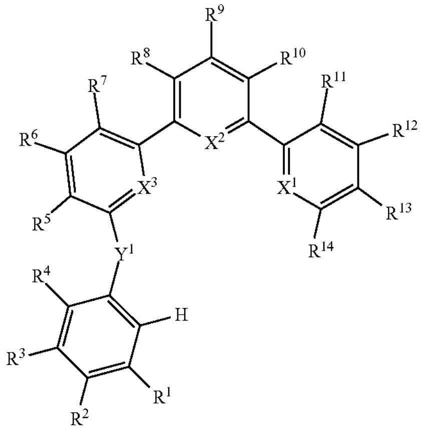

wherein $X^1$, $X^2$, $X^3$ are independently selected from carbon and nitrogen, and only one of $X^1$, $X^2$, $X^3$ is nitrogen;

$X'^1$, $X'^2$, $X'^3$ are independently selected from CH and nitrogen, and only one of $X'^1$, $X'^2$, $X'^3$ is nitrogen;

$Y^1$ is O, $CR^{15}R^{16}$ or S;

Xa is F, Cl, Br, I, OTf, $OCOCF_3$, OAc, OH, or $NTf_2$;

$R^1$-$R^{16}$ are independently selected from hydrogen, deuterium, halogen, nitro, cyano, isocyano, trifluoromethyl, or independently selected from the following substituted or unsubstituted groups: alkyl, cycloalkyl, alkenyl, cycloalkenyl, alkynyl, aryl, aralkyl, heteroalkyl, heterocycloalkyl, heterocycloalkenyl, heteroaryl, heteroaralkyl, alkoxy, aryloxy, heteroaryloxy, $NR^{17}R^{18}$, acyl, acylamino, acyloxy, ester group, acylamido, sulfonylamino, sulfonyloxy, sulfonato, sulfonylamido and trialkylsilyl; wherein $R^{17}$ and $R^{18}$ are independently selected from the following substituted or unsubstituted groups: alkyl, cycloalkyl, alkenyl, cycloalkenyl, alkynyl, aryl, aralkyl, heteroalkyl, heterocycloalkyl, heterocycloalkenyl, heteroaryl, heteroaralkyl, alkoxy, aryloxy and heteroaryloxy.

8. The method of claim 7, wherein the reaction of the organic compound of formula (III) with gold (III) reagent is specifically:

reacting the organic compound of formula (III), gold (III) reagent and a second solvent under microwave conditions to obtain an intermediate;

wherein the gold (III) reagent is selected from Au $(OAc)_3$, $AuCl_3$, Au $(OTf)_3$, $HAuCl_4$, $KAuCl_4$, $NaAuCl_4$, $KAuBr_4$ and $NaAuBr_4$, the second solvent is a mixture of one or more of water, conventional alcohol solvents, ACN, DMF, DMSO, DMA, THF and 1,4-dioxane;

mixing the intermediate with a first solvent for further reaction to obtain the gold (III) complex of formula (I);

wherein the first solvent is water or a mixture of water with one or more of ACN, DMF, DMA, THF and 1,4-dioxane.

9. A light-emitting device comprising a light-emitting layer, wherein the light-emitting layer comprises the gold (III) complex according to claim 1.

10. The gold (III) complex according to claim 1, wherein the total number of carbon atoms of the groups $R^1$-$R^{16}$ is 6-60.

11. The gold (III) complex according to claim 1, wherein the total number of carbon atoms of the groups $R^1$-$R^{16}$ is 12-50.

12. The method of claim 8, wherein the gold (III) reagent is Au $(OAc)_3$.

* * * * *